United States Patent
Nishida et al.

(10) Patent No.: US 8,829,915 B2
(45) Date of Patent: Sep. 9, 2014

(54) LEAKAGE RESISTANCE DETECTION DEVICE FOR AN ON-BOARD HIGH VOLTAGE DEVICE AND LEAKAGE RESISTANCE DETECTION METHOD THEREFOR

(75) Inventors: Mitsunori Nishida, Tokyo (JP); Yuji Zushi, Tokyo (JP); Kouichi Yasukawa, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 197 days.

(21) Appl. No.: 13/607,202

(22) Filed: Sep. 7, 2012

(65) Prior Publication Data

US 2013/0245869 A1   Sep. 19, 2013

(30) Foreign Application Priority Data

Mar. 16, 2012   (JP) ................. 2012-060358

(51) Int. Cl.
*G01R 31/14*   (2006.01)

(52) U.S. Cl.
USPC ............ 324/509; 324/510; 324/557; 324/525

(58) Field of Classification Search
CPC ..... B60L 3/0069; B60L 3/12; Y02T 10/7005; Y02T 10/642
USPC ......................................... 324/509
See application file for complete search history.

(56) References Cited

U.S. PATENT DOCUMENTS

| | | | | |
|---|---|---|---|---|
| 5,266,901 A | * | 11/1993 | Woo | 324/537 |
| 5,382,946 A | * | 1/1995 | Gale | 340/650 |
| 2007/0285057 A1 | * | 12/2007 | Yano | 320/116 |

FOREIGN PATENT DOCUMENTS

JP   2002-209331 A   7/2002

OTHER PUBLICATIONS

Potdevin, Insulation Monitoring in High Voltage Systems for Hybrid and Electric Vehicles, ATZelektronik Jun. 2009 vol. 4, p. 1-4, http://www.bender-latinamerica.com/fileadmin/bender-de/downloads/article/Insulation_Monitoring_ATZelektronik_E-Magazin_November_2009.pdf.*

* cited by examiner

*Primary Examiner* — Thomas F Valone
(74) *Attorney, Agent, or Firm* — Sughrue Mion, PLLC

(57) ABSTRACT

The leakage resistance detection device includes a coupling capacitor having one terminal connected to an on-board high voltage device and another terminal connected to a repetitive signal output circuit, and measures a leakage resistance as a function of a transition time during which a monitoring voltage, which is a potential at the another terminal of the coupling capacitor to be charged/discharged in response to an operation of a charge/discharge switching element that operates in response to a repetitive pulse signal, changes from one predetermined voltage to reach another predetermined voltage. When the measured leakage resistance has become equal to or smaller than a predetermined limit leakage resistance, the leakage resistance detection device generates a resistance abnormality determination output.

21 Claims, 27 Drawing Sheets

FIG. 21
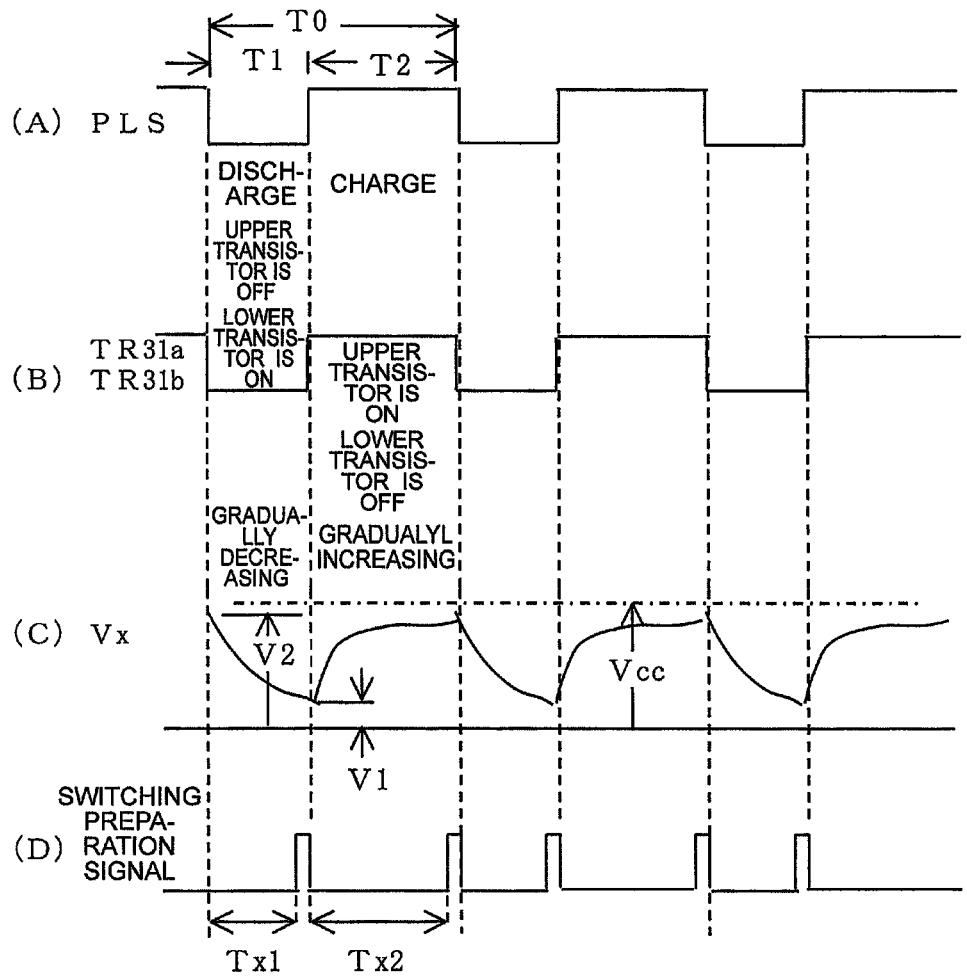
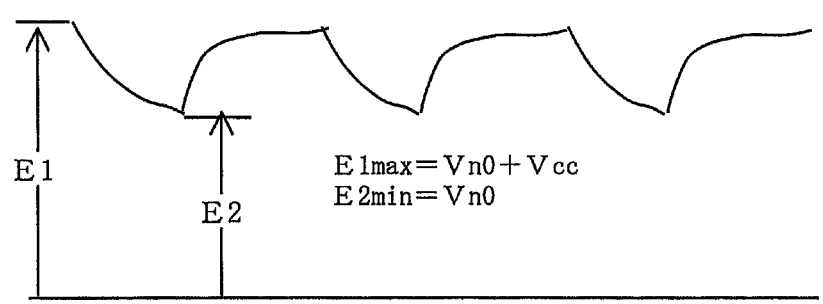

LEAKAGE RESISTANCE DETECTION DEVICE FOR AN ON-BOARD HIGH VOLTAGE DEVICE AND LEAKAGE RESISTANCE DETECTION METHOD THEREFOR

BACKGROUND OF THE INVENTION

1. Field of the Invention

The present invention relates to a leakage resistance detection device for an on-board high voltage device, which is connectable to an on-board high voltage device including an on-board high voltage DC power source and a high voltage electric load to be fed and driven by the high voltage DC power source and which measures a leakage resistance with respect to a vehicle body as typified by equivalent leakage resistances on the positive and negative potential sides of the on-board high voltage device, so as to inform the abnormality when the leakage resistance reduces, and also relates to a leakage resistance detection method for the on-board high voltage device.

2. Description of the Related Art

In general, an electric car, a hybrid electric car, and other such vehicles use a combination of a DC 12-V low voltage battery and a high voltage battery such as a DC 400-V battery pack, for example. A negative terminal of the low voltage battery is connected to a vehicle body, but the high voltage battery and a high voltage electric load to be fed and driven by the high voltage battery are mounted on the vehicle body while being entirely insulated from the vehicle body. In this type of vehicle, a leakage resistance detection device, which is fed and driven by the low voltage battery, measures an insulation resistance (having the same meaning as the leakage resistance) of the whole high voltage device, to thereby detect the presence or absence of ground abnormality.

For example, a ground detection apparatus for an electric vehicle described in Japanese Patent Application Laid-open No. 2002-209331 is a ground detection apparatus for an electric car that includes a high voltage DC power source electrically insulated from the vehicle body and a three-phase AC motor driven by a DC voltage from the high voltage DC power source. The ground detection apparatus includes a microcomputer that supplies a ground detection signal representing a square wave to the high voltage DC power source via a detection resistor and a coupling capacitor. The microcomputer detects a voltage amplitude value at a ground detection point corresponding to a connection point between the detection resistor and the coupling capacitor. Based on a preset relationship between a voltage amplitude value and an insulation resistance value, the microcomputer converts the detected voltage amplitude value into an insulation resistance value, and compares the converted insulation resistance value with a preset ground determination threshold, to thereby detect the level of degradation in insulation resistance of the high voltage DC power source. Thus, the circuit configuration can be simplified, and the level of reduction in insulation resistance with respect to the vehicle body can be detected with high accuracy.

First, the ground detection apparatus of Japanese Patent Application Laid-open No. 2002-209331 is described in detail with reference to FIGS. 28 and 29. The name of each element is replaced by the name in the present invention to be described later. Referring to FIG. 28 which is an overall configuration diagram of the conventional apparatus, a leakage resistance detection device 50 includes an arithmetic control circuit 20 mainly configured by a microprocessor, and a repetitive signal output circuit 30 and a monitoring signal processing circuit 40.

An on-board high voltage device 60 contains a high voltage electric load (not shown) including a high voltage DC power source 61. The on-board high voltage device 60 is mounted on a vehicle body 11 while being insulated therefrom, but has equivalent leakage resistances R1 and R2. A coupling capacitor 51 has one terminal B connected to, for example, a negative terminal of the on-board high voltage device 60 and another terminal A connected to an output terminal of the repetitive signal output circuit 30.

The arithmetic control circuit 20 generates a repetitive command signal PLS, which is a pulse train signal in which an "H" period T1 and an "L" period T2 satisfy T1=T2 (=half cycle T). The repetitive signal output circuit 30 includes a charge/discharge switching element 39 and a series resistor R0. The charge/discharge switching element 39 is formed of a pair of upper and lower transistors, one of which becomes conductive in response to the repetitive command signal PLS. When the output logic level of the repetitive command signal PLS is "H", the coupling capacitor 51 is supplied with a charge current from a predetermined control power supply voltage Vcc via the upper transistor (not shown) and the series resistor R0. At this time, the lower transistor is opened.

On the other hand, when the output logic level of the repetitive command signal PLS is "L", a discharge current of the coupling capacitor 51 flows via the lower transistor (not shown) and the series resistor R0. At this time, the upper transistor is opened. The monitoring signal processing circuit 40 inputs the value of a monitoring voltage Vx, which is the potential between the another terminal A of the coupling capacitor 51 and the vehicle body 11, the another terminal A being a measurement point, to the arithmetic control circuit 20 via a noise filter (not shown) and an operational amplifier 49 as an analog signal voltage ANL.

In the first period T1=T in which the output logic level of the repetitive command signal PLS is "H", the value of the analog signal voltage ANL increases gradually from an initial voltage Vx1 to an end voltage Vx2. In the second period T2=T in which the output logic level of the repetitive command signal PLS is "L", the value of the analog signal voltage ANL decreases gradually from the initial voltage Vx2 to the end voltage Vx1. Note that, in the case where the leakage resistance fluctuates due to voltage fluctuations of the high voltage DC power source 61 or due to ON/OFF of a power supply switch for load driving, the voltage of the coupling capacitor 51 at the measurement point A becomes a value equal to or lower than 0 volts or equal to or larger than the control power supply voltage Vcc relative to the vehicle body potential, thus deviating from a proper voltage range.

When ground abnormality has occurred in the on-board high voltage device 60, bypass diodes 815 and 816 and bypass diodes 817 and 818 feed back the electric charges stored in the coupling capacitor 51 to the vehicle body 11 via an output terminal and a negative terminal of a constant voltage control power source (not shown) that generates the control power supply voltage Vcc, irrespective of the operating state of the charge/discharge switching element 39. Thus, the value of the monitoring voltage Vx can be returned to the proper voltage range of 0 to Vcc quickly. However, if a leakage resistance Rx is too small, the bypass diodes 817 and 818 at the upstream stage may be disconnected by an overcurrent. In this case, a limited current is fed back via the series resistor R0 and the bypass diodes 815 and 816.

In the state in which the value of the equivalent leakage resistance R1 on the positive potential side and the value of the leakage resistance R2 on the negative potential side are equal to each other and in which no charge/discharge current flows through the coupling capacitor 51, the potential at a connection point B relative to the vehicle body is −Vh/2 as compared to a voltage Vh of the high voltage DC power source 61. When the equivalent leakage resistance R1 is short-circuited, the potential at the connection point B relative to the vehicle body becomes −Vh. When the equivalent leakage resistance R2 is short-circuited, the potential at the connection point B relative to the vehicle body becomes 0. Such potential fluctuations cause a charge/discharge current to flow through the coupling capacitor 51, with the result that the potential at the measurement point A significantly fluctuates, and transiently, deviates outside the proper range of 0 to Vcc.

In FIG. 29 as a characteristics chart of the conventional apparatus configured as illustrated in FIG. 28, a leakage resistance coefficient β on the horizontal axis is a ratio between the value of a parallel combined resistance of the equivalent leakage resistances R1 and R2, namely the value of the leakage resistance Rx=R1×R2/(R1+R2), and the series resistance R0. The series resistance R0 is a known constant, and hence the value of the leakage resistance coefficient β=Rx/R0 is proportional to the leakage resistance Rx. A threshold voltage coefficient γ on the vertical axis is a ratio between a deviation voltage Vx2−Vx1 between the end voltage Vx2 and the initial voltage Vx1 described above, and the control power supply voltage Vcc. The control power supply voltage Vcc is a known constant, and hence the value of the threshold voltage coefficient γ=(Vx2−Vx1)/Vcc is proportional to the measured value of the deviation voltage Vx2−Vx1.

A plurality of characteristics curves of FIG. 29 use a reference time coefficient α0 as a parameter. The reference time coefficient α0 is a ratio between the half cycle T of the repetitive command signal PLS and a charge/discharge time constant τ=(R0+Rx)×C=R0×C with respect to the coupling capacitor 51 when the value of the leakage resistance Rx is zero. Both the half cycle T and the charge/discharge time constant τ are known constants, and hence the reference time coefficient α0=T/(R0×C) is a known constant.

For example, in the case where the series resistance R0 is selectively designed to have the same value as a limit leakage resistance Rx0 which is a permissible lower limit value of the leakage resistance Rx, an interest is taken in the value of the threshold voltage coefficient γ when the leakage resistance coefficient β is 1. If the reference time coefficient α0 is selectively designed to be 0.5, the threshold voltage coefficient γ at a point of interest P1 is 0.56.

Therefore, in the case where the control power supply voltage Vcc is 5 V, for example, if the deviation voltage Vx2−Vx1 exceeds 5×0.56=2.8 V at the end of the "H" period of the repetitive command signal PLS, the leakage resistance Rx is in a safe range exceeding the limit leakage resistance Rx0, and if the deviation voltage Vx2−Vx1 falls below 2.8 V, the leakage resistance Rx falls below the limit leakage resistance Rx0 and is in a dangerous range. Note that, the characteristics chart of FIG. 29 is based on Expression III shown at the top of FIG. 29, and Expression III is satisfied in a stable state in which the value of the monitoring voltage Vx falls within the proper range of 0 to Vcc.

The leakage detection apparatus of Japanese Patent Application Laid-open No. 2002-209331 calculates, based on the characteristics chart of FIG. 29, the deviation voltage Vx2−Vx1 between the initial voltage Vx1 and the end voltage Vx2 at the end of the "H" period (or at the end of the "L" period) of the repetitive command signal PLS, and reads out the value of the leakage resistance coefficient β corresponding to the deviation voltage, to thereby detect the current value of the leakage resistance Rx.

The first problem of this method is that the leakage resistance Rx is calculated at every end of the generated pulse of the repetitive command signal PLS (at every logic change) and hence, even if the deviation voltage is sufficiently high and the leakage resistance is normal at the timing before the end of the generated pulse, ground abnormality determination cannot be made in the pulse generation period. The second problem of this method is that, as is apparent from FIG. 29, the characteristics curves for the reference time coefficient α0 exceeding 1.54 are concave at the center, and hence even the same threshold voltage coefficient γ has two solutions of the leakage resistance coefficient β and a correct solution cannot be obtained.

The reason is that the expression indicates that the value of the threshold voltage coefficient γ converges to 1 when the leakage resistance coefficient β is infinite, and the value of the threshold voltage coefficient γ converges to 1 along with the increase in reference time coefficient α0 when the leakage resistance coefficient β is 0, and hence the threshold voltage coefficient γ takes a value in the range of 0 to 1. Note that, when the leakage resistance coefficient β is 0, the value of the threshold voltage coefficient γ decreases along with the decrease in reference time coefficient α0, and γ converses to 0 as α0 approaches 0.

Therefore, in order to avoid the above-mentioned binary problem, it is necessary that the reference time coefficient α0 to be used take a value of 1.0 or less, and it is necessary that the half cycle T of the pulse be a high frequency pulse whose reference time constant τ0 is equal to or smaller than the product of the series resistance R0 and the electrostatic capacitance C of the coupling capacitor 51 (=R0×C). When the repetitive command signal PLS is not a high frequency pulse, there is another problem in that the detection accuracy of the monitoring voltage deteriorates because an abrupt change occurs between the monitoring voltage at the end of the previous cycle and the monitoring voltage at the end of the current cycle.

Therefore, in the case where the repetitive command signal PLS is a high frequency signal, even after the monitoring voltage Vx deviates from the proper range of 0 to Vcc due to an abrupt change in leakage resistance Rx and then returns to the proper range again by the bypass diodes 815 to 818, it is necessary to wait for a large number of operations of the repetitive command signal PLS until a stable initial voltage Vx1 and a stable end voltage Vx2 are obtained. Thus, the ground abnormality determination cannot be made immediately. This is the above-mentioned second problem.

This problem is caused because the coupling capacitor 51 is alternately charged and discharged by the repetitive command signal PLS and hence the next charge starts before the completion of the previous discharge, and the monitoring voltage Vx does not increase or decrease monotonously. The repetitive command signal PLS shows a smaller change per one cycle as the frequency becomes higher and the cycle becomes shorter. The detection accuracy is therefore improved by increasing the frequency, but the response deteriorates.

The third problem of the above-mentioned method relates to the above-mentioned second problem and is that, in a transient delay period from when the monitoring voltage Vx returns to the proper range after the abrupt change in leakage resistance Rx to when a plurality of repetitive command signals PLS are operated to enable the measurement of the leakage resistance Rx, the measured value of the deviation voltage Vx2−Vx1 is smaller than that in the stable state used as the determination condition. Therefore, the obtained leakage resistance coefficient β is a small value, and it may be erroneously determined that ground abnormality has occurred. Thus, a standby time for avoiding such erroneous determination becomes longer.

SUMMARY OF THE INVENTION

It is a first object of the present invention to provide a leakage resistance detection device, which is capable of variably and easily setting a value of a limit leakage resistance as a setting constant with respect to an arithmetic control circuit, and which is capable of solving the above-mentioned first problem to measure a leakage resistance without waiting for a logic inversion end of a repetitive command signal, to thereby detect the occurrence of ground abnormality quickly.

Further, it is second and third objects of the present invention to provide a leakage resistance detection device, which is capable of solving the above-mentioned second and third problems to perform accurate measurement of a leakage resistance at the timing of the 1.5th cycle of a repetitive command signal at the latest after a monitoring voltage deviates from a proper range due to an abrupt change in leakage resistance and then returns to the proper range.

According to an exemplary embodiment of the present invention, there is provided a leakage resistance detection device for an on-board high voltage device, which is connectable to an on-board high voltage device including an on-board high voltage DC power source and a high voltage electric load to be fed and driven by the on-board high voltage DC power source, the on-board high voltage device having a leakage resistance Rx with respect to a vehicle body, as typified by an equivalent leakage resistance on a positive potential side and an equivalent leakage resistance on a negative potential side, the leakage resistance detection device including a constant voltage control power source which is fed and driven by a low voltage DC power source having a negative terminal connected to the vehicle body and which generates a control power supply voltage Vcc, the leakage resistance detection device being configured to measure a value of the leakage resistance Rx via a coupling capacitor having one terminal connected to a predetermined position of the on-board high voltage device, the leakage resistance detection device further including a repetitive signal output circuit, a monitoring signal processing circuit, and an arithmetic control circuit, the arithmetic control circuit including a microprocessor and a program memory which cooperate with each other. The repetitive signal output circuit alternately repeats, in response to a switching operation of a charge/discharge switching element that operates in response to a repetitive command signal PLS, a charge period and a discharge period in which a measurement point is intermittently connected to the control power supply voltage Vcc via a charge/discharge resistor, the measurement point being another terminal of the coupling capacitor, to thereby one of gradually increase and gradually decrease a monitoring voltage Vx which is a potential between the measurement point and the vehicle body.

Further, the monitoring signal processing circuit is configured to one of: generate at least one of inverted logic signals ANS, LOW, and HIG when a value of the monitoring voltage Vx, which one of gradually increases and gradually decreases at a gradient that becomes gentler as a charge/discharge time constant becomes larger, passes through a predetermined threshold voltage, and input the at least one of the inverted logic signals ANS, LOW, and HIG to the arithmetic control circuit; and generate an analog signal voltage ANL proportional to the monitoring voltage Vx and input the analog signal voltage ANL to the arithmetic control circuit. The arithmetic control circuit is configured to: measure a transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance on the positive potential side and the equivalent leakage resistance on the negative potential side, based on one of a function formula and a data table relating to the transition time Tx and the leakage resistance Rx; and generate a resistance abnormality determination output ER1 one of when the leakage resistance Rx becomes equal to or smaller than a predetermined limit leakage resistance Rx0 and when the transition time Tx reaches a limit transition time Tx0 corresponding to the predetermined limit leakage resistance Rx0. The repetitive command signal PLS includes one of a pulse signal with a fixed cycle having one of the charge period and the discharge period longer than at least the limit transition time Tx0, and a pulse signal with a variable cycle in which an output pulse is inverted when the transition time Tx is reached.

As described above, the leakage resistance detection device for an on-board high voltage device according to the present invention includes the coupling capacitor having the one terminal connected to the on-board high voltage device and the another terminal connected to the repetitive signal output circuit, and the arithmetic control circuit measures a leakage resistance as a function of the transition time during which the monitoring voltage, which is the potential at the another terminal of the coupling capacitor to be charged and discharged in response to the switching operation of the charge/discharge switching element, changes from one predetermined voltage to reach another predetermined voltage. When the measured leakage resistance becomes equal to or smaller than a predetermined limit leakage resistance, the arithmetic control circuit generates a resistance abnormality determination output.

Therefore, such abnormality determination threshold can be variably and easily set as a setting constant with respect to the arithmetic control circuit, and hence it is possible to determine whether the leakage resistance has become equal to or smaller than the limit leakage resistance and also possible to monitor the secular change in leakage resistance. Further, the calculation result of the leakage resistance can be obtained without waiting for the completion of a half cycle of the charge/discharge pulse with respect to the coupling capacitor. In addition, after the monitoring voltage has deviated from the proper voltage range due to an abrupt change in leakage resistance and then returned to the proper voltage range, the measurement of the leakage resistance is performed by a charge/discharge pulse after the half cycle at the latest without needing a plurality of repetitive command signals. As a result, when the ground abnormality has occurred, the resistance abnormality determination output can be generated quickly, and hence there is an effect of improving the search performance on the ground abnormality that temporarily occurs due to vibrations of the vehicle body.

BRIEF DESCRIPTION OF THE DRAWINGS

In the accompanying drawings:

FIG. 21 is a time chart for describing the operation of the device of FIG. 20;

DETAILED DESCRIPTION OF THE PREFERRED EMBODIMENTS

Figure 1:
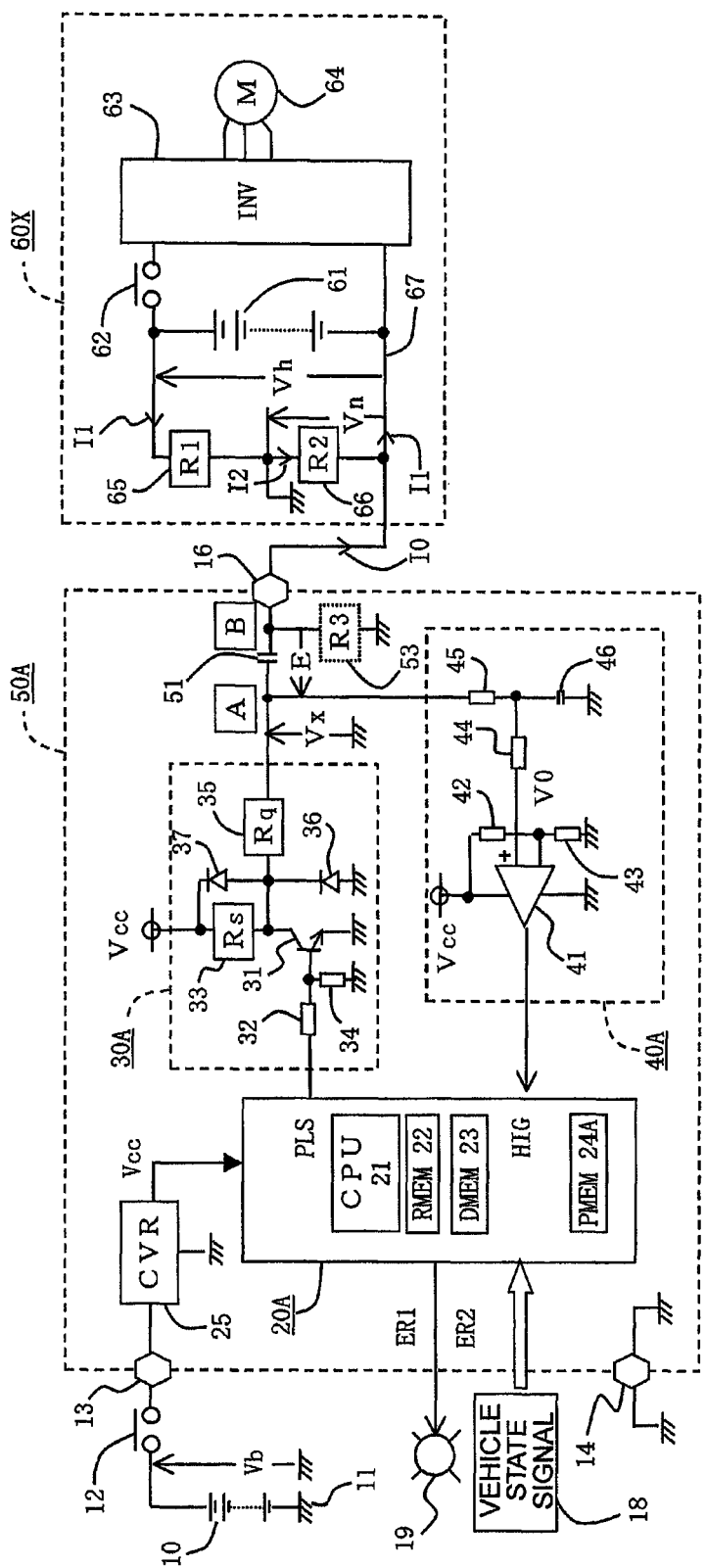
FIG. 1 is an overall configuration diagram of a device according to a first embodiment of the present invention.

A leakage resistance detection device for an on-board high voltage device and a leakage resistance detection method therefor according to exemplary embodiments of the present invention are described below with reference to the accompanying drawings. In the drawings, the same or equivalent parts are denoted by the same reference symbols.

First Embodiment

Now, a description is given with reference to an overall configuration diagram of FIG. 1 illustrating a device according to a first embodiment of the present invention. In FIG. 1, a low voltage DC power source 10, which is externally connected to a leakage resistance detection device 50A, is an on-board battery such as a 12-V secondary lead battery. The low voltage DC power source 10 has a negative terminal grounded to a vehicle body 11. A positive terminal thereof supplies a first power supply voltage Vb via a low voltage power supply switch 12 to a positive-side low voltage power supply terminal 13 provided to the leakage resistance detection device 50A. The low voltage power supply switch 12 uses an output contact of an electromagnetic relay which is energized when a manual power supply switch (not shown) is closed. When the manual power supply switch is opened, the low voltage power supply switch 12 is opened after a short delay time so as to perform delayed feeding.

A negative-side low voltage power supply terminal 14 provided to the leakage resistance detection device 50A is grounded to the vehicle body 11. An interconnection terminal 16 is connected to, for example, a negative-side power supply line 67 of an on-board high voltage device 60X. A vehicle state signal 18 is information related to leakage resistance measurement to be input to the leakage resistance detection device 50A, such as whether a high voltage power supply switch 62 included in the on-board high voltage device 60X to be described below is closed or not or whether a charger (not shown) is connected to a high voltage DC power source 61 or not. The vehicle state signal 18 is connected through a serial signal line, for example. An abnormality alarm device 19 is, for example, a display device that operates in response to a resistance abnormality determination output ER1 or a pre-alarm output ER2 generated by the leakage resistance detection device 50A.

The high voltage DC power source 61 included in the on-board high voltage device 60X is a lithium-ion battery having a nominal output voltage of 400 V, for example. The high voltage DC power source 61 supplies a second power supply voltage Vh to an inverter 63 via the high voltage power supply switch 62. The inverter 63 is formed of a three-phase transistor bridge circuit and performs variable speed drive control on a high voltage electric load 64 such as a three-phase AC motor.

The on-board high voltage device 60X, which includes the high voltage DC power source 61, an electromagnetic relay (not shown) such as the high voltage power supply switch 62, the inverter 63, and the high voltage electric load 64, is mounted on the vehicle body 11 while being electrically insulated from the vehicle body 11. Actually, however, a leakage resistance as typified by a positive-side equivalent leakage resistor 65 and a negative-side equivalent leakage resistor 66 is generated and distributed in the vehicle body 11.

When the value of an equivalent leakage resistor which is connected to the interconnection terminal 16 (corresponding to the equivalent leakage resistor 66 in FIG. 1) is represented by R2 and the value of an equivalent leakage resistor which is not connected to the interconnection terminal 16 (corresponding to the equivalent leakage resistor 65 in FIG. 1) is represented by R1, a voltage Vn that is generated between the interconnection terminal 16 connected to the negative-side power supply line 67 and the vehicle body 11 is calculated by Expression (4x), which is the solution to a system of equations (1x) to (3x).

$$I1=(Vh-Vn)/R1 \tag{1x}$$

$$I2=Vn/R2 \tag{2x}$$

$$I1 = I0 + I2 \tag{3x}$$

$$Vn = Vn0 - I0 \times Rx \tag{4x}$$

where $Vn0 = Vh \times R2/(R1+R2) = Vh \times Rx/R1$ $Rx = R1 \times R2/(R1+R2)$ In the expressions, I1 represents a current flowing through the equivalent resistor R1 in the illustrated direction, I2 represents a current flowing through the equivalent resistor R2 in the illustrated direction, I0 represents a current flowing from the interconnection terminal 16 in the illustrated direction, Rx represents a combined leakage resistance value, and Vn0 represents the value of Vn when I0 is 0 (stable divided voltage).

When the electrostatic capacitance of a coupling capacitor 51 is represented by C, a voltage across the coupling capacitor 51 (both-end voltage) is represented by E, and a monitoring voltage is represented by Vx, Expressions (5x) and (6x) are established.

$$C \times (dE/dt) = I0 \tag{5x}$$

$$E = Vn + Vx \tag{6x}$$

Expressions (4x) and (5x) are substituted into Expression (6x) to obtain Expression (7x).

$$Vn0 + Vx = E + C \times Rx(dE/dt) \tag{7x}$$

Next, an internal configuration of the leakage resistance detection device 50A is described. An arithmetic control circuit 20A is an integrated circuit element incorporating a microprocessor 21 as a main component, and a volatile RAM memory 22, a non-volatile data memory 23, and a non-volatile program memory 24A such as a flash memory which can be chip-erased electrically in block units. The non-volatile data memory 23 uses a partial area of the program memory 24A. Alternatively, the non-volatile data memory 23 may be installed outside the integrated circuit element and serially connected to the microprocessor 21 as a memory which can freely read and write data electrically in byte units.

A constant voltage control power source 25 generates a stabilized control power supply voltage Vcc such as DC 5 V based on the first power supply voltage Vb, which is fed from the positive-side low voltage power supply terminal 13 and significantly fluctuates. The constant voltage control power source 25 supplies the control power supply voltage Vcc to the arithmetic control circuit 20A as well as a repetitive signal output circuit 30A and a monitoring signal processing circuit 40A to be described below. The arithmetic control circuit 20A generates a repetitive command signal PLS, which is a pulse train signal having a fixed cycle, and inputs the repetitive command signal PLS to the repetitive signal output circuit 30A. The repetitive command signal PLS is to be described below with reference to FIG. 2. The arithmetic control circuit 20A is connected to an inverted logic signal HIG obtained from the monitoring signal processing circuit 40A as an input signal. Further, the arithmetic control circuit 20A generates the pre-alarm output ER2 when the measured value of the leakage resistance Rx becomes equal to or smaller than a predetermined preliminary leakage resistance Rxn, and generates the resistance abnormality determination output ER1 when the measured value of the leakage resistance Rx becomes equal to or smaller than a limit leakage resistance Rx0, which are output to the abnormality alarm device 19.

The repetitive signal output circuit 30A includes a charge/discharge switching element 31, a drive resistor 32, a charge/discharge resistor 33, and an open-circuit stabilizing resistor 34. The charge/discharge switching element 31 is an NPN transistor, for example. The drive resistor 32 is connected to a base terminal of the charge/discharge switching element 31 and receives the repetitive command signal PLS as its input. The charge/discharge resistor 33 is connected to a collector terminal of the charge/discharge switching element 31 and applied with the control power supply voltage Vcc. The open-circuit stabilizing resistor 34 is connected between the base terminal and an emitter terminal connected to the vehicle body 11. The collector terminal of the charge/discharge switching element 31 is further connected via a rapid charge/discharge resistor 35 to another terminal A of the coupling capacitor 51 having one terminal B connected to the interconnection terminal 16.

The collector terminal of the charge/discharge switching element 31 is further connected to bypass diodes 37 and 36. When the potential of the another terminal A of the coupling capacitor 51 increases to be equal to or higher than the control power supply voltage Vcc, the bypass diode 37 feeds back a current to the constant voltage control power source 25 via the rapid charge/discharge resistor 35 and discharges the coupling capacitor 51, irrespective of the operating state of the charge/discharge switching element 31. When the potential of the another terminal A of the coupling capacitor 51 decreases to be equal to or lower than the potential of the vehicle body, the bypass diode 36 feeds back a current from the vehicle body 11 via the rapid charge/discharge resistor 35 and charges the coupling capacitor 51, irrespective of the operating state of the charge/discharge switching element 31. The potential between a measurement point A, which is the another terminal of the coupling capacitor 51, and the vehicle body 11 is input to the monitoring signal processing circuit 40A as the monitoring voltage Vx.

Note that, a bypass leakage resistor 53 is possibly connected between the interconnection point B and the vehicle body 11, and prevents the charge/discharge current with respect to the coupling capacitor 51 from being too small when the leakage resistance Rx is infinite. The value of an additional resistance R3 which is a resistance value of the bypass leakage resistor 53 is, for example, about ten times the limit leakage resistance Rx0 used for abnormality determination. The monitoring signal processing circuit 40A to which the monitoring voltage Vx is input includes a comparator 41, voltage dividing resistors 42 and 43, an input resistor 44, and a noise filter circuit formed of a smoothing resistor 45 and a smoothing capacitor 46. The voltage dividing resistors 42 and 43 divide the control power supply voltage Vcc to generate a set threshold voltage V0, which is input to a negative input terminal of the comparator 41. The input resistor 44 is connected to a positive input terminal of the comparator 41. The smoothing resistor 45 has one terminal applied with the monitoring voltage Vx and another terminal connected to the positive input terminal of the comparator 41 via the input resistor 44.

The noise filter circuit prevents a noise signal having a much higher frequency than a repetition frequency of the repetitive command signal PLS from being input to the comparator 41. The influence of the noise filter appears as an error that a measured transition time Tx becomes slightly longer. From the viewpoint of the actual control characteristics, however, the value of the monitoring voltage Vx can be regarded as being directly applied to the positive input terminal of the comparator 41. When the value of the monitoring voltage Vx becomes equal to or higher than the set threshold voltage V0, the output logic of the comparator 41 becomes "H" and is input to the arithmetic control circuit 20A as the inverted logic signal HIG.

Hereinafter, the action and operation of the device according to the first embodiment of the present invention configured as illustrated in FIG. 1 are briefly described with reference to a time chart of FIG. 2 as well as FIG. 1. First, in FIG. 1, when the manual power supply switch (not shown) is closed and the low voltage power supply switch 12 is closed, the constant voltage control power source 25 generates a predetermined control power supply voltage Vcc. The microprocessor 21 then starts its control operation and generates a repetitive command signal PLS shown in part (A) of FIG. 2. A first period (slow charge period) T1 in which the repetitive command signal PLS has a logic level "L" and a second period (rapid discharge period) T2 in which the repetitive command signal PLS has a logic level "H" have the same half-cycle value of the whole cycle T0=T1+T2. Actually, however, T1≤T2 may be satisfied.

Figure 2:
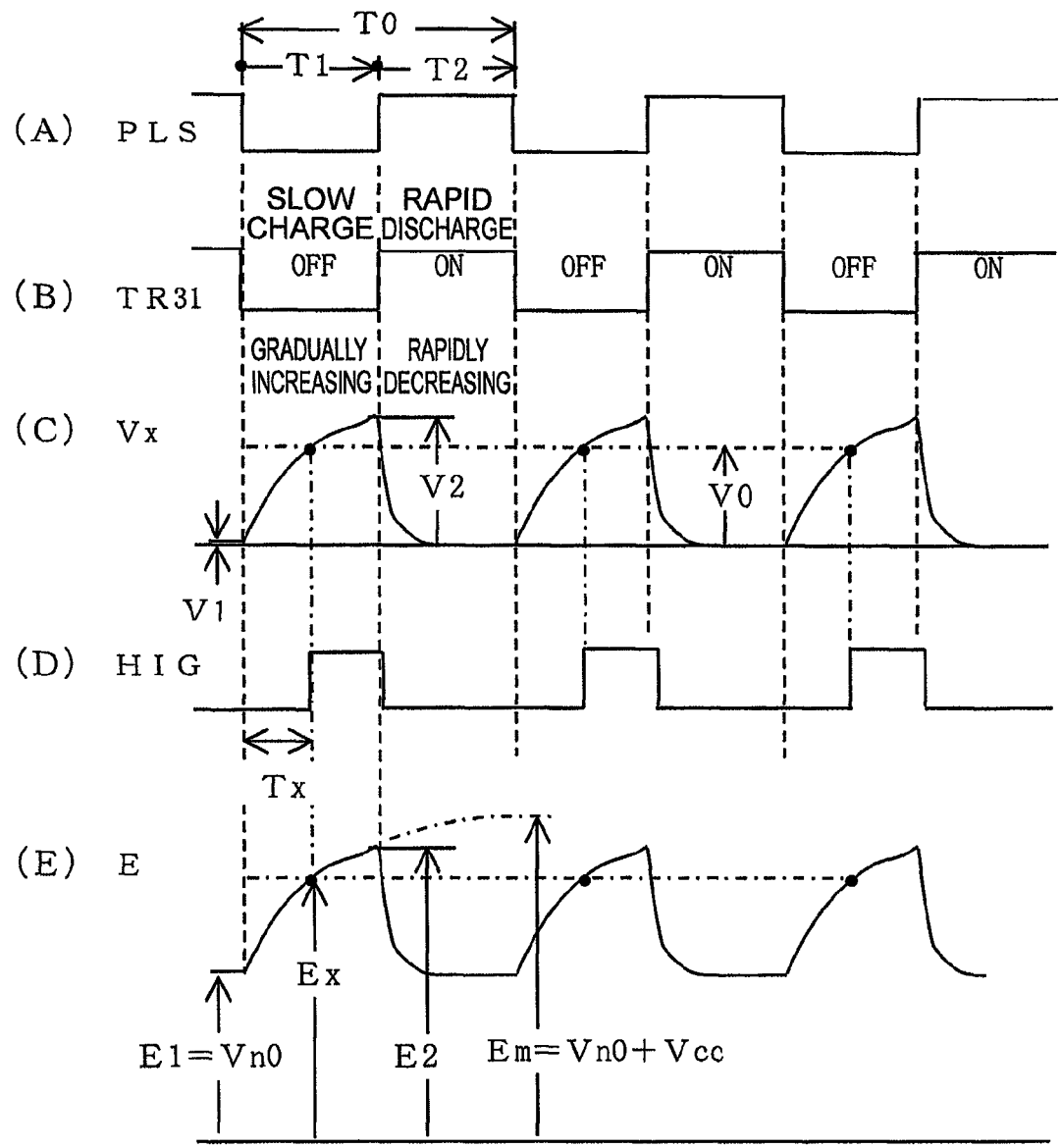
FIG. 2 is a time chart for describing the operation of the device of FIG. 1.

In FIG. 1, when the logic level of the repetitive command signal PLS is "L" (or "H"), the charge/discharge switching element 31 is interrupted (or becomes conductive) as shown in part (B) of FIG. 2. Then, in FIG. 1, when the charge/discharge switching element 31 is interrupted, the coupling capacitor 51 is charged from the constant voltage control power source 25 via a series circuit of the charge/discharge resistor 33, the rapid charge/discharge resistor 35, and the leakage resistance Rx, with the result that the monitoring voltage Vx increases gradually. On the other hand, in FIG. 1, when the charge/discharge switching element 31 becomes conductive, the charged electric charges of the coupling capacitor 51 are discharged via a series circuit of the rapid charge/discharge resistor 35 and the leakage resistance Rx, with the result that the monitoring voltage Vx decreases rapidly.

Part (C) of FIG. 2 shows how the monitoring voltage Vx increases gradually or decreases rapidly. The gradient of the charge/discharge characteristics becomes gentler as charge/discharge time constants expressed in Expressions (8x) and (9x) become larger.

$$\tau 1 = (R0+Rx) \times C, R0 = Rs+Rq \quad (8x)$$

$$\tau 2 = (Rq+Rx) \times C \quad (9x)$$

In the expressions, Rs represents the resistance value of the charge/discharge resistor 33; Rq, the resistance value of the rapid charge/discharge resistor 35 (Rq<<Rs); R0=Rs+Rq≈Rs, a series resistance; Rx, a parallel combined resistance of the equivalent leakage resistances R1 and R2; C, the electrostatic capacitance of the coupling capacitor 51; $\tau 1$, a slow charge time constant; and $\tau 2$, a rapid discharge time constant.

The resistance value Rs is, for example, several hundred KΩ while the resistance value Rq is several KΩ. When the value of the leakage resistance Rx is small, $\tau 1 >> \tau 2$ is established between the slow charge time constant $\tau 1$ and the rapid discharge time constant $\tau 2$. However, when the value of the leakage resistance Rx is sufficiently larger than the resistance value Rs, $\tau 1 \approx \tau 2$ is established, and hence the charge/discharge time constants have little difference and rapid discharge is not performed.

In part (C) of FIG. 2, the value of the monitoring voltage Vx at the end of the first period T1 after the slow charge is a first end voltage V2, and the value of the monitoring voltage Vx at the end of the second period T2 after the rapid discharge is a second end voltage V1. The value of the second end voltage V1 needs to be almost 0. It is therefore necessary that the rapid discharge time constant $\tau 2$ be smaller than the slow charge time constant $\tau 1$ and it is desired that the second period T2 be longer than the first period T1. As a result, the initial value V1 of the gradually-increasing monitoring voltage Vx is always 0 (or a value of almost 0), and hence the initial value does not fluctuate depending on the magnitude of the first end voltage V2.

Part (D) of FIG. 2 shows the logic state of the inverted logic signal HIG. The inverted logic signal HIG has a logic level "H" in a period in which the value of the monitoring voltage Vx shown in part (C) of FIG. 2 is equal to or higher than the set threshold voltage V0. The arithmetic control circuit 20A measures a transition time Tx, which starts at the time point of logic inversion of the repetitive command signal PLS from "H" to "L" and lasts until the logic of the inverted logic signal HIG changes from "L" to "H".

Part (E) of FIG. 2 shows the waveform of the both-end voltage E of the coupling capacitor 51. A charge initial voltage (=discharge end voltage) E1 is equal to the stable divided voltage Vn0 expressed in Expression (4x). The value of a charge end voltage (=discharge initial voltage) E2 increases to Vn0+Vcc in the case where the charge period T1 is infinite. The value of the transition time Tx in which the value of the gradually-increasing monitoring voltage Vx transitions from a first threshold (V1=0) to a second threshold (V0) is measured, to thereby calculate the value of the leakage resistance Rx. Note that, the first period T1 of the repetitive command signal PLS is set to be longer than a limit transition time Tx0, which corresponds to the value of the transition time Tx when the value of the leakage resistance Rx has reached the limit leakage resistance Rx0 used for abnormality determination.

Figure 3:
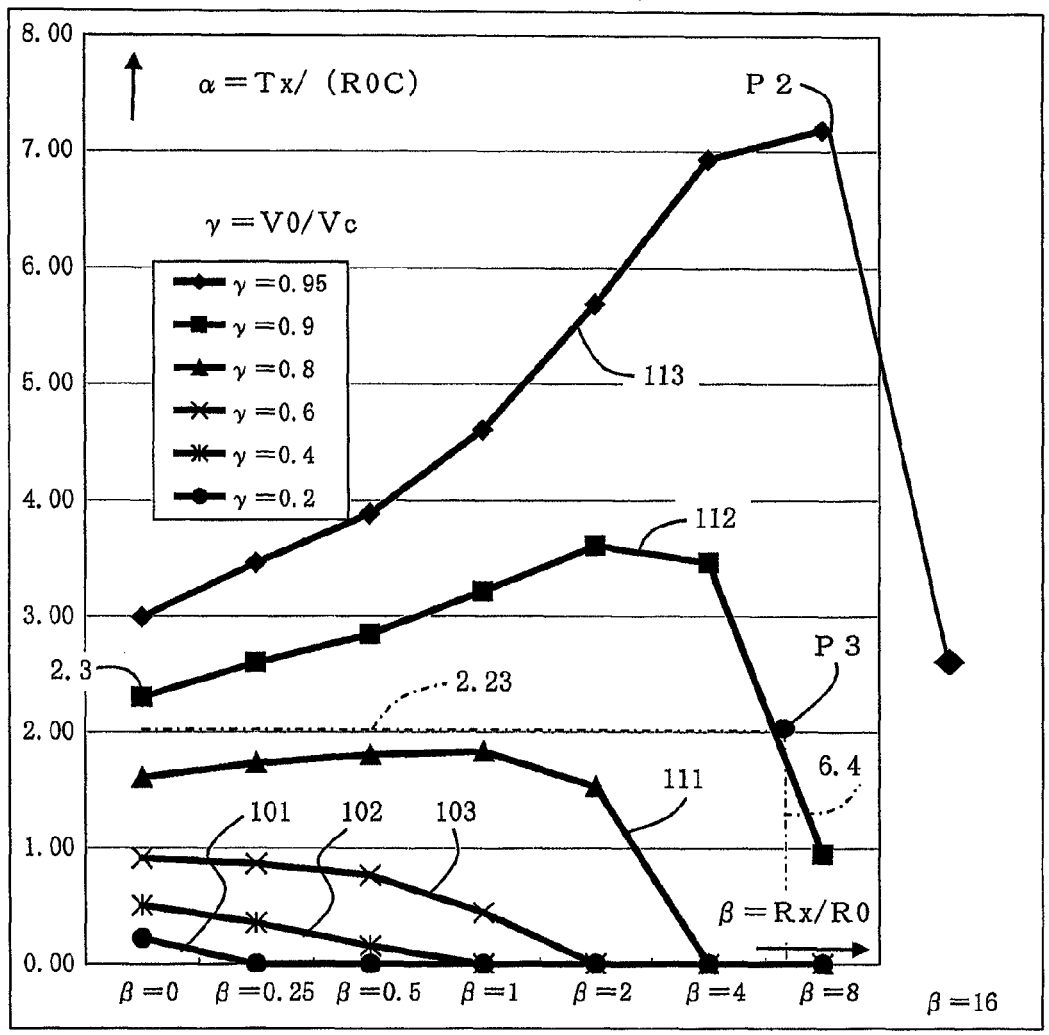
FIG. 3 is a full-range characteristics chart for describing the operation of the device of FIG. 1.

Hereinafter, based on the device according to the first embodiment of the present invention configured as illustrated in FIG. 1, a method of detecting the leakage resistance is described with reference to characteristics charts of FIGS. 3 to 5. In FIG. 3, a leakage resistance coefficient β on the horizontal axis is a ratio between the value of the parallel combined resistance of the equivalent leakage resistances R1 and R2, namely the value of the leakage resistance Rx=R1×R2/(R1+R2), and the series resistance R0=Rs+Rq. The series resistance R0 is a known constant, and hence the value of the leakage resistance coefficient β=Rx/R0 is proportional to the leakage resistance Rx.

A transition time coefficient α on the vertical axis is a ratio between a measured transition time Tx and a charge/discharge time constant $\tau=(R0+Rx)\times C=R0\times C$ with respect to the coupling capacitor 51 when the value of the leakage resistance Rx is zero. The charge/discharge time constant $\tau$ is a known constant, and hence the value of the transition time coefficient α=Tx/(R0×C) is proportional to the transition time Tx.

A plurality of characteristics curves of FIG. 3 use a threshold voltage coefficient γ as a parameter. In the case where the measurement of the transition time Tx is performed with respect to the monitoring voltage Vx that increases gradually from 0 volts to V0 volts, the threshold voltage coefficient γ is V0/Vcc. Also in the case where the measurement is performed with respect to the monitoring voltage Vx that decreases gradually from Vcc volts to (Vcc−V0) volts, the threshold voltage coefficient γ satisfies the same expression. The threshold voltage V0 and the control power supply voltage Vcc are known values, and hence the value of the threshold voltage coefficient γ is a known value as a design constant.

The plurality of characteristics curves using the threshold voltage coefficient γ as a parameter are classified into a negative-gradient curve as represented by curves 101, 102, and 103 in which the transition time coefficient α decreases along with the increase in leakage resistance coefficient β and a bell-shaped curve as represented by curves 111, 112, and 113 which is convex at the center and has a positive-gradient curve region and a negative-gradient curve region.

Figure 4:
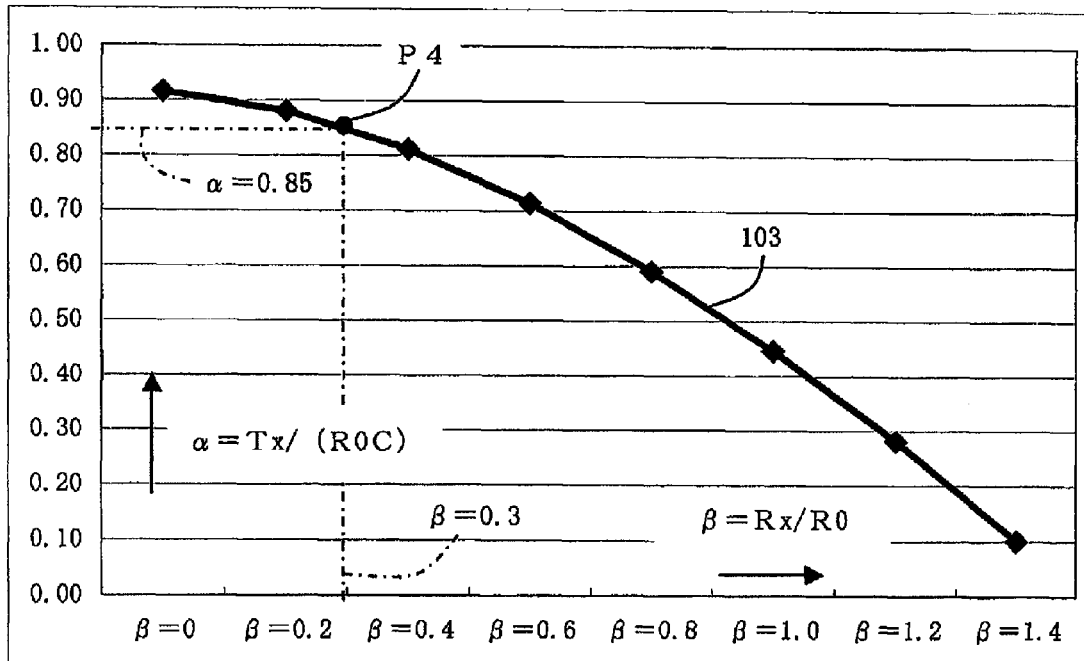
FIG. 4 is a low-range characteristics chart for describing the operation of the device of FIG. 1.

FIG. 4 is an enlarged graph of the curve 103 of FIG. 3 and shows a negative-gradient curve for the threshold voltage coefficient γ of 0.6. In the case where the value of the series resistance R0 is designed to be 3.3 times the limit leakage resistance Rx0, the value of the leakage resistance coefficient R when the actual value of the leakage resistance Rx has become equal to the limit leakage resistance Rx0 is Rx/R0=Rx0/(3.3Rx0)=0.3, and hence the transition time coefficient α of 0.85 corresponding to a point of interest P4 of FIG. 4 is the value corresponding to the measured transition time Tx.

Therefore, when the transition time coefficient α is 0.85 or more, the leakage resistance Rx is determined to be in the dangerous state of being equal to or smaller than the limit leakage resistance Rx0, and when the transition time coefficient α is less than 0.85, the leakage resistance Rx is determined to be in the safe state of exceeding the limit leakage resistance Rx0. For example, in the case where the limit leakage resistance Rx0 is set to 200 KΩ, the series resistance R0 is set to 200×3.3=660 KΩ, and the electrostatic capacitance C of the coupling capacitor 51 is set to 0.47 μF, the charge/discharge time constant τ is 660×0.47=310 msec, and hence the limit transition time Tx0 is α×(R0×C)=0.85×310=264 msec.

Further, in FIG. 4, when the leakage resistance coefficient β is 0, the value of the transition time coefficient α is 0.92. Thus, the occurrence of complete ground abnormality can be detected as long as the charge period of the repetitive command signal PLS is a pulse width equal to or longer than 310×0.92=285 msec. In contrast, it is determined to be timeout abnormality when an inverted logic signal cannot be obtained even after 285 msec since the logic of the repetitive command signal PLS was inverted to the charge side.

In addition, in FIG. 4, when the leakage resistance coefficient β of 1.4 (α=0.1) is a measurement upper limit, a measurable value of the leakage resistance Rx is β×R0=1.4×(3.3×Rx0)=4.62Rx0. It is therefore difficult to accurately measure a leakage resistance exceeding 4.6 times the limit leakage resistance Rx0, but the normal state of the leakage resistance can be detected with reliability.

Returning to FIG. 3, the curve 112 can be used to measure the leakage resistance even by excluding the positive-gradient curve region and using only the negative-gradient curve region. The horizontal axis of FIG. 3 has a geometric scale, and hence the transition time coefficient α seems to attenuate rapidly. However, a gentle attenuation curve is obtained on an arithmetic scale.

In this case, attention is paid on the leakage resistance coefficient β of 6.4 corresponding to a point of interest P3 (α=2.23) at which the value of the transition time coefficient α for the leakage resistance coefficient β of 0 is 2.3 or less. When the series resistance R0 is set to Rx0/6.4, the leakage resistance coefficient β when the leakage resistance Rx has deceased to the limit leakage resistance Rx0 is Rx0/R0=6.4. Therefore, the value of the limit leakage resistance Rx0 can be detected based on the transition time coefficient α corresponding to the point of interest P3.

In this case, however, the leakage resistance equal to or smaller than the limit leakage resistance Rx0 cannot be measured, and when the transition time coefficient α exceeds 2.3, a binary problem occurs and a correct value of the leakage resistance cannot be specified. Further, in the curve 112 of FIG. 3, when the leakage resistance coefficient β of 8.5 (α=0.49) is a measurement upper limit, a measureable value of the leakage resistance Rx is β×R0=8.5×(Rx0/6.4)=1.33Rx0. It is therefore difficult to accurately measure a leakage resistance exceeding 1.33 times the limit leakage resistance Rx0, but the normal state of the leakage resistance can be detected with reliability.

If the resistance equal to or smaller than the limit leakage resistance can be measured, the measured resistance can be utilized as information for pursuing the cause of the decrease in leakage resistance. In general, however, there is no problem even if the resistance equal to or smaller than the limit leakage resistance Rx0 cannot be measured. Further, in general, as long as a leakage resistance for pre-alarming which is about 1.3 times the limit leakage resistance Rx0 can be measured, it is unnecessary to accurately measure a larger leakage resistance. From this viewpoint, it is possible to use both the negative-gradient curve 103 and the curve 112 having the negative-gradient curve region following the positive-gradient curve region. However, there is no advantage in using the negative-gradient region of the bell-shaped curve, and it is more advantageous to use the curve 103 having only the negative-gradient curve.

Figure 5:
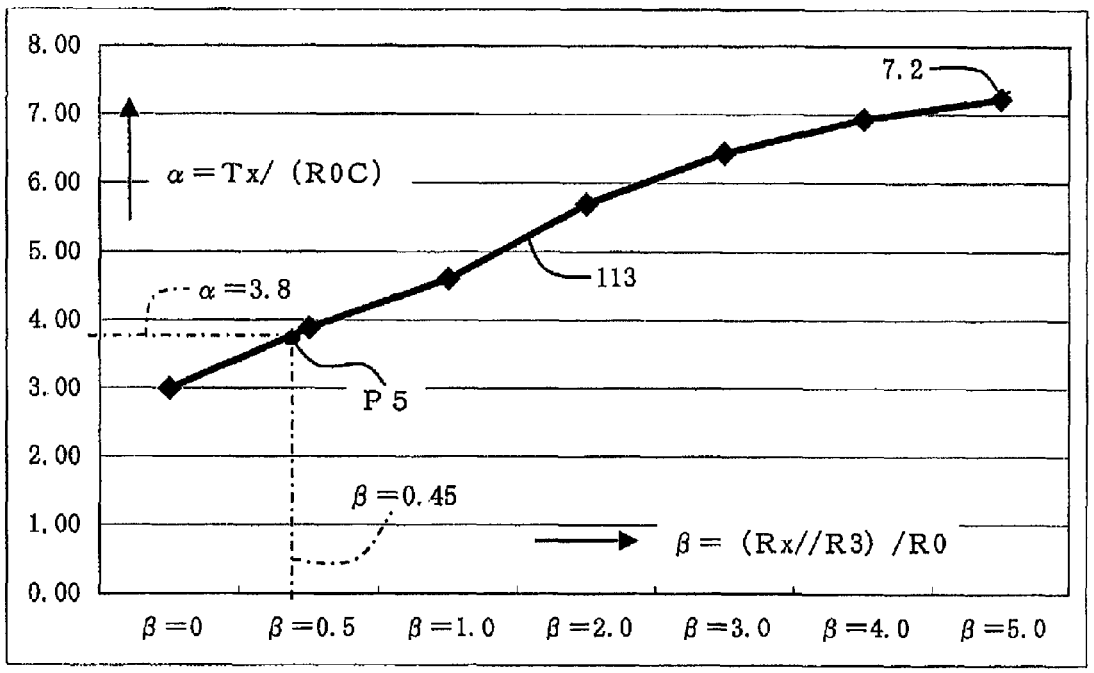
FIG. 5 is a high-range characteristics chart for describing the operation of the device of FIG. 1.

FIG. 5 is an enlarged graph of the curve 113 of FIG. 3 and shows a positive-gradient curve for the threshold voltage coefficient γ of 0.95. However, the value of the series resistance R0 is set to 2.0 times the value of the limit leakage resistance Rx0, and the additional resistance R3=10×Rx0 is connected in parallel by the bypass leakage resistance 53. Therefore, even if the actual leakage resistance Rx is infinite, the upper limit value of the leakage resistance coefficient β is R3/R0=10×Rx0/(2×Rx0)=5, which is within the positive-gradient curve region of the curve 113 of FIG. 3.

In the case of FIG. 5, the value of the leakage resistance coefficient β when the actual value of the leakage resistance Rx has become equal to the limit leakage resistance Rx0 is (Rx0//R3)/R0=(Rx0//10Rx0)/(2Rx0)=0.45, and hence the transition time coefficient α of 3.8 corresponding to a point of interest P5 of FIG. 5 is the value corresponding to the measured transition time Tx.

For example, in the case where the limit leakage resistance Rx0 is set to 200 KΩ, the additional resistance R3 is 2 MΩ and the series resistance R0 is 400 KΩ. Thus, the charge/discharge time constant as a reference when the electrostatic capacitance C of the coupling capacitor 51 is set to 0.15 μF is R0×C=400×0.15=60 msec. Therefore, the limit transition time Tx0 when the leakage resistance Rx has decreased to the limit leakage resistance Rx0 is α×(R0×C)=3.8×60=228 msec. Thus, the leakage resistance Rx can be determined to be in the dangerous state when the transition time Tx becomes 228 msec or less and in the safe state when the transition time Tx exceeds 228 msec.

Further, in FIG. 5, the value of the transition time coefficient α at an upper limit value of the leakage resistance coefficient β of 5.0 is 7.2. Thus, theoretically, the leakage resistance can be detected up to an infinite value as long as the charge period of the repetitive command signal PLS is a pulse width equal to or longer than 60×7.2=432 msec. In contrast, it is determined to be timeout abnormality when an inverted logic signal cannot be obtained even after 432 msec since the logic of the repetitive command signal PLS was inverted to the charge side.

In the above description, the upper limit of the leakage resistance coefficient β is limited by the bypass leakage resistance 53 for the limited use of the positive-gradient curve region of the bell-shaped curve in FIG. 3. The bypass leakage resistance 53 has a known resistance value. Thus, at the time of product shipping inspection, by measuring the leakage resistance in the state in which the on-board high voltage device 60X is not connected, the individual fluctuations in electrostatic capacitance C of the coupling capacitor 51 can be measured so that a calibrated value of the electrostatic capacitance C can be calculated and stored.

The characteristics curves shown in FIG. 3 are based on Expression I shown at the top of FIG. 3, and Expression I is established when the monitoring voltage Vx falls within a proper range of 0 to Vcc. The establishment of Expression 1 is demonstrated as follows.

Charge Period

In the charge period in which the logic level of the repetitive command signal PLS in FIG. 1 is "L" and the transistor serving as the charge/discharge switching element 31 is opened, Expression (10a) is established.

$$Vcc = R0 \times C(dE/dt) + Vx \qquad (10a)$$

where $R0 = Rs + Rq \approx Rs \gg Rq$

Vx in Expression (10a) is substituted into Expression (7x) above to obtain Expression (11a).

$$Vcc + Vn0 = E + \tau 1 \times (dE/dt) \qquad (11a)$$

where $\tau 1 = (R0 + Rx)C \approx (Rs + Rx)C$

In the differential equation (11a), the initial value of E at the time t=0 is represented by E1 and the value of E at the infinite time is represented by Vcc+Vn0. Then, a solution expressed by Expression (12a) is obtained.

$$E = E1 \exp(-t/\tau 1) + (Vcc + Vn0)\{1 - \exp(-t/\tau 1)\} \qquad (12a)$$

In addition, the value of (dE/dt) in Expression (10a) is substituted into Expression (7x) above to obtain Expression (13a).

$$Vx/(R0//Rx) = Vcc/R0 + (E - Vn0)/Rx \qquad (13a)$$

where R0//Rx represents the parallel combined resistance of R0 and Rx.

Discharge Period

In the discharge period in which the logic level of the repetitive command signal PLS in FIG. 1 is "H" and the transistor serving as the charge/discharge switching element 31 is closed, Expression (10b) is established.

$$0 = C \times Rq(dE/dt) + Vx \qquad (10b)$$

Vx in Expression (10b) is substituted into Expression (7x) above to obtain Expression (11b).

$$Vn0 = \tau 2(dE/dt) + E \qquad (11b)$$

where $\tau 2 = (Rq + Rx) \times C$

In the differential equation (11b), the initial value of E at the time t=0 is represented by E2 and the value of E at the infinite time is represented by Vn0. Then, a solution expressed by Expression (12b) is obtained.

$$E = E2 \exp(-t/\tau 2) + Vn0\{1 - \exp(-t/\tau 2)\} \qquad (12b)$$

In addition, the value of (dE/dt) in Expression (10b) is substituted into Expression (7x) above to obtain Expression (13b).

$$Vx/(Rq//Rx) = (E - Vn0)/Rx \qquad (13b)$$

where Rq//Rx represents the parallel combined resistance of Rq and Rx.

Stable State

In the stable state in which the logic level of the repetitive command signal PLS in FIG. 1 is inverted alternately in the charge period T1 and the discharge period T2 and there is no change in the value of the leakage resistance Rx and in the output voltage Vh of the high voltage DC power source 61, the initial values E1 and E2 in Expressions (12a) and (12b) are calculated as follows. First, in Expression (12a), at the charge end time t=T1, E=E2 is established, and hence Expression (14a) is established.

$$E2 = E1 \times K1 + (Vcc + Vn0)(1 - K1) \qquad (14a)$$

where $K1 = \exp(-T1/\tau 1)$

In addition, in Expression (12b), at the discharge end time t=T2, E=E1 is established, and hence Expression (14b) is established.

$$E1 = E2 \times K2 + Vn0(1 - K2) \qquad (14b)$$

where $K2 = \exp(-T2/\tau 2)$

From Expressions (14a) and (14b), Expressions (15a) and (15b) are obtained.

$$E1 - Vn0 = Vcc \times K0 \times K2 \qquad (15a)$$

$$E2 - Vn0 = Vcc \times K0 \qquad (15b)$$

where $K0 = (1 - K1)/(1 - K1 \times K2)$

Conventional Case

Figure 28:
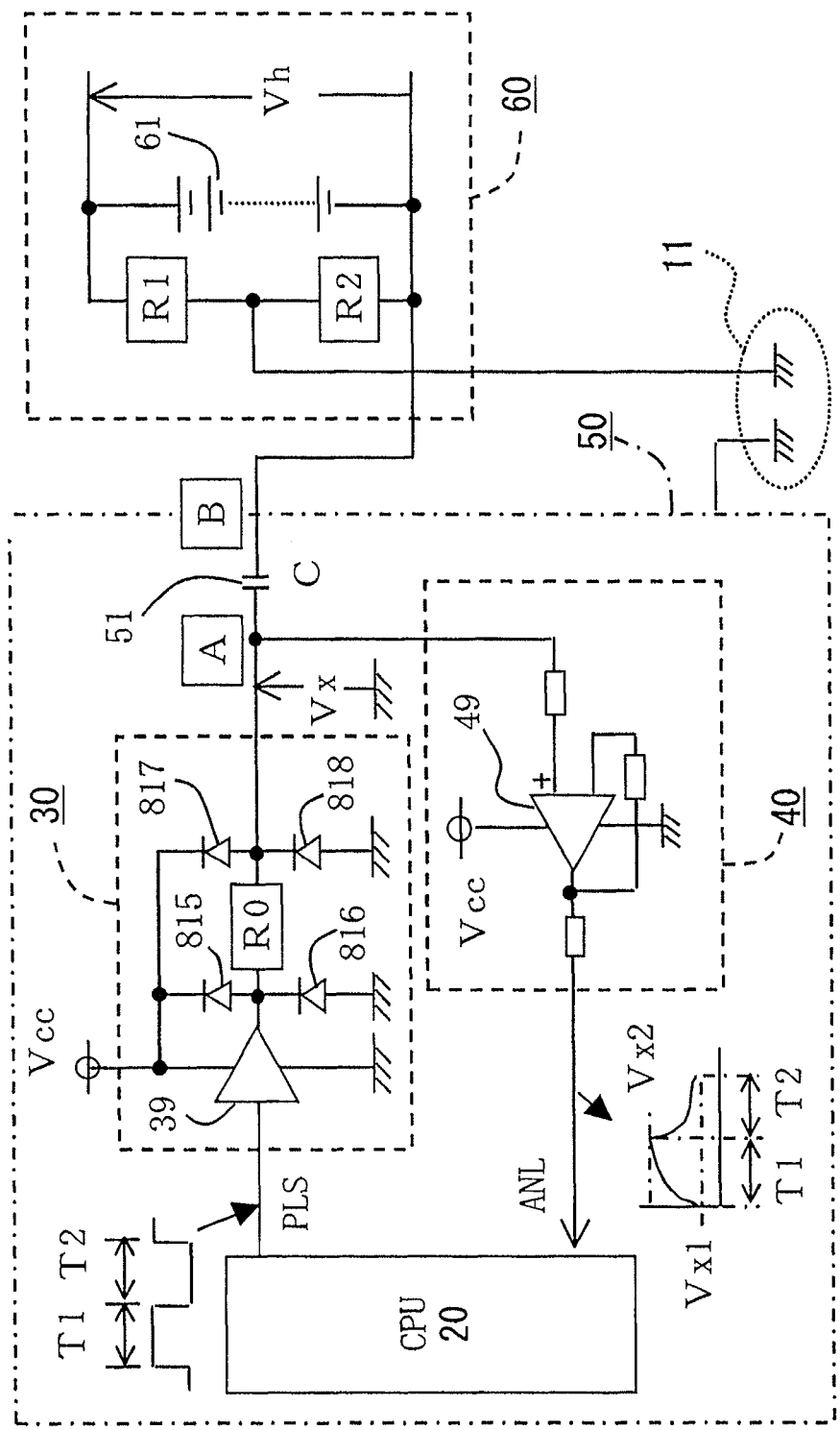
FIG. 28 is an overall configuration diagram related to a conventional known example.

In the conventional case illustrated in FIG. 28, the charge/discharge time constants are $\tau 1 = \tau 2 = \tau = C \times (R0 + Rx)$ and the charge period T1 and the discharge period T2 are T1=T2=T. Thus, $K1 = K2 = K = \exp(-T/\tau)$ is established, and K0 is simplified to $1/(1+K)$. A monitoring voltage value Vx2 at the charge end (time t=T1=T) is calculated by Expression (16a) using Expressions (13a) and (15b).

$$Vx2/(R0 // Rx) = Vcc/R0 + (E2 - Vn0)/Rx \qquad (16a)$$
$$= Vcc/R0 + Vcc/\{(1 + K) \times Rx\}$$

A monitoring voltage value Vx1 at the discharge end (time t=T2=T) is calculated by Expression (16b) using Expressions (13b) and (15a). However, in Expression (13b), the rapid charge/discharge resistance Rq is replaced with the charge/discharge resistance R0.

$$Vx1/(R0 // Rx) = (E1 - Vn0)/Rx \qquad (16b)$$
$$= VccK/\{(1 + K) \times Rx\}$$

Therefore, a deviation voltage Vx2−Vx1 is calculated by Expression (17) using Expressions (16a) and (16b).

$$Vx2 - Vx1 = (R0//Rx)[Vcc/R0 + (Vcc/Rx)(1-K)/(1+K)] \qquad (17)$$

In this case, when the threshold voltage coefficient γ is set to (Vx2−Vx1)/Vcc, the leakage resistance coefficient β is set to Rx/R0, and a reference time coefficient α0 is set to T/(R0× C), Expression (17) becomes a simplified expression without unit as in Expression (18).

$$\gamma = \{\beta + (1-K)/(1+K)\}/(1+\beta) \qquad (18)$$

where $K = \exp[-T/\{(R0 + Rx)C\}] = \exp\{-\alpha 0/(1+\beta)\}$

Figure 29:
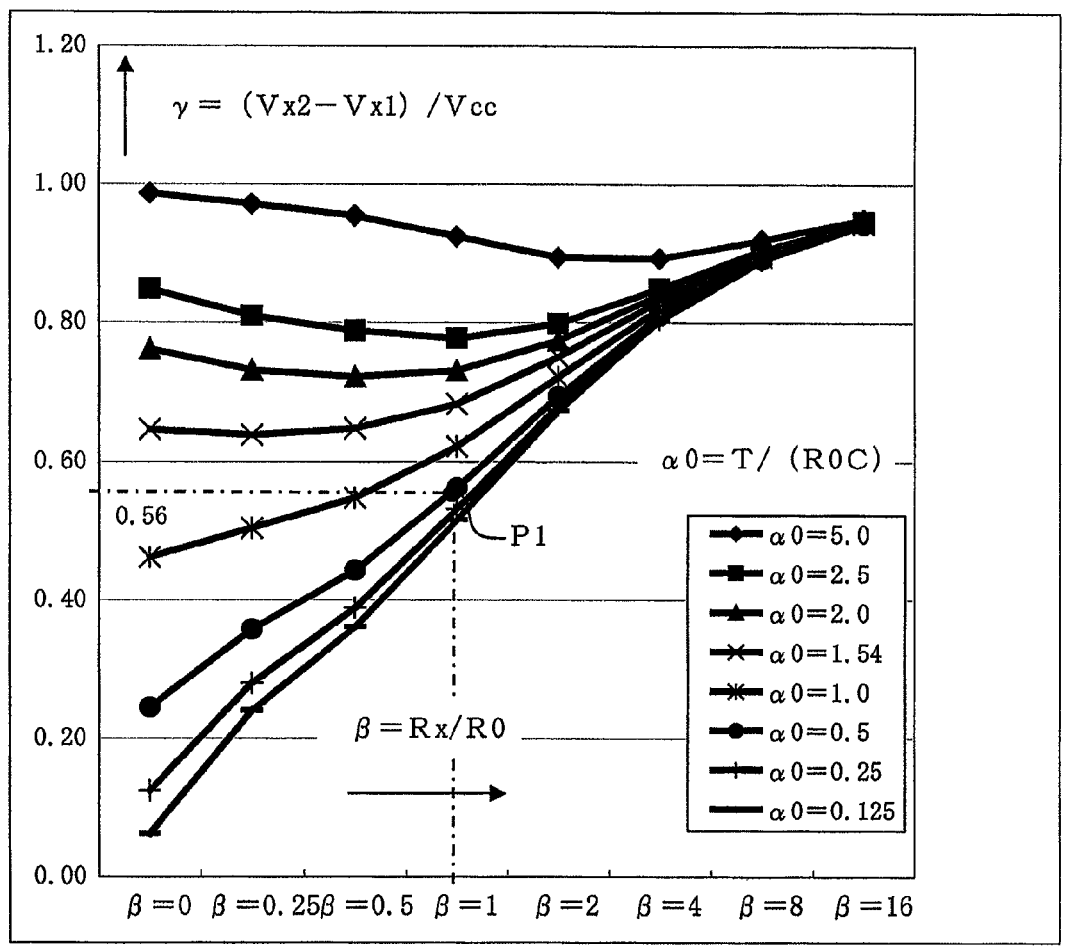
FIG. 29 is a full-range characteristics chart for describing the operation of the device of FIG. 28.

This is Expression III shown at the top of FIG. 29.

In the Case of First Embodiment

In FIGS. 1 and 2, at the charge start time t=0, V1=Vx1=0 and V2=Vx2 are established. At the time Tx=0 to T1, if the value of Vx becomes equal to the set threshold voltage V0, Expression (19) for the time t=Tx is calculated from Expression (12a). Note that, rapid discharge is performed in the discharge period, and hence E1=Vn0 is established and Kx=exp(−Tx/τ1) is established.

$$Ex = Vn0\exp(-Tx/\tau 1) + (Vcc + Vn0)\{1 - \exp(-Tx/\tau 1)\} \quad (19)$$
$$= Vcc(1 - Kx) + Vn0$$

Expression (20) is obtained from Expressions (13a) and (19).

$$V0/(R0 // Rx) = Vcc/R0 + (Ex - Vn0)/Rx \quad (20)$$
$$= Vcc/R0 + Vcc(1 - Kx)/Rx$$

Then, the threshold voltage coefficient γ of V0/Vcc, the leakage resistance coefficient β of Rx/R0, and the transition time coefficient α of Tx/(R0C) are substituted into Expression (20), and Expression (21) is obtained.

$$\gamma = (1+\beta - Kx)/(1+\beta)$$
$$\therefore Kx = (1+\beta) \times (1-\gamma) \quad (21)$$

Kx=exp[−Tx/{(R0+Rx)C}]=exp{−α/(1+β)} is established, and hence Expression (22) is obtained through natural logarithm conversion.

$$\alpha = (1+\beta)\text{LOG } e(1/Kx) \quad (22)$$

Expressions (21) and (22) correspond to Expression I shown at the top of FIG. 3.

Next, the action and operation of the device of FIG. 1 are described in detail with reference to operation explanatory flowcharts illustrated in FIGS. 6 and 7. In the first flowchart of FIG. 6, Step 1600 is a step in which the microprocessor 21 starts the operation of detecting the leakage resistance Rx, and subsequent Step 1600a is a determination step of determining whether the current operation is the first operation after the low voltage power supply switch 12 has been closed. In the case of the first cycle, it is determined to be YES and the flow proceeds to Step 1600b. In the case of a continuous cyclic cycle, it is determined to be NO and the flow proceeds to Step 1601.

Step 1600b is an initialization step in which the current value of a counter or timer to be described below is set to 0. Subsequent Step 1601 is a step in which a ring counter that periodically counts a clock signal starts its counting operation. Subsequent Step 1602 is a determination step in which, when the current value of the ring counter counted in Step 1601 is in the first-half range, it is determined to be YES and the flow proceeds to Step 1603a, and when the current value is in the second-half range, it is determined to be NO and the flow proceeds to Step 1603b.

Step 1603a is a step in which the output logic of the repetitive command signal PLS is set to "H". Step 1603b is a step in which the output logic of the repetitive command signal PLS is set to "L". A step block 1604 including Steps 1601 to 1603b is repetitive command signal generation means.

Step 1605, which is executed after Step 1603a or Step 1603b, is a determination step of determining whether the logic of the inverted logic signal HIG input to the microprocessor 21 has changed or not. When the logic has changed in the period of one cycle of the repetitive command signal PLS, it is determined to be YES and the flow proceeds to Step 1606c. When the logic has not changed, it is determined to be NO and the flow proceeds to Step 1606a. The determination of YES in Step 1605 indicates that the value of the monitoring voltage Vx is in the proper range of 0 to Vcc and has increased or decreased to exceed the set threshold voltage V0.

In Step 1606c, a timer 0 that has been activated in Step 1606a to be described below is initialized, and the flow proceeds to a step block 1700 of FIG. 7 via a relay terminal A. In Step 1606a, the timer 0 for transient abnormality determination starts its counting operation, and the flow proceeds to Step 1606b. Step 1606b is a step serving as transient abnormality determination means, in which the current value of the timer 0 that has started the counting in Step 1606a is read out to determine whether a predetermined time period has elapsed or not. When the logic of the inverted logic signal HIG remains unchanged even after the predetermined time period has elapsed, it is determined to be YES and the flow proceeds to Step 1607a. When the logic has changed within the predetermined time period, it is determined to be NO and the flow proceeds to Step 1607b.

Step 1607a is transient characteristics abnormality processing means. For example, if the power supply voltage Vh of the high voltage DC power source 61 has abruptly changed or if the positive-side leakage resistance 65 or the negative-side leakage resistance 66 has changed to abruptly change the potential of the negative-side power supply line 67 of the on-board high voltage device 61 relative to the vehicle body at the connection point B of the coupling capacitor 51, then the potential of the measurement point A transiently becomes equal to or lower than the vehicle body potential (0 volts) or equal to or higher than the control power supply voltage Vcc, and the coupling capacitor 51 is charged or discharged by the bypass diode 36 or the bypass diode 37. In this case, when a transient charge/discharge time during which the monitoring voltage Vx corresponding to the voltage of the measurement point A returns to the proper range of 0 to Vcc for measuring the leakage resistance Rx has elapsed, it is determined to be transient characteristics abnormality ERR2, and system abnormality alarming (not shown) is performed, followed by transition to a retract operation mode (limp home operation).

Note that, in the case where it is predicted that the vehicle state signal 18 changes and the monitoring voltage Vx deviates from the proper range temporarily, the determination of the transient characteristics abnormality ERR2 is avoided at least for a predetermined time period.

Note that, in the case where there occurs no system abnormality, such as the decrease in internal leakage resistance by degradation of the coupling capacitor 51, the disconnection of other wirings, and the short-circuit, the maximum value of the transient charge/discharge time is shorter than the predetermined determination time period in Step 1606b. In the normal case, it is determined to be NO in Step 1606b and the flow proceeds to Step 1607b.

Step 1607b is performed in the case where it is determined to be NO in Step 1605 and it is determined in Step 1606b that the logic has changed in the predetermined time period. In Step 1607b, the calculation of the leakage resistance shown in FIG. 7 is suspended. The flow proceeds to Step 1608 via Step 1607a or Step 1607b, or via a relay terminal B shown in FIG. 7.

Step 1608 is a determination step of determining whether the current timing is in a period of retracting and saving the value of the leakage resistance Rx calculated in a step to be described below or abnormality occurrence information in the non-volatile data memory 23. For example, when the current timing is in the delayed feed period in which the manual power supply switch (not shown) is opened and then the low voltage power supply switch 12 is interrupted, it is determined to be YES and the flow proceeds to Step 1609a. When the current timing is not in the retracting period, it is determined to be NO and the flow proceeds to an operation finish step 1610. Note that, in Step 1608, the determination of YES may be performed periodically at a predetermined time interval.

In Step 1609*a*, moving average values of the leakage resistance Rx calculated in Step 1706 to be described below are sequentially written and saved while updating the address of the non-volatile data memory 23. In subsequent Step 1609*b*, based on determination information on the transient characteristics abnormality ERR2 written in the RAM memory 22 in Step 1607*a* or based on the abnormality occurrence information determined in Step 1709 to be described below, the accumulated number of abnormality occurrence in accordance with the type of the abnormality occurrence is updated and then written and saved in a predetermined address of the non-volatile data memory 23. After that, the flow proceeds to the operation finish step 1610.

In the operation finish step 1610, the microprocessor 21 executes another control program, and the flow proceeds to the operation start step 1600 again after a standby time of 10 msec, for example. Therefore, immediately after the start of the operation and in the state in which the initial charge of the coupling capacitor 51 has not been performed, the microprocessor 21 executes the steps in the first cycle in the order of Step 1600, Step 1600*a* (determination of YES), Step 1600*b*, the step block 1604, Step 1605 (determination of NO), Step 1606*a*, Step 1606*b* (determination of NO), Step 1607*b*, Step 1608 (determination of NO), Step 1610, and Step 1600 after a standby time of 10 msec. In the next and subsequent cycles, the microprocessor 21 executes a series of the flow in a cyclic manner in the state in which the determination of Step 1600*a* is NO and Step 1600*b* is not executed.

In the process, when the inversion operation of the inverted logic signal HIG is detected in Step 1605, it is determined to be YES and the flow proceeds to Step 1701 to be described below. On the other hand, in a period of time in which it is determined to be NO in Step 1605 and the predetermined time has not been reached in Step 1606*b*, the steps are executed in the order of Step 1607*b*, Step 1608 (determination of NO), and Step 1610 and the cyclic operation is continued. Then, when it is determined to be YES in Step 1606*b*, Step 1607*a* is executed.

Referring to the second flowchart of FIG. 7, Step 1700 is a step block equivalent to Steps 2700*a* to 2700*c* to be described with reference to FIG. 11. Step 1700 is calibration means at shipment, for measuring the value of the electrostatic capacitance C of the coupling capacitor 51 at the time of shipment adjustment and storing a calibrated value thereof.

Subsequent Step 1701 is a determination step. In a period in which the repetitive command signal PLS whose logic level is "L" is generated in Step 1603*b* of FIG. 6 so that the transistor serving as the charge/discharge switching element 31 is interrupted to slowly charge the coupling capacitor 51 via the charge/discharge resistors 33 and 35, it is determined to be YES and the flow proceeds to Step 1702. In a period in which the repetitive command signal PLS whose logic level is "H" is generated in Step 1603*a* of FIG. 6 so that the transistor serving as the charge/discharge switching element 31 becomes conductive to rapidly discharge the coupling capacitor 51 via the charge/discharge resistor 35, it is determined to be NO and the flow proceeds to Step 1608 of FIG. 6 via the relay terminal B.

In Step 1702, a timer 1 for measuring the transition time Tx is activated to start the counting operation, and the flow proceeds to Step 1703. Step 1703 is a determination step of determining whether the logic level of the inverted logic signal HIG has changed from "L" to "H". When the logic level is "H", it is determined to be YES and the flow proceeds to Step 1704*a*. When the logic level is "L", it is determined to be NO and the flow proceeds to Step 1704*b*.

In Step 1704*a*, the current value of the timer 1 that has been activated to start the counting in Step 1702 is read out and stored in the RAM memory 22. Subsequent Step 1705 is a step serving as leakage resistance calculation means for calculating the leakage resistance Rx based on the value of the transition time Tx read out and stored in Step 1704*a*.

In subsequent Step 1706, the current value of the leakage resistance Rx calculated in Step 1705 is input to the first stage of the shifter (shift register) formed by the RAM memory 22, and pieces of past data stored in the shift register are migrated sequentially to the subsequent stage. The past data of the leakage resistance Rx stored at the last stage is delivered and erased, and the sum of the values of the leakage resistance Rx left in the shift register is divided by the stored number of values in the shift register, to thereby calculate the moving average value. In this manner, the measurement can be prevented from being directly affected by a temporal measurement error of the leakage resistance Rx caused by the temporal fluctuations in power supply voltage Vh of the high voltage DC power source 61 or noise, for example.

Subsequent Step 1707*a* is a step serving as resistance abnormality determination means. When the moving average value of the leakage resistance Rx calculated in Step 1706 becomes equal to or smaller than the preliminary leakage resistance Rxn or the limit leakage resistance Rx0, it is determined to be YES and the flow proceeds to Step 1709. When there is no abnormality, it is determined to be NO and the flow proceeds to Step 1708.

Figure 6:
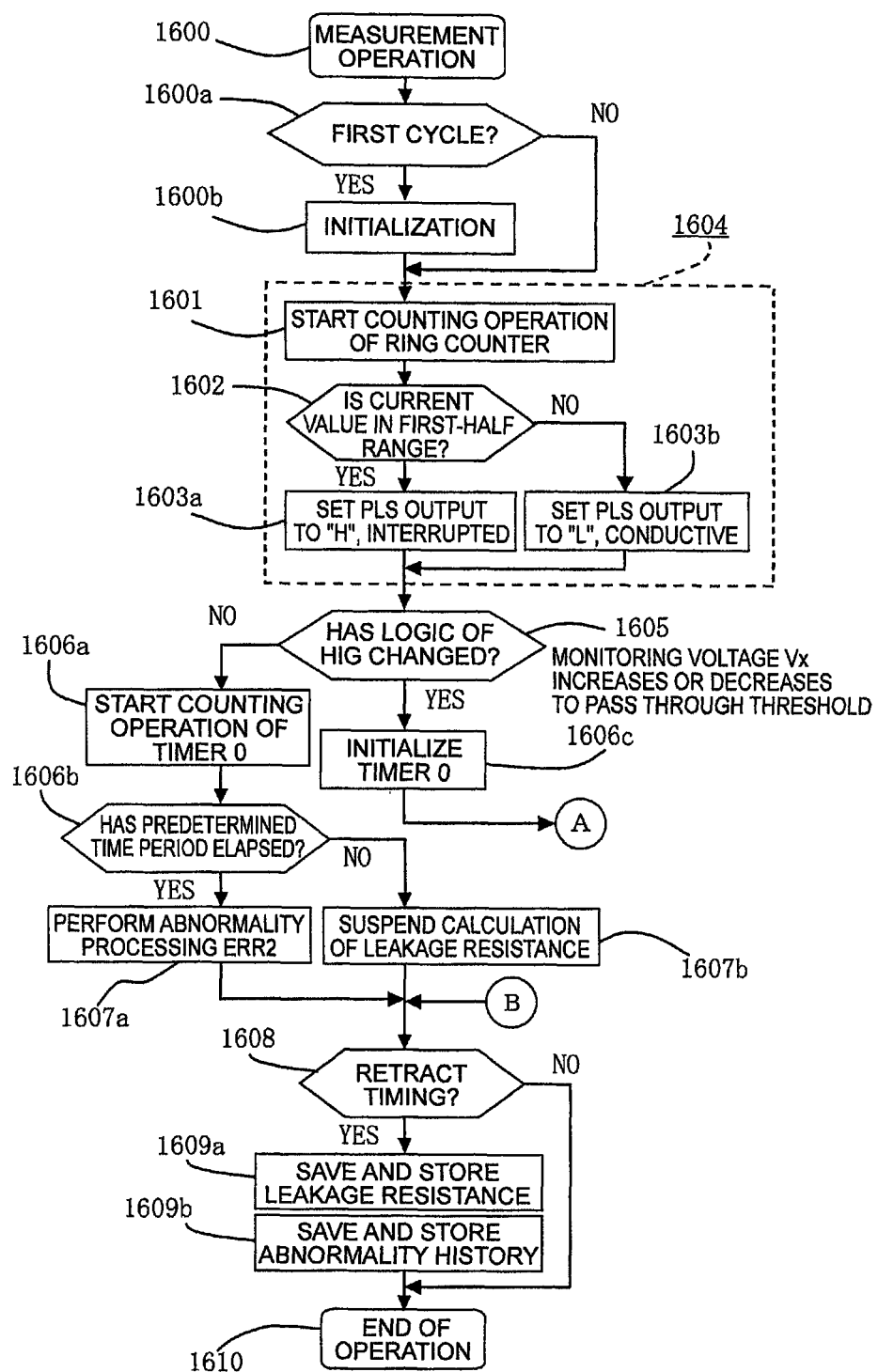
FIG. 6 is a first flowchart for describing the operation of the device of FIG. 1.
Figure 7:
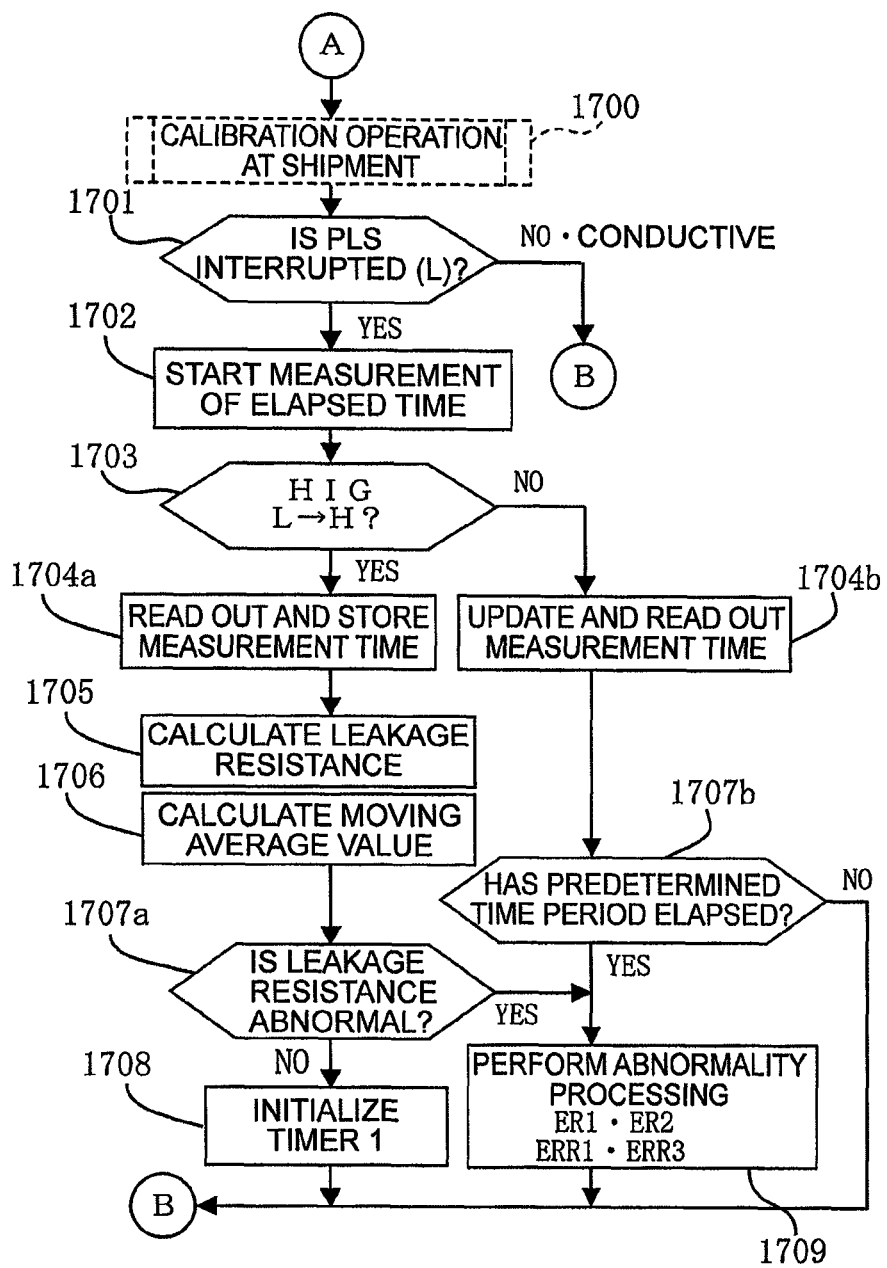
FIG. 7 is a second flowchart for describing the operation of the device of FIG. 1.

Note that, in the case where there is a difference of a predetermined value or more between the moving average value of the leakage resistance Rx calculated in Step 1706 and the past moving average value stored in the non-volatile data memory 23 in Step 1609*a* of FIG. 6, and where it is recognized that the leakage resistance Rx has abruptly decreased, if not to the preliminary leakage resistance Rx0, it is determined to be YES in Step 1707*a* and the flow proceeds to Step 1709. Step 1708 is a step in which the timer 1 that has been activated in Step 1702 is initialized and suspended, and the flow proceeds to Step 1608 of FIG. 6 via the relay terminal B.

Step 1704*b* is performed in the case where it is determined to be NO in Step 1703. In Step 1704*b*, in order to measure the elapsed time from when the logic level of the repetitive command signal PLS has changed to "L" to when the logic level of the inverted logic signal HIG changes to "H", the current value of the timer 1 that has been activated in Step 1702 is updated and readout. Subsequent Step 1707*b* is a step serving as timeout abnormality determination means. When the elapsed time that has been read out and stored in Step 1704*b* is excessive and exceeds a predetermined time period, it is determined to be YES and the flow proceeds to Step 1709. When the elapsed time is within the predetermined time period, it is determined to be NO and the flow proceeds to Step 1608 of FIG. 6 via the relay terminal B.

Step 1709 is a step serving as measurement abnormality processing means. When it is determined to be YES in Step 1707*a*, the measurement abnormality processing means generates the pre-alarm output ER2 or the resistance abnormality determination output ER1, and stores abnormality determination information on state change abnormality ERR3. When it is determined to be YES in Step 1707*b*, the measurement abnormality processing means stores abnormality determination information on timeout abnormality determination ERR1. After Step 1709, the flow proceeds to Step 1608 of FIG. 6 via the relay terminal B.

In Step 1709, when the pre-alarm output ER2 or the resistance abnormality determination output ER1 is generated, the abnormality alarm device 19 is activated. When the abnormality determination information on the timeout abnormality determination ERR1 or the state change abnormality ERR3 is stored, the stored abnormality determination information is separated from other abnormality information. In Step 1609*b* of FIG. 6, the accumulated number of the abnormality occurrence is written and saved in the non-volatile data memory 23, which is utilized for maintenance and inspection operation.

Note that, the calculation of the leakage resistance Rx in Step 1705 is performed in three manners. First, the calculation is performed based on the characteristics curve whose whole region is the negative-gradient curve region as represented by the curve 103 of FIG. 3. Second, the calculation is performed by using the negative-gradient curve region of a bell-shaped curve as represented by the curve 112 of FIG. 3. Third, the calculation is performed by using the positive-gradient curve region of a bell-shaped curve as represented by the curve 113 of FIG. 3. In any case, the value of the leakage resistance Rx is calculated from the measured value of the transition time Tx based on a function formula or a data table between the transition time coefficient $\alpha$ and the leakage resistance coefficient $\beta$ with the use of the threshold voltage coefficient $\gamma$ as a parameter.

As an alternative abnormality determination method, instead of comparing the detected leakage resistance Rx with the preliminary leakage resistance Rxn or the limit leakage resistance Rx0, the preliminary transition time Txn or the limit transition time Tx0 corresponding to the preliminary leakage resistance Rxn or the limit leakage resistance Rx0 may be calculated in advance, and the actual transition time Tx may be compared with the preliminary transition time Txn or the limit transition time Tx0.

Further, in the case where the value of the reference time constant R0×C, which is the denominator of the transition time coefficient $\alpha$, the value of the series resistance R0, which is the denominator of the leakage resistance coefficient $\beta$, or the value of the threshold voltage coefficient $\gamma$ is treated as a fixed value, a formula or a data table between the transition time Tx and the leakage resistance Rx may be directly used as the function formula or the data table. In this case, the leakage resistance Rx can be calculated directly from the measured transition time Tx without performing complicated calculation processing during the operation.

However, in the case of varying the value of the threshold voltage coefficient $\gamma$, the denominator value of the transition time coefficient $\alpha$, or the denominator value of the leakage resistance coefficient $\beta$ in accordance with the applied types of vehicle or the operating state, it is advantageous to set the function formula or the data table using $\alpha$, $\beta$, or $\gamma$, which are index values without unit. Alternatively, in the case where the arithmetic control circuit 20A has a built-in multi-channel AD converter, and the number of analog input ports is sufficient, an operational amplifier may be used instead of the comparator 41, and an analog signal voltage proportional to the monitoring voltage Vx may be input to the arithmetic control circuit 20A so that the microprocessor 21 generates a signal equivalent to the inverted logic signal HIG. In addition, in the first embodiment of FIG. 1, the connection point B is connected to the negative-side power supply line 67 of the on-board high voltage device 60X, but, even when the connection point B is connected to a positive-side power supply line, no change occurs in Expression I.

As is clear from the above description, according to the first embodiment of the present invention, there is provided the leakage resistance detection device 50A for an on-board high voltage device, which is connectable to the on-board high voltage device 60X including the on-board high voltage DC power source 61 and the high voltage electric load 64 to be fed and driven by the on-board high voltage DC power source 61, the on-board high voltage device 60X having the leakage resistance Rx with respect to the vehicle body 11, as typified by the equivalent leakage resistance 65 on the positive potential side and the equivalent leakage resistance 66 on the negative potential side, the leakage resistance detection device 50A including the constant voltage control power source 25 which is fed and driven by the low voltage DC power source 10 having the negative terminal connected to the vehicle body 11 and which generates the control power supply voltage Vcc, the leakage resistance detection device 50A being configured to measure a value of the leakage resistance Rx via the coupling capacitor 51 having one terminal B connected to a predetermined position of the on-board high voltage device 60X, the leakage resistance detection device 50A further including the repetitive signal output circuit 30A, the monitoring signal processing circuit 40A, and the arithmetic control circuit 20A, the arithmetic control circuit 20A including the microprocessor 21 and the program memory 24A which cooperate with each other.

Further, the repetitive signal output circuit 30A alternately repeats, in response to the switching operation of the charge/discharge switching element 31 that operates in response to the repetitive command signal PLS, a charge period and a discharge period in which the measurement point A is intermittently connected to the control power supply voltage Vcc via the charge/discharge resistor 33 or 35, the measurement point A being another terminal of the coupling capacitor 51, to thereby gradually increase or gradually decrease the monitoring voltage Vx which is a potential between the measurement point A and the vehicle body 11. The monitoring signal processing circuit 40A is configured to: generate the inverted logic signal HIG when a value of the monitoring voltage Vx, which gradually increases or gradually decreases at a gradient that becomes gentler as a charge/discharge time constant becomes larger, passes through a predetermined threshold voltage, and input the inverted logic signal HIG to the arithmetic control circuit 20A; or generate the analog signal voltage ANL proportional to the monitoring voltage Vx and input the analog signal voltage ANL to the arithmetic control circuit 20A. The arithmetic control circuit 20A is configured to: measure the transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance 65 on the positive potential side and the equivalent leakage resistance 66 on the negative potential side, based on a function formula or a data table relating to the transition time Tx and the leakage resistance Rx; and generate the resistance abnormality determination output ER1 when the leakage resistance Rx becomes equal to or smaller than the predetermined limit leakage resistance Rx0 or when the transition time Tx reaches the limit transition time Tx0 corresponding to the predetermined limit leakage resistance Rx0. The repetitive command signal PLS is a pulse signal with a fixed cycle having the charge period or the discharge period longer than at least the limit transition time Tx0.

The charge/discharge resistor includes the reference resistor 33 having the resistance value Rs and the rapid charge/discharge resistor 35 having the resistance value Rq which is sufficiently smaller than the resistance value Rs, and the rapid charge/discharge resistor 35 is connected to a negative terminal and a positive terminal of the constant voltage control power source 25 via the pair of bypass diodes 36 and 37. The reference resistor is connected in series to the leakage resistance Rx as a charge/discharge resistor for the coupling capacitor 51 when the arithmetic control circuit 20A measures the transition time Tx of the gradually-increasing monitoring voltage Vx or the gradually-decreasing monitoring voltage Vx, and the reference resistor 33 is removed when a potential of the monitoring voltage Vx relative to the vehicle body has changed to be one of 0 volts or lower and the control power supply voltage Vcc or higher due to an abrupt change of a power supply voltage of the high voltage DC power source 61 or an abrupt change of the equivalent leakage resistance 65 on the positive potential side or the equivalent leakage resistance 66 on the negative potential side because the high voltage power supply switch 62 for the high voltage electric load 64 is closed or opened, or because abnormality has occurred, so as to charge and discharge the coupling capacitor 51 via the rapid charge/discharge resistor 35 and the bypass diode 36 or the bypass diode 37 irrespective of an operating state of the charge/discharge switching element 31.

As described above, in connection with claim 2 of the present invention, the repetitive signal output circuit includes the reference resistor, which is connected in series to the coupling capacitor, and the rapid charge/discharge resistor having a resistance value sufficiently smaller than that of the reference resistor. When the potential of the coupling capacitor at the connection point relative to the vehicle body abruptly changes, the reference resistor is removed to charge/discharge the coupling capacitor.

Therefore, the charge/discharge time constant for the coupling capacitor in the abrupt change transient period has a value determined by the product of the sum of the rapid charge/discharge resistance and the leakage resistance and the electrostatic capacitance of the coupling capacitor. In particular, when the leakage resistance has reduced to approach the dangerous state, the coupling capacitor is quickly charged/discharged so that the monitoring voltage Vx may return to the proper range to be monitored. Thus, the measurement of the leakage resistance can be performed quickly, and an excessive current is suppressed by the rapid charge/discharge resistor.

The repetitive signal output circuit 30A is configured to, in response to the switching operation of the charge/discharge switching element 31, connect the measurement point A being the another terminal of the coupling capacitor 51 to the output terminal of the constant voltage control power source 25 via the reference resistor 33 having the reference value Rs, or connect the measurement point A to the negative terminal corresponding to a vehicle body potential via the rapid charge/discharge resistor 35 having the resistance value Rq which is sufficiently smaller than the resistance value Rs, to thereby gradually increase or rapidly decrease the monitoring voltage Vx which is the potential between the measurement point A and the vehicle body 11. The monitoring signal processing circuit 40A is configured to: generate the inverted logic signal HIG when the value of the monitoring voltage Vx, which gradually increases at a gradient that becomes gentler as the time constant (Rs+Rx)C being a product of a sum of the resistance value Rs (Rs>>Rq) and the leakage resistance Rx and the electrostatic capacitance C of the coupling capacitor 51 becomes larger, has increased to pass through the predetermined threshold voltage V0, and input the inverted logic signal HIG to the arithmetic control circuit 20A; or generate the analog signal voltage ANL proportional to the monitoring voltage Vx and input the analog signal voltage ANL to the arithmetic control circuit 20A. The arithmetic control circuit 20A inverts an output of the repetitive command signal PLS, which is a pulse train signal having a fixed cycle, in a state in which the value of the monitoring voltage Vx has abruptly decreased to approach 0 volts by the charge/discharge switching element 31, and inverts the output of the repetitive command signal PLS after receiving the inverted logic signal HIG as an input or after measuring, as the transition time Tx, a time period from when the inverted logic signal HIG is generated based on the input analog signal voltage ANL to when the inverted logic signal HIG is obtained.

As described above, in connection with claim 3 of the present invention, the repetitive signal output circuit charges and discharges the coupling capacitor, and the arithmetic control circuit measures, as the transition time Tx, a time period during which the monitoring voltage Vx increases to the predetermined threshold voltage V0 from one threshold voltage of 0 volts. Therefore, the comparator determination circuit or the comparator determination processing with respect to one of the pair of threshold voltages can be omitted, and the transition time can be measured by a simple structure.

As is clear from the above description, according to the first embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30A is represented by R0, and when a time period during which the monitoring voltage Vx increases gradually from a state of 0 to the predetermined threshold voltage V0 is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20A, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; selectively using a negative-gradient curve region following the positive-gradient curve region or a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region; determining, when the transition time Tx has become a value equal to or larger than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds a short-circuit transition time Tx00 corresponding to a case where the leakage resistance Rx becomes 0.

As described above, in connection with claim 8 of the present invention, in the characteristics curve using the threshold voltage coefficient γ proportional to the set threshold voltage as a parameter and showing the relationship between the leakage resistance coefficient β proportional to the leakage resistance Rx and the transition time coefficient α proportional to the transition time Tx, the negative-gradient curve region in which the transition time coefficient α decreases gradually along with the increase in leakage resistance coefficient β is used. When the measured transition time Tx has reached a value equal to or larger than the limit transition time Tx0 corresponding to the limit leakage resistance Rx0, it is determined that the leakage resistance Rx is too small and the resistance abnormality determination output ER1 is generated. When the transition time Tx exceeds the short-circuit transition time Tx00 at which the leakage resistance Rx is 0, the timeout abnormality determination ERR1 is performed.

Therefore, when the leakage resistance Rx is within the normal range, the measurement of the transition time Tx is completed in a short period of time, and the normal state is confirmed. When the transition time Tx becomes longer, the resistance abnormality determination output ER1 is generated. When the measurement of the transition time Tx has not been performed even after the short-circuit transition time Tx00 has been exceeded, the timeout abnormality determination ERR1 is performed. In this manner, some kind of determination result is obtained every time the repetitive command signal operates repetitively.

The characteristics curve has a negative-gradient curve region as a whole region, and a low threshold voltage coefficient γ is applied so that the characteristics curve contains no positive-gradient curve region. As described above, in connection with claim 9 of the present invention, the threshold voltage coefficient is low, and the characteristics curve to be applied has the negative-gradient curve region as the whole region. Therefore, the leakage resistance equal to or lower than the limit leakage resistance can be measured accurately, and the leakage resistance in the abnormal state including the short-circuit state can be measured. Thus, information effective for pursuing the cause of the abnormality occurrence can be obtained.

As is clear from the above description, according to the first embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30A is represented by R0, and when a time period during which the monitoring voltage Vx increases gradually from a state of 0 to the predetermined threshold voltage V0 is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20A, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; excluding in advance, by characteristics curve correction means, application of a negative-gradient curve region following the positive-gradient curve region; determining the threshold voltage coefficient γ so that a value of the transition time coefficient α when the value of the leakage resistance Rx has reached the limit leakage resistance Rx0 is included in the corrected positive-gradient curve region; determining, when the transition time Tx has become a value equal to or smaller than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds an open-circuit transition time Txm corresponding to a case where the leakage resistance Rx is infinite.

As described above, in connection with claim 10 of the present invention, in the characteristics curve using the threshold voltage coefficient γ proportional to the set threshold voltage as a parameter and showing the relationship between the leakage resistance coefficient β proportional to the leakage resistance Rx and the transition time coefficient α proportional to the transition time Tx, the corrected positive-gradient curve region in which the transition time coefficient α increases gradually along with the increase in leakage resistance coefficient β is used. When the measured transition time Tx has reached a value equal to or smaller than the limit transition time Tx0 corresponding to the limit leakage resistance Rx0, it is determined that the leakage resistance Rx is too small and the resistance abnormality determination output ER1 is generated. When the transition time Tx exceeds the open-circuit transition time Txm at which the leakage resistance Rx is infinite, the timeout abnormality determination is performed.

Therefore, when the leakage resistance Rx is within the abnormal range, the measurement of the transition time Tx is completed in a short period of time, and the resistance abnormality determination output ER1 is generated. The case where the transition time Tx becomes longer is determined as the normal state. When the measurement of the transition time Tx has not been performed even after the open-circuit transition time Txm has been exceeded, the timeout abnormality determination ERR1 is performed. In this manner, some kind of determination result is obtained every time the repetitive command signal operates repetitively.

The leakage resistance detection method further includes: connecting in advance, by the characteristics curve correction means, the bypass leakage resistor 53 between the connection point B between the coupling capacitor 51 and the on-board high voltage device 60X, and the vehicle body 11, the bypass leakage resistor 53 having the additional resistance R3 which is sufficiently larger than the limit leakage resistance Rx0; and suppressing, by the bypass leakage resistor, the value of the leakage resistance coefficient β when the leakage resistance Rx is infinite to R3/R0, to thereby prevent the transition time coefficient α from being excessive.

As described above, in connection with claim 11 of the present invention, the bypass leakage resistor is used in order that, in the characteristics curve of the transition time coefficient α relative to the leakage resistance coefficient β having the positive-gradient curve region, the positive-gradient characteristics curve may avoid being a negative-gradient curve along with the increase in leakage resistance coefficient β.

Therefore, it is possible to prevent two kinds of large and small values of the leakage resistance Rx from being calculated for the measured transition time Tx, and is possible to measure the value of the leakage resistance Rx varying in a wide range.

The leakage resistance detection device further includes the bypass leakage resistor 53, which is connected between the connection point B between the coupling capacitor 51 and the on-board high voltage device 60X, and the vehicle body 11. The leakage resistance detection method further includes measuring, by the arithmetic control circuit 20A, the leakage resistance Rx in a state in which the coupling capacitor 51 and the on-board high voltage device 60X are not connected to each other, and calibrating and storing the value of the electrostatic capacitance C of the coupling capacitor 51 so that an obtained result becomes the additional resistance R3 of the bypass leakage resistor 53.

As described above, in connection with claim 12 of the present invention, the value of the electrostatic capacitance C of the coupling capacitor is back-calculated with the use of the bypass leakage resistor having a known resistance value.

Therefore, it is possible to suppress the occurrence of a calculation error of the leakage resistance caused by the influence of individual fluctuations in electrostatic capacitance, and is possible to reduce a calculation error of the leakage resistance by suppressing the fluctuation range of the leakage resistance coefficient $\beta$.

The leakage resistance detection method further includes, by the arithmetic control circuit 20A: measuring, in response to the inverted logic signal HIG or the analog signal voltage ANL that operates in response to the monitoring voltage Vx input from the monitoring signal processing circuit 40A, a time period during which the monitoring voltage Vx deviates from a proper voltage range determined by one threshold voltage and another threshold voltage for measuring the transition time Tx; and interrupting the measurement of the leakage resistance Rx when the measured time period is within a predetermined permissible determination time period, and determining the transient characteristics abnormality ERR2 when the measured time period exceeds a predetermined abnormality determination time period.

As described above, in connection with claim 13 of the present invention, the arithmetic control circuit suspends the measurement of the leakage resistance in a predetermined time period in which the monitoring voltage Vx is outside the proper voltage range, and after the lapse of the predetermined time period, the arithmetic control circuit performs transient characteristics abnormality determination.

Therefore, in the case where the power supply voltage of the high voltage DC power source abruptly changes or the leakage resistance abruptly changes in response to the connection or interruption of the high voltage electric load, it is possible to prevent the incorrect calculation of the leakage resistance, and is possible to detect the occurrence of system abnormality including a problem that the leakage resistance inside the coupling capacitor has reduced.

The leakage resistance detection method further includes: inputting the vehicle state signal 18 to the arithmetic control circuit 20A, the vehicle state signal 18 being a signal for identifying occurrence of a state responsible for fluctuations in vehicle body potential at a connection point between the coupling capacitor 51 and the on-board high voltage device 60X; and detecting, by the arithmetic control circuit 20A, a change in state of the vehicle state signal 18 to predict an abrupt change in leakage resistance, and avoiding the determination of the transient characteristics abnormality immediately after the change in state of the vehicle state signal 18.

As described above, in connection with claim 14 of the present invention, the arithmetic control circuit receives the vehicle state signal used for predicting the abrupt change of the leakage resistance as an input, and neglects the transient characteristics abnormality immediately after the state of the vehicle state signal has changed.

Therefore, the occurrence of system abnormality, which never occurs in the normal case, can be detected due to the occurrence of the transient characteristics abnormality.

The leakage resistance detection method further includes: causing the non-volatile data memory 23, which is a partial region of the program memory 24A or a memory provided together with the program memory 24A, to: write and save in advance a data table relating to a characteristics curve of the transition time coefficient $\alpha$ of Tx/(R0C) relative to the leakage resistance coefficient $\beta$ of Rx/R0 using the threshold voltage coefficient $\gamma$ of V0/Vcc as a parameter, and a value of the threshold voltage coefficient $\gamma$, values of the reference resistance Rs and the rapid charge/discharge resistance Rq that determine the value of the series resistance R0, a value of the electrostatic capacitance C, a value of the limit leakage resistance Rx0, and a value of the preliminary leakage resistance Rxn to be preliminary informed; and write and save the value of the leakage resistance Rx which is measured during operation and abnormality occurrence history information periodically or immediately before stop of the operation; and reading out, by the arithmetic control circuit 20A, the value of the leakage resistance coefficient $\beta$ from the data table in correspondence with the transition time coefficient $\alpha$ calculated from the actually measured transition time Tx, to thereby calculate a current leakage resistance Rx, and comparing the current leakage resistance Rx with the value of the limit leakage resistance Rx0 or the value of the preliminary leakage resistance Rxn, to thereby generate the pre-alarm output ER2 in addition to the resistance abnormality determination output ER1 or perform determination of the state change abnormality ERR3 when the leakage resistance has abruptly decreased in a time series.

As described above, in connection with claim 15 of the present invention, in the non-volatile data memory, the data table for measuring the leakage resistance and the basic data for performing abnormality determination are written and saved, and the generation of the pre-alarm output in addition to the resistance abnormality determination output or the determination of the state change abnormality is performed.

Therefore, in the case where the leakage resistance has decreased gradually by aging degradation of electrical insulation or the leakage resistance has decreased abruptly by an immersion accident or the like, it is possible to urge maintenance and inspection before the leakage resistance reduces to the limit leakage resistance.

Second Embodiment

Figure 8:
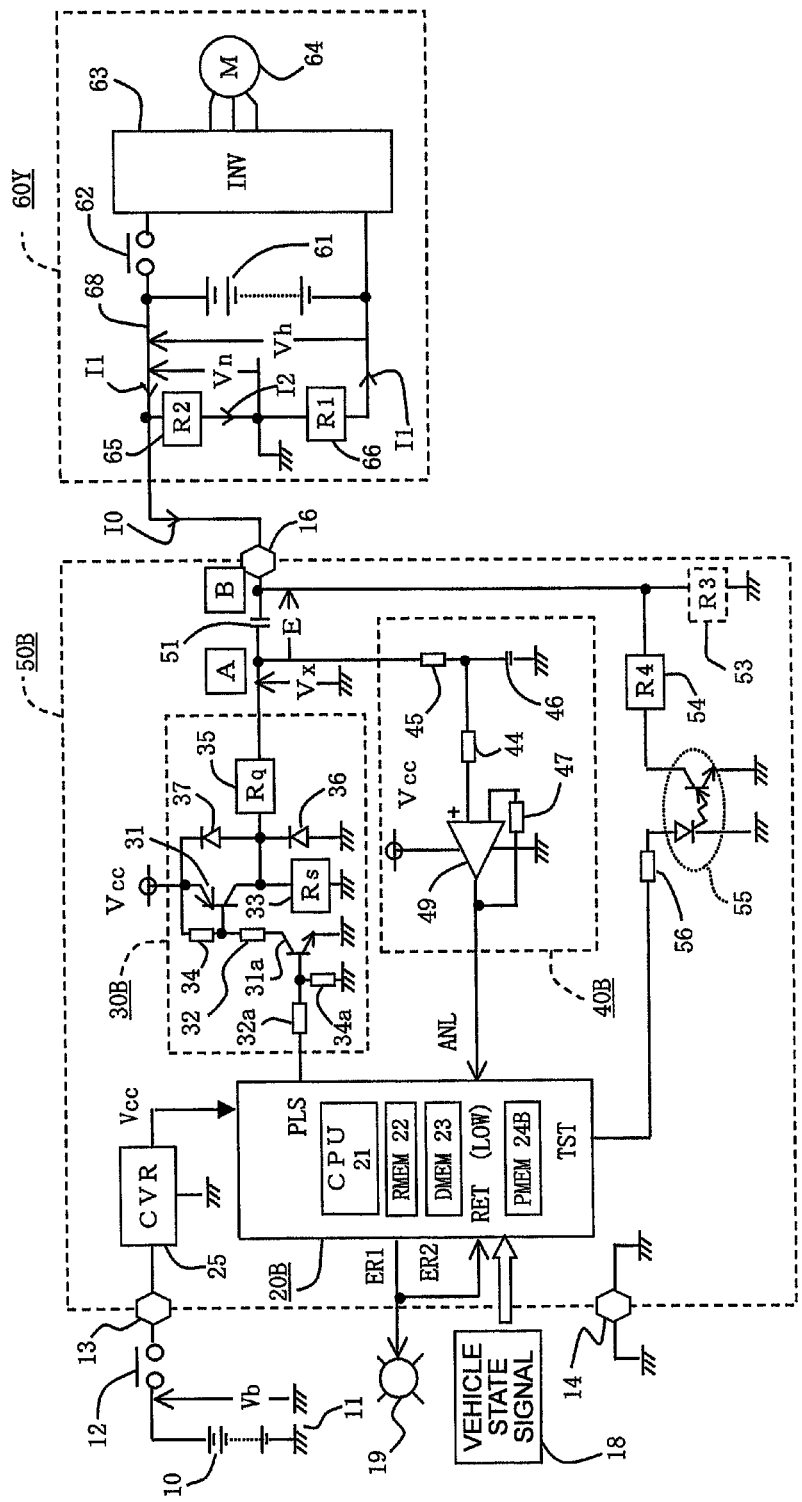
FIG. 8 is an overall configuration diagram of a device according to a second embodiment of the present invention.

Referring to FIG. 8 which is an overall configuration diagram of a device according to a second embodiment of the present invention, the differences from FIG. 1 are mainly described below. In the drawings, the same reference symbols denote the same or equivalent parts. In FIG. 8, a leakage resistance detection device 50B includes an arithmetic control circuit 20B, a repetitive signal output circuit 30B, and a monitoring signal processing circuit 40B, and detects a leakage resistance of an on-board high voltage device 60Y.

The first main difference is that, in the on-board high voltage device 60Y, a positive-side power supply line 68 is connected to one terminal B of the coupling capacitor 51 via the interconnection terminal 16, and the positive-side equivalent leakage resistor 65 has an equivalent leakage resistance R2 on the interconnection side while the negative-side equivalent leakage resistor 66 has an equivalent leakage resistance R1 on the non-interconnection side.

The second main difference is that the repetitive signal output circuit 30B includes a charge/discharge switching element 31 such as a PNP transistor, and when the output logic level of the repetitive command signal PLS is "H", an auxiliary switching element 31a becomes conductive via an auxiliary drive resistor 32a so that the charge/discharge switching element 31 becomes conductive via the drive resistor 32, and when the output logic level of the repetitive command signal PLS is "L", the auxiliary switching element 31a becomes non-conductive by an auxiliary stabilizing resistor 34a so that the charge/discharge switching element 31 becomes non-conductive by an open-circuit stabilizing resistor 34.

The coupling capacitor 51 is charged by a voltage Vn across the equivalent leakage resistor R2 (both-end voltage Vn), and the value of the both-end voltage Vn is expressed by Expression (4y).

$$I1=(Vh-Vn)/R1 \quad (1y)=(1x)$$

$$I2=Vn/R2 \quad (2y)=(2x)$$

$$I1=I0+I2 \quad (3y)=(3x)$$

$$Vn=Vn0-I0 \times Rx \quad (4y)=(4x)$$

where $Vn0=Vh \times R2/(R1+R2)=Vh \times Rx/R1$ $Rx=R1 \times R2/(R1+R2)$

In the expressions, I1 represents a current flowing through the equivalent leakage resistor R1 in the illustrated direction, I2 represents a current flowing through the equivalent leakage resistor R2 in the illustrated direction, I0 represents a current flowing into the interconnection terminal 16 in the illustrated direction, Rx represents a combined leakage resistance value, and Vn0 represents the value of Vn when I0 is 0 (stable divided voltage).

When the electrostatic capacitance of the coupling capacitor 51 is represented by C, a voltage across the coupling capacitor 51 (both-end voltage) is represented by E, and a monitoring voltage is represented by Vx, Expressions (5y) and (6y) are established.

$$C \times (dE/dt)=I0 \quad (5y)=(5x)$$

$$E=Vn-Vx \quad (6y) \neq (6x)$$

Expressions (4y) and (5y) are substituted into Expression (6y) to obtain Expression (7y).

$$Vn0-Vx=E+C \times Rx(dE/dt) \quad (7y) \neq (7x)$$

Therefore, when the transistor serving as the charge/discharge switching element 31 becomes conductive continuously, the charge voltage E of the coupling capacitor 51 decreases to Vn0−Vcc, and when the transistor is interrupted continuously, the charge voltage E of the coupling capacitor 51 increases to Vn0. Thus, the concept for charge/discharge is opposite to the case of FIG. 1, and discharge is performed when the transistor is conductive and charge is performed when the transistor is interrupted.

The third main difference is that the monitoring signal processing circuit 40B uses an operational amplifier 49 connected to a negative feedback resistor 47 instead of using the comparator 41. The operational amplifier 49 generates an analog signal voltage ANL proportional to the monitoring voltage Vx instead of generating the inverted logic signal HIG, and outputs the analog signal voltage ANL to the arithmetic control circuit 20B.

The arithmetic control circuit 20B generates a repetitive command signal PLS, which is a pulse train signal having a fixed cycle, and outputs the repetitive command signal PLS to the repetitive signal output circuit 30B. The repetitive command signal PLS is described below with reference to FIG. 9. When the value of the monitoring voltage Vx reaches (Vcc−V0) or less obtained by subtracting the set threshold voltage V0 from the control power supply voltage Vcc, a microprocessor 21 cooperates with a program memory 24B to generate an inverted logic signal LOW inside the arithmetic control circuit 20B, based on the analog signal voltage ANL obtained from the monitoring signal processing circuit 40B.

Further, the arithmetic control circuit 20B generates a pre-alarm output ER2 when the measured value of the leakage resistance Rx becomes equal to or smaller than a predetermined preliminary leakage resistance Rxn, and generates a resistance abnormality determination output ER1 when the measured value of the leakage resistance Rx becomes equal to or smaller than a limit leakage resistance Rx0. The resistance abnormality determination output ER1 and the pre-alarm output ER2 are output to the abnormality alarm device 19, and fed back to be input to the arithmetic control circuit 20B as a report command acknowledge signal RET so as to check whether the output for abnormality alarming has been generated correctly.

The fourth main difference is that a series circuit of a test leakage resistor 54 and a test switching element 55 is connected between the interconnection terminal 16 and the vehicle body 11. The test switching element 55, such as an optical isolation transistor, receives a conduction command via a drive resistor 56 from a test operation command TST provided to the arithmetic control circuit 20B. A test resistance R4 which is a resistance value of the test leakage resistor 54 is equal to, for example, the limit leakage resistance Rx0 or the preliminary leakage resistance Rxn. The test switching element 55 becomes conductive temporarily at the start of operation immediately after the manual power supply switch (not shown) is closed and the low voltage power supply switch 12 is closed.

In this way, pre-operation inspection is performed to check whether detection control of the leakage resistance is performed correctly or not, and it is also possible to detect individual fluctuations in electrostatic capacitance C of the coupling capacitor 51 and the secular change thereof so that the calibrated value of the electrostatic capacitance C may be used. Note that, similarly to FIG. 1, the low voltage DC power source 10, the low voltage power supply switch 12, the vehicle state signal 18, and the abnormality alarm device 19 are connected outside the leakage resistance detection device 50B, and the constant voltage control power source 25 that generates the control power supply voltage Vcc is provided in the leakage resistance detection device 50B.

Hereinafter, the action and operation of the device according to the second embodiment of the present invention configured as illustrated in FIG. 8 are briefly described with reference to a time chart of FIG. 9 as well as FIG. 8. First, in FIG. 8, when the manual power supply switch (not shown) is closed and the low voltage power supply switch 12 is closed, the constant voltage control power source 25 generates a predetermined control power supply voltage Vcc. The microprocessor 21 then starts its control operation and generates a repetitive command signal PLS shown in part (A) of FIG. 9. A first period (slow charge period) T1 in which the repetitive command signal PLS has a logic level "L" and a second period (rapid discharge period) T2 in which the repetitive command signal PLS has a logic level "H" have the same half-cycle value of the whole cycle $T0=T1+T2$. Actually, however, $T1 \leq T2$ may be satisfied.

Figure 9:
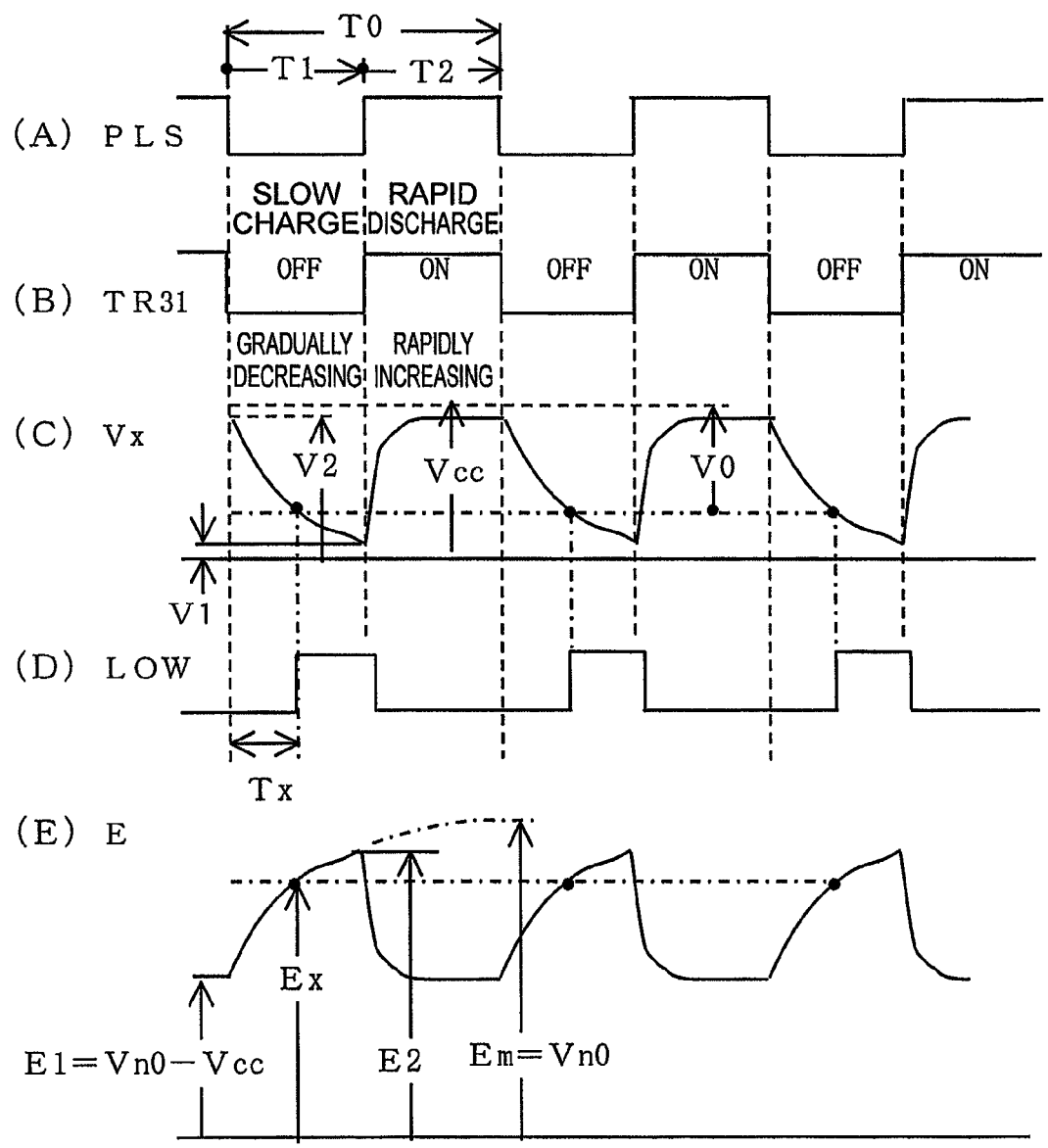
FIG. 9 is a time chart for describing the operation of the device of FIG. 8.

In FIG. 8, when the logic level of the repetitive command signal PLS is "L" (or "H"), the charge/discharge switching element 31 is interrupted (or becomes conductive) as shown in part (B) of FIG. 9. Then, in FIG. 8, when the charge/discharge switching element 31 is interrupted, the coupling capacitor 51 is slowly charged from the on-board high voltage device 60Y side via a series circuit of the leakage resistance Rx, the rapid charge/discharge resistor 35, and the charge/discharge resistor 33, with the result that the monitoring voltage Vx decreases gradually along with the decrease in charge current. On the other hand, in FIG. 8, when the charge/discharge switching element 31 becomes conductive, the coupling capacitor 51 is rapidly discharged from the constant voltage control power source 25 via a series circuit of the rapid charge/discharge resistor 35 and the leakage resistance Rx, with the result that the monitoring voltage Vx increases rapidly.

Part (C) of FIG. 9 shows how the monitoring voltage Vx decreases gradually or increases rapidly. The gradient of the charge/discharge characteristics becomes gentler as charge/discharge time constants expressed in Expressions (8x) and (9x) become larger.

$$\tau 1=(R0+Rx) \times C, R0=Rs+Rx \tag{8y}=(8x)$$

$$\tau 2=(Rq+Rx) \times C \tag{9y}=(9x)$$

In the expressions, Rs represents the resistance value of the charge/discharge resistor 33; Rq, the resistance value of the rapid charge/discharge resistor 35 (Rq<<Rs); R0=Rs+Rq≈Rs, a series resistance; Rx, a parallel combined resistance of the equivalent leakage resistances R1 and R2; C, the electrostatic capacitance of the coupling capacitor 51; $\tau 1$, a slow charge time constant; and $\tau 2$, a rapid discharge time constant.

The resistance value Rs is, for example, several hundred KΩ while the resistance value Rq is several KΩ. When the value of the leakage resistance Rx is small, $\tau 1 \gg \tau 2$ is established between the slow charge time constant $\tau 1$ and the rapid discharge time constant $\tau 2$. However, when the value of the leakage resistance Rx is sufficiently larger than the resistance value Rs, $\tau 1 \approx \tau 2$ is established, and hence the charge/discharge time constants have little difference.

In part (C) of FIG. 9, the value of the monitoring voltage Vx at the end of the first period T1 after the slow charge is a first end voltage V1, and the value of the monitoring voltage Vx at the end of the second period T2 after the rapid discharge is a second end voltage V2. The value of the second end voltage V2 needs to be closest to the control power supply voltage Vcc. It is therefore necessary that the rapid discharge time constant T2 be smaller than the slow charge time constant T1 and it is desired that the second period T2 be longer than the first period T1. As a result, the initial value V2 of the gradually-decreasing monitoring voltage Vx is always Vcc (or a value closest to Vcc), and hence the initial value does not fluctuate depending on the magnitude of the first end voltage V1. Note that, the set threshold voltage V0 is a voltage value reduced from the control power supply voltage Vcc.

Part (D) of FIG. 9 shows the logic state of the inverted logic signal LOW generated by the microprocessor 21. The inverted logic signal LOW has a logic level "H" in a period in which the value of the monitoring voltage Vx shown in part (C) of FIG. 9 is equal to or lower than (Vcc−V0). The arithmetic control circuit 20B measures a transition time Tx, which starts at the time point of logic inversion of the repetitive command signal PLS from "H" to "L" and lasts until the logic of the inverted logic signal LOW changes from "L" to "H".

Part (E) of FIG. 9 shows the waveform of the both-end voltage E of the coupling capacitor 51. A charge initial voltage (=discharge end voltage) E1 is equal to a value obtained by subtracting the control power supply voltage Vcc from the stable divided voltage Vn0 expressed in Expression (4y). The value of a charge end voltage (=discharge initial voltage) E2 increases to Vn0 in the case where the charge period T1 is infinite. Similarly to the case of FIG. 1, the first period T1 of the repetitive command signal PLS is set to be longer than a limit transition time Tx0, which corresponds to the value of the transition time Tx when the value of the leakage resistance Rx has reached the limit leakage resistance Rx0 used for abnormality determination.

However, in the case of FIG. 8, the value of the transition time Tx in which the value of the gradually-decreasing monitoring voltage Vx transitions from a first threshold (V2=Vcc) to a second threshold (Vcc−V0) is measured, to thereby calculate the value of the leakage resistance Rx. The following demonstrates that the calculation can be performed using the threshold voltage coefficient γ of V0/Vcc similar to the case of FIG. 1 so that the characteristics charts of FIGS. 3 to 5 can be applied as they are.

The following demonstrates that Expression I shown at the top of FIG. 3 is applicable similarly in the second embodiment of FIG. 8.

Charge Period

In the slow charge period in which the logic level of the repetitive command signal PLS in FIG. 8 is "L" and the transistor serving as the charge/discharge switching element 31 is opened, Expression (10aa) is established.

$$R0 \times C(dE/dt) = Vx \tag{10aa}$$

where $R0=Rs+Rq \approx Rs \gg Rq$

Vx in Expression (10aa) is substituted into Expression (7y) above to obtain Expression (11aa).

$$Vn0 = E + \tau 1 \times (dE/dt) \tag{11aa}$$

where $\tau 1=(R0+Rx)C \approx (Rs+Rx)C$

In the differential equation (11aa), the initial value of E at the time t=0 is represented by E1 and the value of E at the infinite time is represented by Vn0. Then, a solution expressed by Expression (12aa) is obtained.

$$E=E1 \exp(-t/\tau 1)+Vn0\{1-\exp(-t/\tau 1)\} \tag{12aa}$$

In addition, the value of (dE/dt) in Expression (10aa) is substituted into Expression (7y) above to obtain Expression (13aa).

$$Vx/(R0//Rx)=(Vn0-E)/Rx \tag{13aa}$$

where R0//Rx represents the parallel combined resistance of R0 and Rx.

Discharge Period

In the rapid discharge period in which the logic level of the repetitive command signal PLS in FIG. 8 is "H" and the transistor serving as the charge/discharge switching element 31 is closed, Expression (10bb) is established.

$$C \times Rq(dE/dt)=Vx-Vcc \tag{10bb}$$

Vx in Expression (10bb) is substituted into Expression (7y) above to obtain Expression (11bb).

$$Vn0-Vcc=\tau 2(dE/dt)+E \tag{11bb}$$

where $\tau 2=(Rq+Rx) \times C$

In the differential equation (11bb), the initial value of E at the time t=0 is represented by E2 and the value of E at the infinite time is represented by Vn0−Vcc. Then, a solution expressed by Expression (12bb) is obtained.

$$E = E2\exp(-t/\tau 2) + (Vn0 - Vcc)\{1 - \exp(-t/\tau 2)\} \quad (12bb)$$

In addition, the value of (dE/dt) in Expression (10bb) is substituted into Expression (7y) above to obtain Expression (13bb).

$$Vx/(Rq//Rx) = (E - Vn0)/Rx + Vcc/Rq \quad (13bb)$$

where Rq//Rx represents the parallel combined resistance of Rq and Rx.

Stable State

In the stable state in which the logic level of the repetitive command signal PLS in FIG. 8 is inverted alternately in the charge period T1 and the discharge period T2 and there is no change in the value of the leakage resistance Rx and in the output voltage Vh of the high voltage DC power source 61, the initial values E1 and E2 in Expressions (12aa) and (12bb) are calculated as follows. First, in Expression (12aa), at the charge end time t=T1, E=E2 is established, and hence Expression (14aa) is established.

$$E2 = E1 \times K1 + Vn0(1 - K1) \quad (14aa)$$

where $K1 = \exp(-T1/\tau 1)$

In addition, in Expression (12bb), at the discharge end time t=T2, E=E1 is established, and hence Expression (14bb) is established.

$$E1 = E2 \times K2 + (Vn0 - Vcc)(1 - K2) \quad (14bb)$$

where $K2 = \exp(-T2/\tau 2)$

From Expressions (14aa) and (14bb), Expressions (15aa) and (15bb) are obtained.

$$Vn0 - E1 = Vcc \times K0 \quad (15aa)$$

$$Vn0 - E2 = Vcc \times K0 \times K1 \quad (15bb)$$

where $K0 = (1 - K2)/(1 - K1 \times K2)$

In the Case of Second Embodiment

In FIGS. 8 and 9, at the charge start time t=0, Vx1=V2≈Vcc is established. At the time Tx=0 to T1, if the value of Vx becomes equal to the set threshold voltage (Vcc−V0), Expression (19a) for the time t=Tx is calculated from Expression (12aa). Note that, rapid discharge is performed in the discharge period, and hence E1=Vn0−Vcc is established and Kx=exp(−Tx/τ1) is established.

$$Ex = (Vn0 - Vcc)\exp(-Tx/\tau 1) + Vn0\{1 - \exp(-Tx/\tau 1)\} = Vn0 - VccKx \quad (19a)$$

Expression (20a) is obtained from Expressions (13aa) and (19a).

$$(Vcc - V0)/(R0 // Rx) = (Vn0 - Ex)/Rx \quad (20a)$$
$$= VccKx/Rx$$

Then, the threshold voltage coefficient γ of V0/Vcc, the leakage resistance coefficient β of Rx/R0, and the transition time coefficient α of Tx/(R0C) are substituted into Expression (20a), and Expression (21) is obtained.

$$\gamma = (1 + \beta - Kx)/(1 + \beta)$$

$$\therefore Kx = (1 + \beta) \times (1 - \gamma) \quad (21)$$

$Kx = \exp[-Tx/\{(R0+Rx)C\}] = \exp\{-\alpha/(1+\beta)\}$ is established, and hence Expression (22) is obtained through natural logarithm conversion.

$$\alpha = (1+\beta)\text{LOG } e(1/Kx) \quad (22)$$

Expressions (21) and (22) correspond to Expression I shown at the top of FIG. 3.

Figure 10:
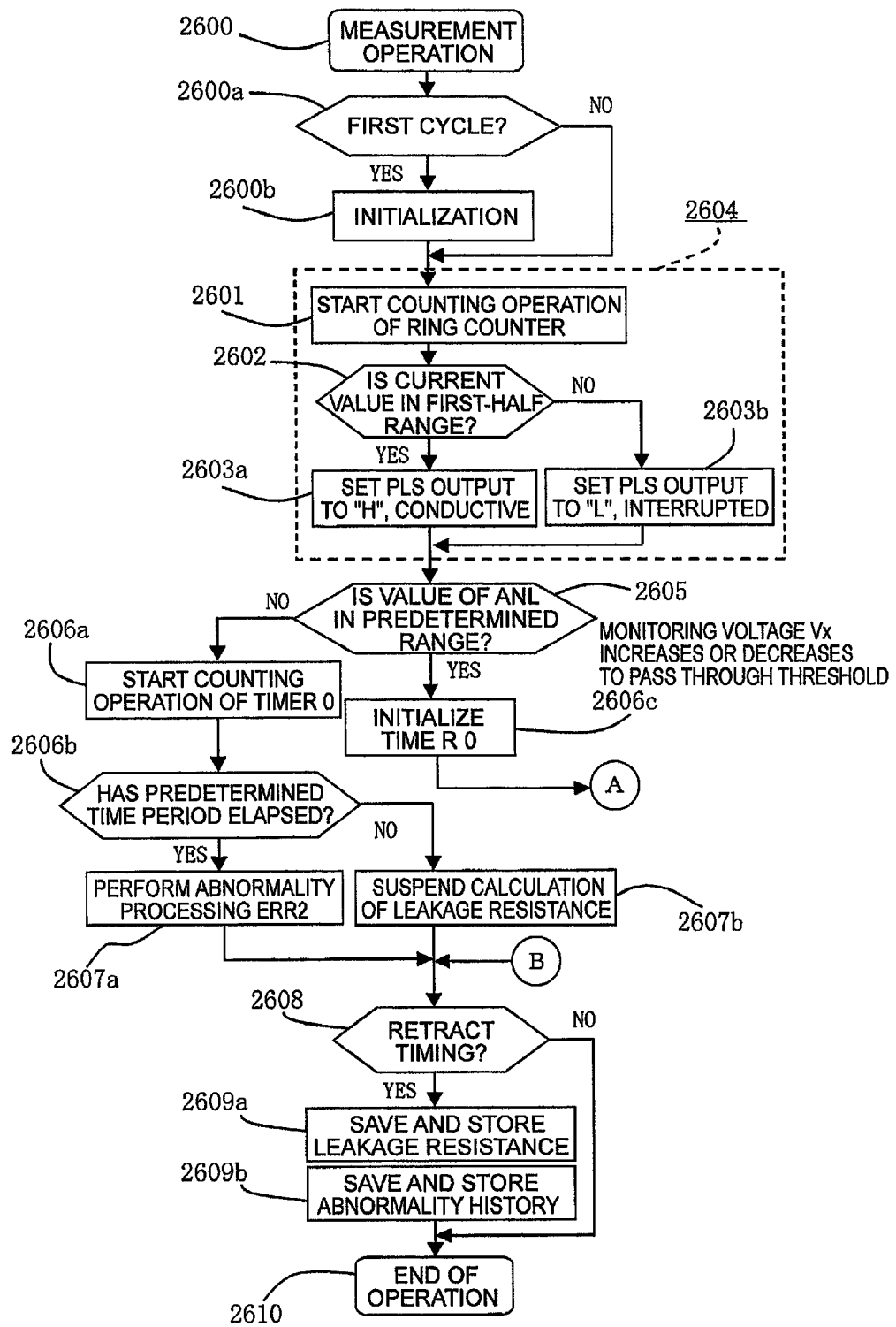
FIG. 10 is a first flowchart for describing the operation of the device of FIG. 8.

Next, the action and operation of the device of FIG. 8 are described in detail with reference to operation explanatory flowcharts illustrated in FIGS. 10 and 11, mainly focusing on the differences from FIGS. 6 and 7. Note that, the step numbers of FIGS. 6 and 7 are in the 1,000s while the step numbers of FIGS. 10 and 11 are in the 2,000s, and the same 3-digit or lower numbers represent the same or equivalent parts. Regarding the equivalent part, however, the difference parts for which an additional description is required are described below.

Referring to the first flowchart of FIG. 10, in Step 2605 executed after Step 2603*a* or Step 2603*b*, the analog signal voltage ANL input to the microprocessor 21 is monitored, and it is determined whether the value of the monitoring voltage Vx is in the proper range of 0 to Vcc. When the value of the monitoring voltage Vx is outside the proper range, it is determined to be NO and the flow proceeds to Step 2606*a*. When the value of the monitoring voltage Vx is within the proper range, it is determined to be YES and the flow proceeds to Step 2606*c*.

Figure 11:
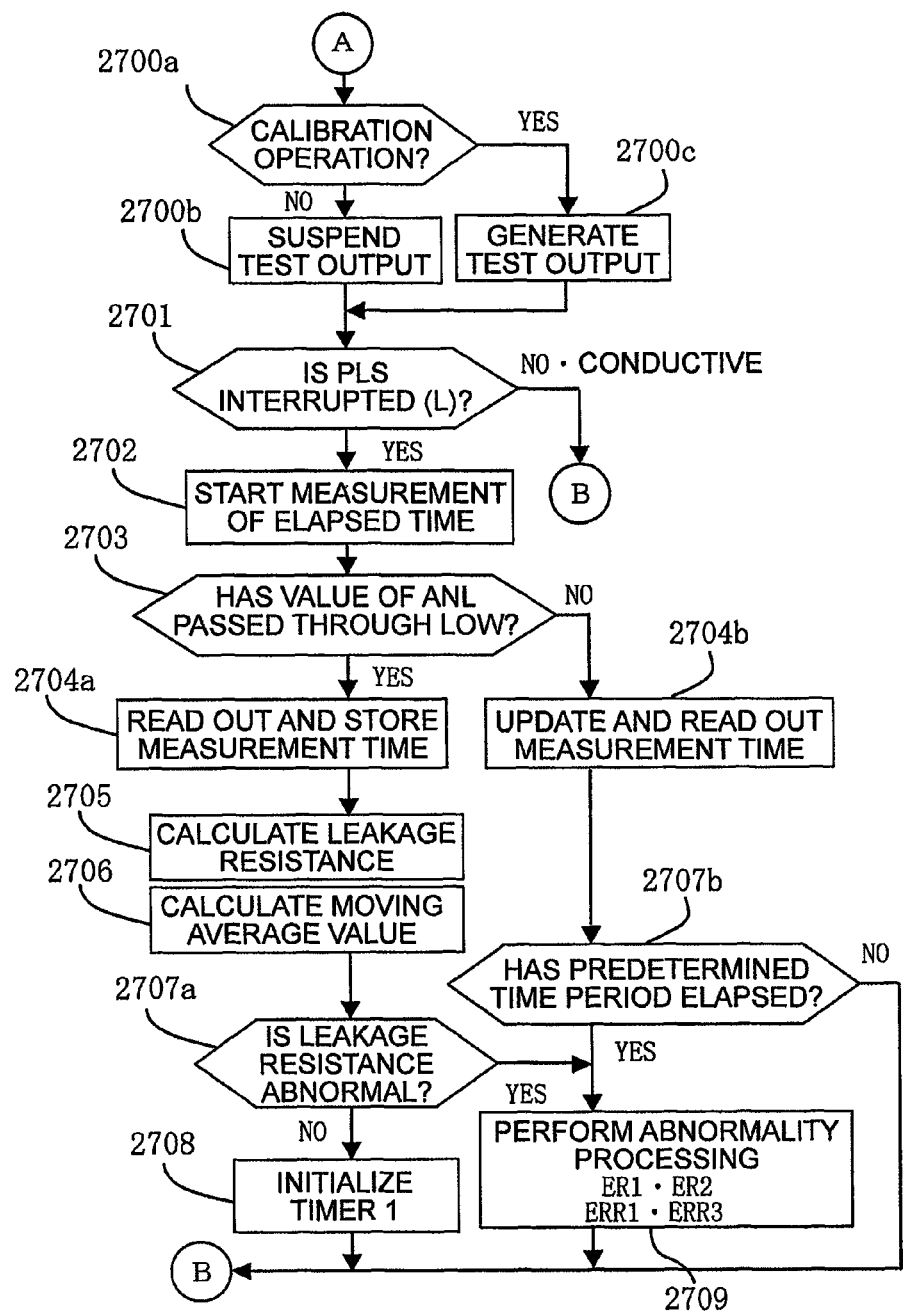
FIG. 11 is a second flowchart for describing the operation of the device of FIG. 8.

Next referring to the second flowchart of FIG. 11, Step 2700*a* is a step of determining whether to perform calibration operation. In the case of measuring a calibrated value of the electrostatic capacitance C of the coupling capacitor 51 at the time of shipping inspection of the leakage resistance detection device 50B, or immediately after the low voltage power supply switch 12 is closed to feed the leakage resistance detection device 50B at the time of the actual operation of the leakage resistance detection device 50B, it is determined to be YES and the flow proceeds to Step 2700*c*. After the completion of the calibration operation, it is determined to be NO and the flow proceeds to Step 2700*b*.

Step 2700*c* is a step serving as operational calibration means, in which a test flag is set in the case of shipping adjustment operation while a test operation command TST is generated at the start of the actual operation, and the flow proceeds to Step 2701. Step 2700*b* is a step in which the test flag generated in Step 2700*c* is reset and the test operation command TST is suspended, and the flow proceeds to Step 2701.

In the case of the shipping adjustment operation, the arithmetic control circuit 20B measures the leakage resistance Rx in Step 2706 to be described below in the state in which the coupling capacitor 51 and the on-board high voltage device 60Y are not connected to each other. The arithmetic control circuit 20B calibrates and stores the value of the electrostatic capacitance C of the coupling capacitor 51 so that the obtained result may become the additional resistance R3 of the bypass leakage resistance 53.

At the start of the actual operation, the arithmetic control circuit 20B closes the test switching element 55 temporarily at the start of the operation, and determines whether the resistance abnormality determination output ER1 is activated for a moment or whether the pre-alarm output ER2 operates for a moment when the leakage resistance Rx becomes equal to or smaller than the preliminary leakage resistance Rxn, to thereby inspect whether the operation of detecting the leakage resistance Rx can be performed normally. When the inspection result shows that the detection operation is abnormal, the resistance abnormality determination output ER1 or the pre-alarm output ER2 is generated continuously or intermittently. When the inspection result shows that the detection operation is normal, the output generation is suspended for such a short period of time that the abnormality alarm device 19 to be driven by the resistance abnormality determination output ER1 or the pre-alarm output ER2 does not operate.

Further, the arithmetic control circuit 20B closes the test switching element 55 at the start of the operation to measure the value of a first combined leakage resistance in the state in which the test leakage resistor 54, the bypass leakage resistor 53, and the actual leakage resistance Rx are connected in parallel, and measures the value of a second combined leakage resistance in the state in which the test switching element 55 is opened and the bypass leakage resistor 53 and the actual leakage resistance Rx are connected in parallel. The arithmetic control circuit 20B back-calculates the electrostatic capacitance C of the coupling capacitor 51 based on the values of the first and second leakage resistances, and stores the calculated electrostatic capacitance C as a calibrated value. The calibrated value is calculated so that the actual leakage resistances Rx in the open-circuit and closed-circuit states of the test switching element 55 may have the same value owing to the calibrated and stored electrostatic capacitance C.

Step 2703 following Step 2702 is a determination step of determining whether the logic level of the internally generated inverted logic signal LOW has changed from "L" to "H" when the value of the analog signal voltage ANL has decreased to be equal to or lower than a predetermined set voltage (Vcc−V0). In the case where the logic level of the inverted logic signal LOW has changed when the value of the analog signal voltage ANL has become equal to or lower than the set voltage (Vcc−V0), it is determined to be YES and the flow proceeds to Step 2704a. In the case where the logic level of the inverted logic signal LOW has changed when the value of the analog signal voltage ANL is higher than the set voltage (Vcc−V0), it is determined to be NO and the flow proceeds to Step 2704b.

Note that, the calculation of the leakage resistance Rx in Step 2705 is performed in three manners. First, the calculation is performed based on the characteristics curve whose whole region is the negative-gradient curve region as represented by the curve 103 of FIG. 3. Second, the calculation is performed by using the negative-gradient curve region of a bell-shaped curve as represented by the curve 112 of FIG. 3. Third, the calculation is performed by using the positive-gradient curve region of a bell-shaped curve as represented by the curve 113 of FIG. 3. In any case, the value of the leakage resistance Rx is calculated from the measured value of the transition time Tx based on a function formula or a data table between the transition time coefficient α and the leakage resistance coefficient β with the use of the threshold voltage coefficient γ=V0/Vcc as a parameter. However, in the second embodiment, the set threshold voltage V0 is a voltage value reduced from the control power supply voltage Vcc, and the set voltage is (Vcc−V0).

As an alternative abnormality determination method, instead of comparing the detected leakage resistance Rx with the preliminary leakage resistance Rxn or the limit leakage resistance Rx0, the preliminary transition time Txn or the limit transition time Tx0 corresponding to the preliminary leakage resistance Rxn or the limit leakage resistance Rx0 may be calculated in advance, and the actual transition time Tx may be compared with the preliminary transition time Txn or the limit transition time Tx0.

Further, in the case where the value of the reference time constant R0×C, which is the denominator of the transition time coefficient α, the value of the series resistance R0, which is the denominator of the leakage resistance coefficient β, or the value of the threshold voltage coefficient γ is treated as a fixed value, a formula or a data table between the transition time Tx and the leakage resistance Rx may be directly used as the function formula or the data table. In this case, the leakage resistance Rx can be calculated directly from the measured transition time Tx without performing complicated calculation processing during the operation.

However, in the case of varying the value of the threshold voltage coefficient γ, the denominator value of the transition time coefficient α, or the denominator value of the leakage resistance coefficient β in accordance with the applied types of vehicle or the operating state, it is advantageous to set the function formula or the data table using α, β, or γ, which are index values without unit. Alternatively, in the case where the arithmetic control circuit 20B has no analog input port or an analog input port is occupied, the comparator 41 illustrated in FIG. 1 may be used instead of the operational amplifier 49. In this case, a signal equivalent to the inverted logic signal LOW can be input to the microprocessor 21.

In addition, in the embodiment of FIG. 8, the connection point B is connected to the positive-side power supply line 68 of the on-board high voltage device 60X, but, even when the connection point B is connected to a negative-side power supply line, no change occurs in Expression I. Similarly, in the first embodiment of FIG. 1, the connection point B is connected to the negative-side power supply line 67 of the on-board high voltage device 60X, but, even when the connection point B is connected to a positive-side power supply line, no change occurs in Expression I.

As is clear from the above description, according to the second embodiment of the present invention, there is provided the leakage resistance detection device 50B for an on-board high voltage device, which is connectable to the on-board high voltage device 60Y including the on-board high voltage DC power source 61 and the high voltage electric load 64 to be fed and driven by the on-board high voltage DC power source 61, the on-board high voltage device 60Y having the leakage resistance Rx with respect to the vehicle body 11, as typified by the equivalent leakage resistance 65 on the positive potential side and the equivalent leakage resistance 66 on the negative potential side, the leakage resistance detection device 50B including the constant voltage control power source 25 which is fed and driven by the low voltage DC power source 10 having the negative terminal connected to the vehicle body 11 and which generates the control power supply voltage Vcc, the leakage resistance detection device 50B being configured to measure a value of the leakage resistance Rx via the coupling capacitor 51 having one terminal B connected to a predetermined position of the on-board high voltage device 60Y, the leakage resistance detection device 50B further including the repetitive signal output circuit 30B, the monitoring signal processing circuit 40B, and the arithmetic control circuit 20B, the arithmetic control circuit 20B including the microprocessor 21 and the program memory 24B which cooperate with each other.

Further, the repetitive signal output circuit 30B alternately repeats, in response to the switching operation of the charge/discharge switching element 31 that operates in response to the repetitive command signal PLS, a charge period and a discharge period in which the measurement point A is intermittently connected to the control power supply voltage Vcc via the charge/discharge resistor 33 or 35, the measurement point A being another terminal of the coupling capacitor 51, to thereby gradually increase or gradually decrease the monitoring voltage Vx which is a potential between the measurement point A and the vehicle body 11. The monitoring signal processing circuit 40B is configured to: generate the inverted logic signal LOW when a value of the monitoring voltage Vx, which gradually increases or gradually decreases at a gradient that becomes gentler as a charge/discharge time constant becomes larger, passes through a predetermined threshold voltage, and input the inverted logic signal LOW to the arithmetic control circuit 20B; or generate the analog signal voltage ANL proportional to the monitoring voltage Vx and input the analog signal voltage ANL to the arithmetic control circuit 20B. The arithmetic control circuit 20B is configured to: measure the transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance 65 on the positive potential side and the equivalent leakage resistance 66 on the negative potential side, based on a function formula or a data table relating to the transition time Tx and the leakage resistance Rx; and generate the resistance abnormality determination output ER1 when the leakage resistance Rx becomes equal to or smaller than the predetermined limit leakage resistance Rx0 or when the transition time Tx reaches the limit transition time Tx0 corresponding to the predetermined limit leakage resistance Rx0. The repetitive command signal PLS is a pulse signal with a fixed cycle having the charge period or the discharge period longer than at least the limit transition time Tx0.

The repetitive signal output circuit 30B is configured to, in response to the switching operation of the charge/discharge switching element 31, connect the measurement point A being the another terminal of the coupling capacitor 51 to the output terminal of the constant voltage control power source 25 via the rapid charge/discharge resistor 35 having the resistance value Rq, or connect the measurement point A to the negative terminal corresponding to a vehicle body potential via the reference resistor 33 having the reference value Rs which is sufficiently larger than the resistance value Rq, to thereby rapidly increase or gradually decrease the monitoring voltage Vx which is the potential between the measurement point A and the vehicle body 11. The monitoring signal processing circuit 40B is configured to: generate the inverted logic signal LOW when the value of the monitoring voltage Vx, which gradually decreases at a gradient that becomes gentler as the time constant (Rs+Rx)C being a product of a sum of the resistance value Rs (Rs>>Rq) and the leakage resistance Rx and the electrostatic capacitance C of the coupling capacitor 51 becomes larger, has decreased to pass through a value obtained by subtracting the predetermined threshold voltage V0 from the control power supply voltage Vcc, and input the inverted logic signal LOW to the arithmetic control circuit 20B; or generate the analog signal voltage ANL proportional to the monitoring voltage Vx and input the analog signal voltage ANL to the arithmetic control circuit 20B. The arithmetic control circuit 20B inverts an output of the repetitive command signal PLS, which is a pulse train signal having a fixed cycle, in a state in which the value of the monitoring voltage Vx has abruptly increased to approach the control power supply voltage Vcc by the charge/discharge switching element 31, and inverts the output of the repetitive command signal PLS after receiving the inverted logic signal LOW as an input or after measuring, as the transition time Tx, a time period from when the inverted logic signal LOW is generated based on the input analog signal voltage ANL to when the inverted logic signal LOW is obtained.

As described above, in connection with claim 4 of the present invention, the repetitive signal output circuit charges and discharges the coupling capacitor, and the arithmetic control circuit measures, as the transition time Tx, a time period during which the monitoring voltage Vx increases to the predetermined threshold voltage (Vcc−V0) from one threshold voltage which is set to a value close to the control power supply voltage Vcc. Therefore, the comparator determination circuit or the comparator determination processing with respect to one of the pair of threshold voltages can be omitted, and the transition time can be measured by a simple structure.

As is clear from the above description, according to the second embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30B is represented by R0, and when a time period during which the monitoring voltage Vx decreases gradually from a state of the control power supply voltage Vcc to the predetermined threshold voltage (Vcc−V0) is represented by the transition time Tx, the transition time coefficient α is set to Tx/(R0×C), the leakage resistance coefficient β is set to Rx/R0, and the threshold voltage coefficient γ is set to V0/Vcc or (V2−V1)/Vcc: calculating, by the arithmetic control circuit 20B, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; selectively using a negative-gradient curve region following the positive-gradient curve region or a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region; determining, when the transition time Tx has become a value equal to or larger than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the short-circuit transition time Tx00 corresponding to a case where the leakage resistance Rx becomes 0.

As is clear from the above description, according to the second embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30B is represented by R0, and when a time period during which the monitoring voltage Vx decreases gradually from a state of the control power supply voltage Vcc to the predetermined threshold voltage (Vcc−V0) is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20B, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; excluding in advance, by the characteristics curve correction means, application of a negative-gradient curve region following the positive-gradient curve region; determining the threshold voltage coefficient γ so that a value of the transition time coefficient α when the value of the leakage resistance Rx has reached the limit leakage resistance Rx0 is included in the corrected positive-gradient curve region; determining, when the transition time Tx has become a value equal to or smaller than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the open-circuit transition time Txm corresponding to a case where the leakage resistance Rx is infinite.

The leakage resistance detection device further includes the test leakage resistor 54 and the test switching element 55, which are connected between the connection point B between the coupling capacitor 51 and the on-board high voltage device 60Y, and the vehicle body 11, the test leakage resistor 54 having a resistance value equal to or smaller than the limit leakage resistance Rx0 or a resistance value equal to or smaller than the preliminary leakage resistance Rxn which is close to the limit leakage resistance Rx0 and larger than the limit leakage resistance Rx0, the test switching element 55 being connected in series to the test leakage resistor 54. The leakage resistance detection method further includes, by the arithmetic control circuit 20B: closing the test switching element 55 temporarily at start of operation, and determining whether the resistance abnormality determination output ER1 operates for a moment or the pre-alarm output ER2 that is generated when the leakage resistance Rx has become equal to or smaller than the preliminary leakage resistance Rxn operates for a moment, to thereby inspect whether an operation of detecting the leakage resistance Rx is performed normally; and when a result of the inspection shows that the detection operation is abnormal, generating the resistance abnormality determination output ER1 or the pre-alarm output ER2 continuously or intermittently, and when the result of the inspection shows that the detection operation is normal, suspending output generation for such a short period of time that the abnormality alarm device 19 to be driven by the resistance abnormality determination output ER1 or the pre-alarm output ER2 does not operate.

As described above, in connection with claim 16 of the present invention, the leakage resistance detection device further includes the test leakage resistor which is temporarily connected by the test switching element, so that the arithmetic control circuit performs preliminary inspection related to the detection operation of the leakage resistance.

It is therefore possible to inspect, at the start of operation, whether the resistance abnormality determination output or the pre-alarm output, which is never activated if the leakage resistance is normal, will be generated normally. When the inspection results in abnormality, the abnormality can be informed by the resistance abnormality determination output or the pre-alarm output.

The leakage resistance detection device further includes the bypass leakage resistor 53, which is connected between the connection point B between the coupling capacitor 51 and the on-board high voltage device 60Y, and the vehicle body 11. The leakage resistance detection method further includes, by the arithmetic control circuit 20B: closing the test switching element 55 at the start of the operation and measuring a first combined leakage resistance value in a state in which the test leakage resistor 54, the bypass leakage resistor 53, and an actual leakage resistance Rx are connected in parallel, and measuring a second combined leakage resistance value in a state in which the test switching element 55 is opened and the bypass leakage resistor 53 and the actual leakage resistance Rx are connected in parallel; and back-calculating the electrostatic capacitance C of the coupling capacitor 51 from the first combined leakage resistance value and the second combined leakage resistance value and storing the back-calculated electrostatic capacitance C as a calibrated value, the calibrated value being calculated so that the actual leakage resistances Rx in open-circuit and closed-circuit states of the test switching element 55 have the same value owing to the calibrated and stored electrostatic capacitance C.

As described above, in connection with claim 17 of the present invention, the leakage resistance detection device further includes the bypass leakage resistor and the test leakage resistor. Two kinds of the combined leakage resistance are detected in the state in which the test leakage resistor is connected or opened by the test switching element, to thereby calculate and calibrate the electrostatic capacitance of the coupling capacitor.

Therefore, the calibration of the electrostatic capacitance can be performed at every start of the operation in the state in which the on-board high voltage device having an unknown leakage resistance is connected. Thus, the correct electrostatic capacitance can always be grasped with respect to individual fluctuations in electrostatic capacitance among first articles and fluctuations caused by the secular change thereof. Accordingly, the leakage resistance can be measured accurately.

Third Embodiment

Figure 12:
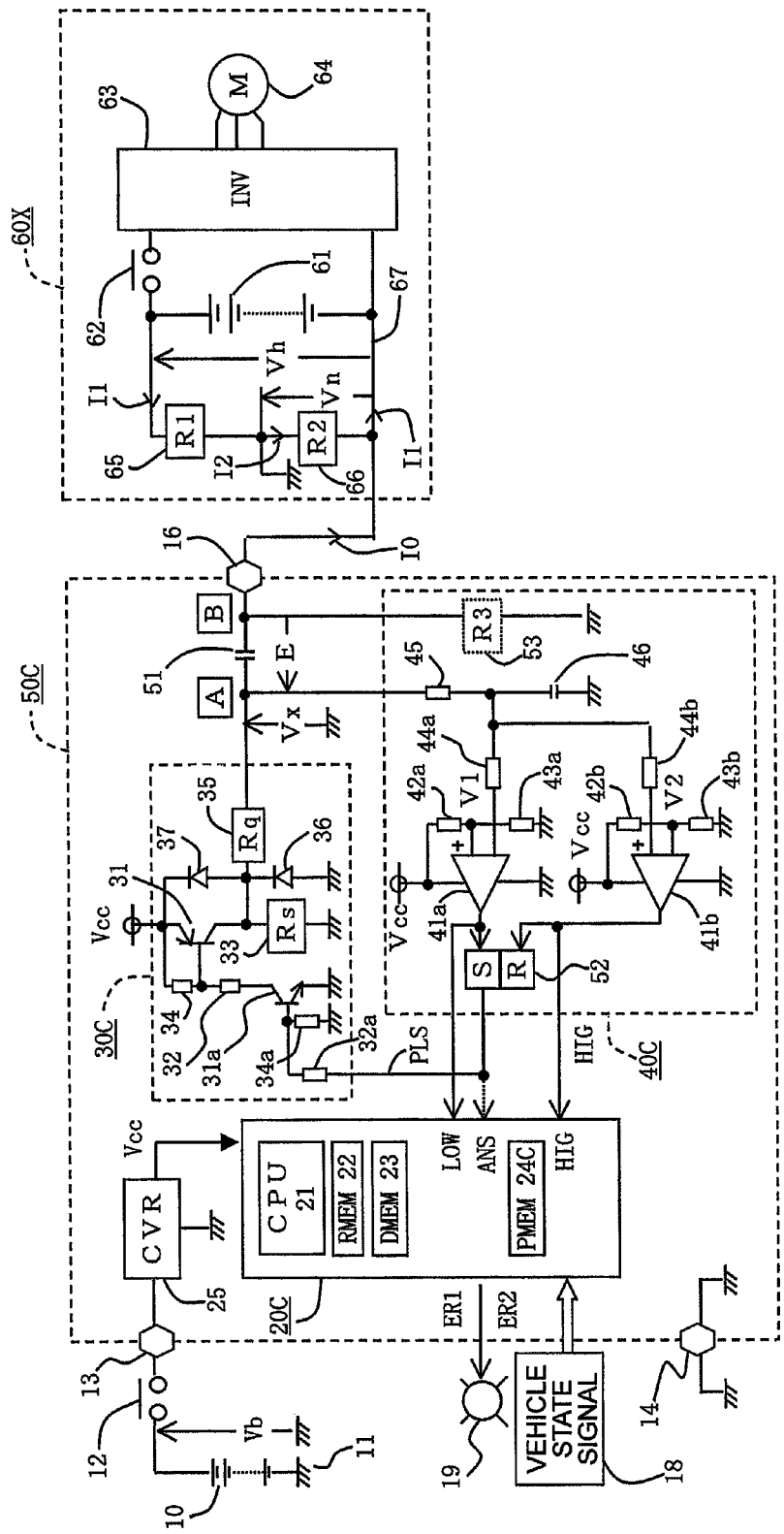
FIG. 12 is an overall configuration diagram of a device according to a third embodiment of the present invention.

Referring to FIG. 12 which is an overall configuration diagram of a device according to a third embodiment of the present invention, the differences from FIG. 1 are mainly described below. In the drawings, the same reference symbols denote the same or equivalent parts. In FIG. 12, a leakage resistance detection device 50C includes an arithmetic control circuit 20C, a repetitive signal output circuit 30C, and a monitoring signal processing circuit 40C, and detects a leakage resistance of an on-board high voltage device 60X.

The first main difference is that the repetitive signal output circuit 30C includes a charge/discharge switching element 31 such as a PNP transistor, and when the output logic level of the repetitive command signal PLS is "H", an auxiliary switching element 31a becomes conductive via an auxiliary drive resistor 32a so that the charge/discharge switching element 31 becomes conductive via the drive resistor 32, and when the output logic level of the repetitive command signal PLS is "L", the auxiliary switching element 31a becomes non-conductive by an auxiliary stabilizing resistor 34a so that the charge/discharge switching element 31 becomes non-conductive by an open-circuit stabilizing resistor 34.

The second main difference is that the repetitive command signal PLS uses an output signal of an inversion memory circuit 52 provided in the monitoring signal processing circuit 40C and is a pulse train signal having a variable cycle as described below with reference to FIG. 13.

The third main difference is that the monitoring signal processing circuit 40C includes first and second comparators 41a and 41b and the inversion memory circuit 52, instead of the comparator 41.

The first comparator 41a has a positive input terminal connected to voltage dividing resistors 42a and 43a. The voltage dividing resistors 42a and 43a divide the control power supply voltage Vcc to generate a first threshold voltage V1. The first comparator 41a has a negative input terminal connected to a noise filter circuit formed of a smoothing resistor 45 and a smoothing capacitor 46 via an input resistor 44a. The smoothing resistor 45 has one terminal applied with a monitoring voltage Vx.

The second comparator 41b has a negative input terminal connected to voltage dividing resistors 42b and 43b. The voltage dividing resistors 42b and 43b divide the control power supply voltage Vcc to generate a second threshold voltage V2. The second comparator 41b has a positive input terminal connected to the noise filter circuit formed of the smoothing resistor 45 and the smoothing capacitor 46 via an input resistor 44b.

The first comparator 41a has an output logic level "H" when the monitoring voltage Vx is equal to or smaller than the first threshold voltage V1. The output logic level "H" is input to the arithmetic control circuit 20C as a first inverted logic signal LOW. The first comparator 41a further supplies a SET input to the inversion memory circuit 52 such as a flip-flop circuit.

The second comparator 41b has an output logic level "H" when the monitoring voltage Vx is equal to or larger than the second threshold voltage V2. The output logic level "H" is input to the arithmetic control circuit 20C as a second inverted logic signal HIG. The first comparator 41a further supplies a RESET input to the inversion memory circuit 52 such as a flip-flop circuit.

A SET output of the inversion memory circuit 52 is input to the repetitive signal output circuit 30C as a repetitive command signal PLS, and is further input to the arithmetic control circuit 20C as an inverted logic signal ANS serving as a band history logic signal.

A microprocessor 21 provided in the arithmetic control circuit 20C cooperates with a program memory 24C and measures the value of a leakage resistance Rx. The microprocessor 21 generates a pre-alarm output ER2 when the measured value of the leakage resistance Rx becomes equal to or smaller than a predetermined preliminary leakage resistance Rxn, and generates a resistance abnormality determination output ER1 when the measured value becomes equal to or smaller than a limit leakage resistance Rx0, which are output to the abnormality alarm device 19.

Note that, similarly to FIG. 1, the low voltage DC power source 10, the low voltage power supply switch 12, the vehicle state signal 18, and the abnormality alarm 19 are connected outside the leakage resistance detection device 50C, and the constant voltage control power source 25 that generates the control power supply voltage Vcc is provided in the leakage resistance detection device 50C.

Hereinafter, the action and operation of the device according to the third embodiment of the present invention configured as illustrated in FIG. 12 are briefly described with reference to a time chart of FIG. 13 as well as FIG. 12. First, in FIG. 12, when the manual power supply switch (not shown) is closed and the low voltage power supply switch 12 is closed, the constant voltage control power source 25 generates a predetermined control power supply voltage Vcc. The microprocessor 21 then starts its control operation.

Figure 13:
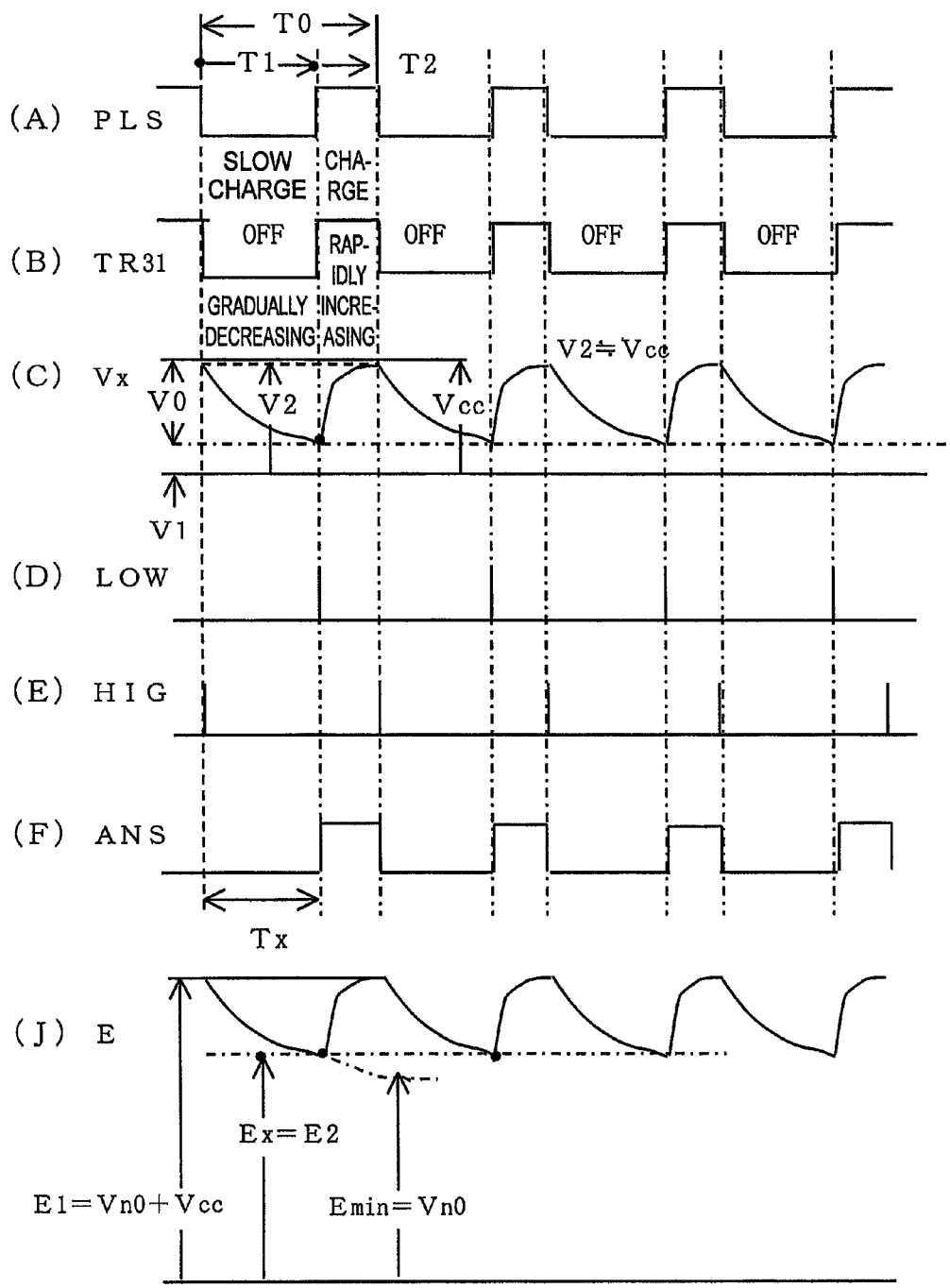
FIG. 13 is a time chart for describing the operation of the device of FIG. 12.

Part (A) of FIG. 13 shows the waveform of the repetitive command signal PLS generated by the monitoring signal processing circuit 40C. A first period (slow discharge period) T1 in which the repetitive command signal PLS has a logic level "L" and a second period (rapid charge period) T2 in which the repetitive command signal PLS has a logic level "H" have different values each occupying a part of the whole cycle T0=T1+T2.

In FIG. 12, when the logic level of the repetitive command signal PLS is "L" (or "H"), the charge/discharge switching element 31 is interrupted (or becomes conductive) as shown in part (B) of FIG. 13. Then, in FIG. 12, when the charge/discharge switching element 31 is interrupted, the coupling capacitor 51 is slowly discharged via a series circuit of the leakage resistance Rx, the rapid charge/discharge resistor 35, and the charge/discharge resistor 33, with the result that the monitoring voltage Vx decreases gradually along with the decrease in discharge current. On the other hand, in FIG. 12, when the charge/discharge switching element 31 becomes conductive, the coupling capacitor 51 is rapidly charged from the constant voltage control power source 25 via a series circuit of the rapid charge/discharge resistor 35 and the leakage resistance Rx, with the result that the monitoring voltage Vx increase rapidly.

Part (C) of FIG. 13 shows how the monitoring voltage Vx decreases gradually or increases rapidly. The gradient of the charge/discharge characteristics becomes gentler as the charge/discharge time constants expressed in Expressions (8x) and (9x) above become larger. $\tau1=(R0+Rx)C$ is a slow discharge time constant, and $\tau2=(Rq+Rx)C$ is a rapid charge time constant.

In part (C) of FIG. 13, the value of the slowly-discharged monitoring voltage Vx decreases gradually to the first end voltage V1 at the end of the first period T1. At this time, the logic level of the first inverted logic signal LOW which is the output of the first comparator 41a changes from "L" to "H", and the logic level of the SET output of the inversion memory circuit 52 becomes "H". As a result, the charge/discharge switching element 31 becomes conductive to start the rapid charge of the coupling capacitor 51.

The value of the rapidly-charged monitoring voltage Vx increases rapidly to the second end voltage V2 which is a value substantially equal to the control power supply voltage Vcc at the end of the second period T2. At this time, the logic level of the second inverted logic signal HIG which is the output of the second comparator 41b changes from "L" to "H", and the logic level of the SET output of the inversion memory circuit 52 becomes "L". As a result, the charge/discharge switching element 31 is interrupted to start the slow discharge of the coupling capacitor 51.

Note that, in order to prevent waiting for the monitoring voltage Vx to completely converge to the control power supply voltage Vcc at the end of the second period T2, a residual error $\Delta V$ of about Vcc−V2=0.03Vcc is added to the set threshold voltage V0 which is the value obtained by subtracting the first end voltage V1 from the control power supply voltage Vcc.

Part (D) of FIG. 13 shows the output waveform of the first inverted logic signal LOW. Part (E) of FIG. 13 shows the output waveform of the second inverted logic signal HIG. Part (F) of FIG. 13 shows the generated waveform of the inverted logic signal ANS which is the output of the inversion memory circuit 52. The inverted logic signal ANS and the repetitive command signal PLS are the same signal. A measurement time Tx is a period in which the logic level of the inverted logic signal ANS is "L" and the monitoring voltage Vx decreases gradually from the control power supply voltage Vcc to a voltage corresponding to the set threshold voltage V0 higher than the first end voltage V1.

Part (J) of FIG. 13 shows the waveform of the both-end voltage E of the coupling capacitor 51. A discharge initial voltage (=charge end voltage) E1 is equal to a value obtained by adding the control power supply voltage Vcc to the stable divided voltage Vn0 expressed in Expression (4x). The value of a discharge end voltage (=charge initial voltage) E2 decreases to Vn0 in the case where the discharge period T1 is infinite.

The following demonstrates that the calculation can be performed using the threshold voltage coefficient γ of V0/Vcc similarly to the case of FIG. 1 so that the characteristics charts of FIGS. 3 to 5 can be applied as they are. Note that, the generation frequency of the repetitive command signal PLS is a fixed value in the first and second embodiments, but in the third embodiment, the first period T1 and the second period T2 are automatically changed in accordance with the value of the leakage resistance Rx so that the next repetitive command signal PLS may be generated quickly after the completion of the measurement of the transition time Tx. Further, the transition to the next first period T1 is performed after the confirmation that the monitoring voltage Vx has increased to a value close to the control power supply voltage Vcc, and hence it is unnecessary to provide a delay time to the second period T2 with respect to the second end voltage V2 unlike part (C) of FIG. 9.

The following demonstrates that Expression I shown at the top of FIG. 3 is applicable similarly in the third embodiment of FIG. 12.

Discharge Period

In the slow discharge period in which the logic level of the repetitive command signal PLS in FIG. 12 is "L" and the transistor serving as the charge/discharge switching element 31 is opened, Expression (30b) is established.

$$Vx + R0 \times C(dE/dt) = 0 \quad (30b)$$

where $R0 = Rs + Rq \approx Rs >> Rq$

Vx in Expression (30b) is substituted into Expression (7x) above to obtain Expression (31b).

$$Vn0 = E + \tau1 \times (dE/dt) \quad (31b)$$

where $\tau1 = (R0+Rx)C \approx (Rs+Rx)C$

In the differential equation (31b), the initial value of E at the time t=0 is represented by E1 and the value of E at the infinite time is represented by Vn0. Then, a solution expressed by Expression (32b) is obtained.

$$E = E1\exp(-t/\tau1) + Vn0\{1-\exp(-t/\tau1)\} \quad (32b)$$

In addition, the value of (dE/dt) in Expression (30b) is substituted into Expression (7x) above to obtain Expression (33b).

$$Vx/(R0//Rx) = (E-Vn0)/Rx \quad (33b)$$

where R0//Rx represents the parallel combined resistance of R0 and Rx.

Charge Period

In the rapid charge period in which the logic level of the repetitive command signal PLS in FIG. 12 is "H" and the transistor serving as the charge/discharge switching element 31 is closed, Expression (30a) is established.

$$C \times Rq(dE/dt) = Vcc - Vx \quad (30a)$$

Vx in Expression (30a) is substituted into Expression (7x) above to obtain Expression (31a).

$$Vn0 + Vcc = \tau2(dE/dt) + E \quad (31a)$$

where $\tau2 = (Rq+Rx) \times C$

In the differential equation (31a), the initial value of E at the time t=0 is represented by E2 and the value of E at the infinite time is represented by Vn0+Vcc. Then, a solution expressed by Expression (32a) is obtained.

$$E = E2\exp(-t/\tau2) + (Vn0+Vcc)\{1-\exp(-t/\tau2)\} \quad (32a)$$

In addition, the value of (dE/dt) in Expression (30a) is substituted into Expression (7x) above to obtain Expression (33a).

$$Vx/(Rq//Rx) = (E-Vn0)/Rx + Vcc/Rq \quad (33a)$$

where Rq//Rx represents the parallel combined resistance of Rq and Rx.

Stable State

In the stable state in which the logic level of the repetitive command signal PLS in FIG. 12 is inverted alternately in the discharge period T1 and the charge period T2 and there is no change in the value of the leakage resistance Rx and in the output voltage Vh of the high voltage DC power source 61, the initial values E1 and E2 in Expressions (32b) and (32a) are calculated as follows. First, in Expression (32b), at the discharge end time t=T1, E=E2 is established, and hence Expression (34b) is established.

$$E2 = E1 \times K1 + Vn0(1-K1) \quad (34b)$$

where $K1 = \exp(-T1/\tau1)$

In addition, in Expression (32a), at the discharge end time t=T2, E=E1 is established, and hence Expression (34a) is established.

$$E1 = E2 \times K2 + (Vn0+Vcc)(1-K2) \quad (34a)$$

where $K2 = \exp(-T2/\tau2)$

From Expressions (34a) and (34b), Expressions (35a) and (35b) are obtained.

$$E1 - Vn0 = Vcc \times K0 \quad (35b)$$

$$E2 - Vn0 = Vcc \times K0 \times K1 \quad (35a)$$

where $K0 = (1-K2)/(1-K1 \times K2)$

In the Case of Third Embodiment In FIGS. 12 and 13, at the discharge start time t=0, Vx2=V2≈Vcc is established. At the time Tx=T1, if the value of Vx becomes equal to the set threshold voltage V1=(Vcc−V0), Expression (39b) for the time t=Tx is calculated from Expression (32b). Note that, the value of the discharge initial voltage E1 is Vn0+VccK0≈Vn0+Vcc by Expression (35b) and Kx=exp(−T1/τ1)=K1 is established.

$$Ex = (Vn0+Vcc)\exp(-Tx/\tau1) + Vn0\{1-\exp(-Tx/\tau1)\} = Vn0 + VccKx \quad (39b)$$

Expression (40b) is obtained from Expressions (33b) and (39b).

$$(Vcc - V0)/(R0 // Rx) = (Ex - Vn0)/Rx \quad (40b)$$
$$= VccKx/Rx$$

Then, the threshold voltage coefficient γ of V0/Vcc, the leakage resistance coefficient β of Rx/R0, and the transition time coefficient α of Tx/(R0C) are substituted into Expression (40b), and Expression (41) is obtained.

$$\gamma = (1+\beta-Kx)/(1+\beta)$$

$$\therefore Kx = (1+\beta) \times (1-\gamma) \quad (41)$$

Kx=exp[−Tx/{(R0+Rx)C}]=exp{−α/(1+β)} is established, and hence Expression (42) is obtained through natural logarithm conversion.

$$\alpha = (1+\beta)\text{LOG } e(1/Kx) \quad (42)$$

Expressions (41) and (42) correspond to Expression I shown at the top of FIG. 3.

Figure 14:
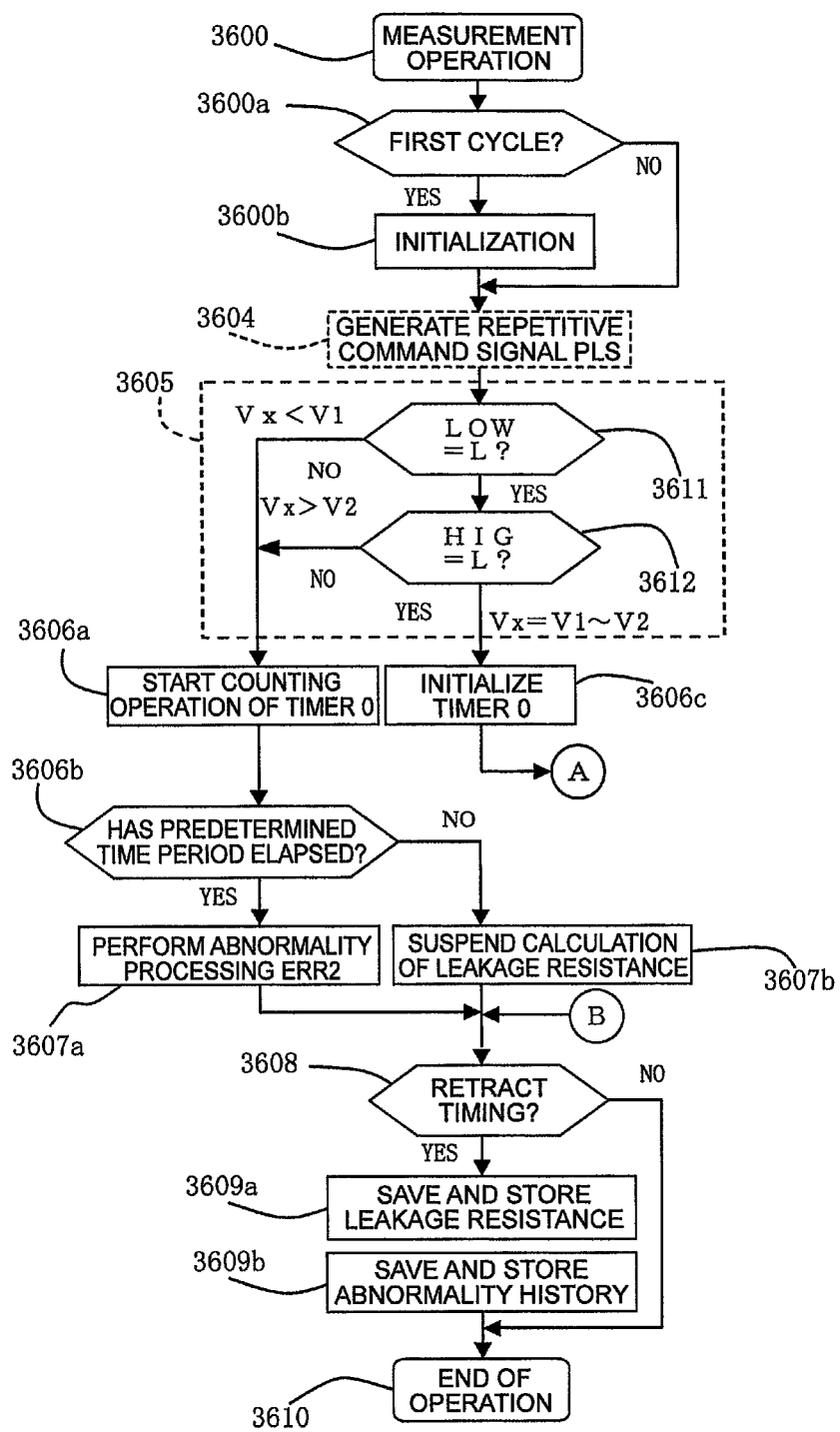
FIG. 14 is a first flowchart for describing the operation of the device of FIG. 12.
Figure 15:
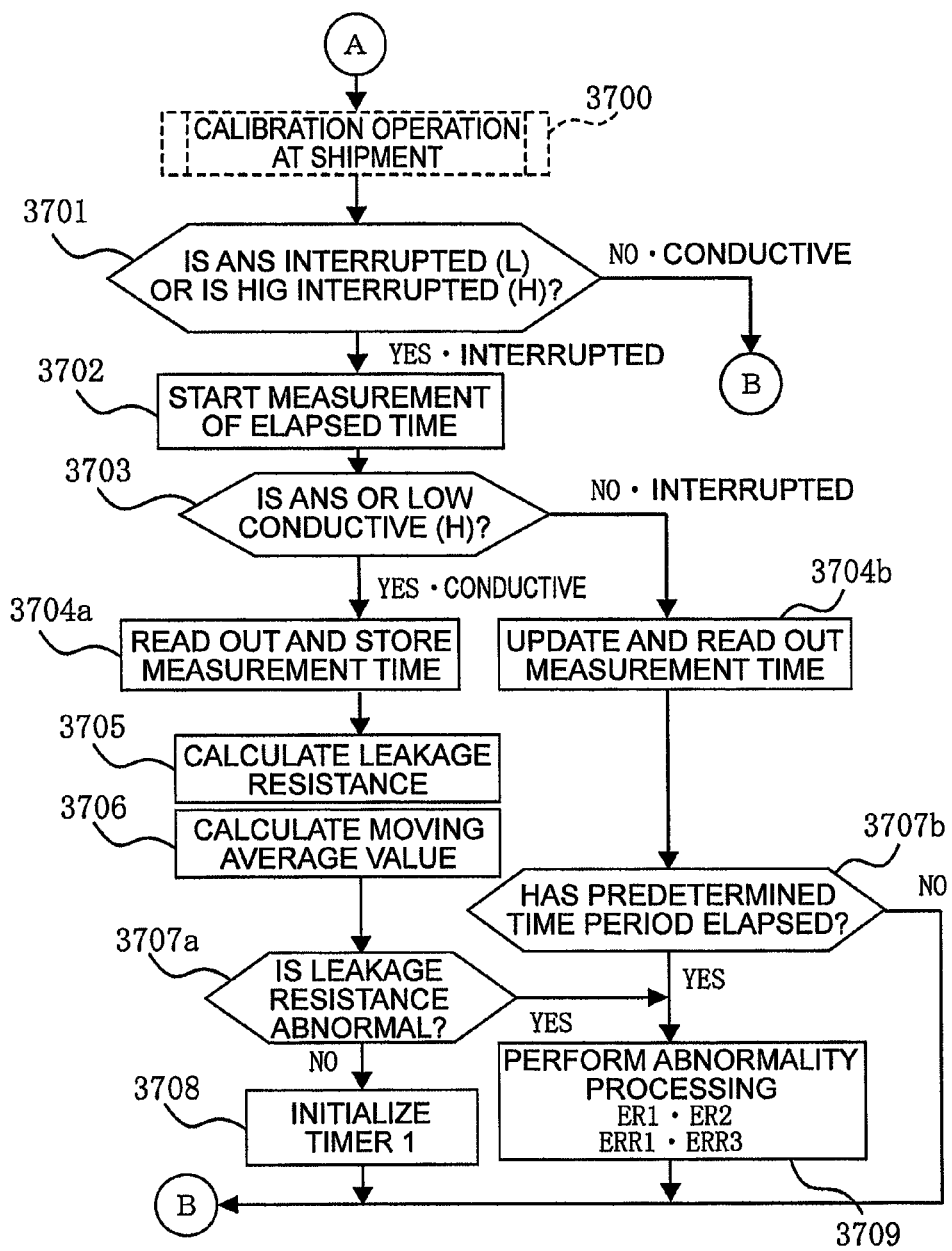
FIG. 15 is a second flowchart for describing the operation of the device of FIG. 12.

Next, the action and operation of the device of FIG. 12 are described in detail with reference to operation explanatory flowcharts illustrated in FIGS. 14 and 15, mainly focusing on the differences from FIGS. 6 and 7. Note that, the step numbers of FIGS. 6 and 7 are in the 1,000s while the step numbers of FIGS. 14 and 15 are in the 3,000s, and the same 3-digit or lower numbers represent the same or equivalent parts. Regarding the equivalent parts, however, the difference parts for which an additional description is necessary are described below.

Referring to the first flowchart of FIG. 14, Step 3604 indicated by a dotted line is a step necessary for generating the repetitive command signal PLS from the arithmetic control circuit 20C by causing the microprocessor 21 to execute logic processing equivalent to the first comparator 41a, the second comparator 41b, and the inversion memory circuit 52 illustrated in the monitoring signal processing circuit 40C in the state in which the analog signal voltage ANL proportional to the monitoring voltage Vx is input to the arithmetic control circuit 20C. In this case, the monitoring signal processing circuit 40C only needs to include the noise filter formed of the smoothing resistor 45 and the smoothing capacitor 46 and an operational amplifier.

A subsequent step block 3605 includes Step 3611 and Step 3612. Step 3611 is a determination step of monitoring the logic level of the first inverted logic signal LOW. When the monitoring voltage Vx is equal to or higher than the first threshold V1, it is determined to be YES and the flow proceeds to Step 3612. When the monitoring voltage Vx is lower than the first threshold V1, it is determined to be NO and the flow proceeds to Step 3606a.

Step 3612 is a determination step of monitoring the logic level of the second inverted logic signal HIG. When the monitoring voltage Vx is equal to or lower than the second threshold V2, it is determined to be YES and the flow proceeds to Step 3606c. When the monitoring voltage Vx exceeds the second threshold V2, it is determined to be NO and the flow proceeds to Step 3606a. Therefore, when the monitoring voltage Vx is in the proper range of the first threshold V1 or higher and the second threshold V2 or lower, the flow proceeds to Step 3606c, and when the monitoring voltage Vx deviates from the range of V1 to V2, the flow proceeds to Step 3606a.

Next referring to the second flowchart of FIG. 15, Step 3700 is a step block equivalent to Steps 2700a to 2700c of FIG. 11 described above. Step 3700 is calibration means at shipment, for measuring the value of the electrostatic capacitance C of the coupling capacitor 51 at the time of shipment adjustment and storing a calibrated value thereof.

Subsequent Step 3701 is a determination step of monitoring the logic level of the second inverted logic signal HIG. When the logic level is "H", it is determined to be YES and the flow proceeds to Step 3702. When the logic level is "L", it is determined to be NO and the flow proceeds to Step 3608 of FIG. 14 via a relay terminal B.

Note that, when it is determined to be YES in Step 3701, the logic level of the repetitive command signal PLS is "L" and the charge/discharge switching element 31 becomes non-conductive, and hence the monitoring voltage Vx starts decreasing gradually, and the transition time thereof is measured in subsequent Step 3702.

Subsequent Step 3703 is a determination step of monitoring the logic level of the first inverted logic signal LOW. When the logic level is "H", it is determined to be YES and the flow proceeds to Step 3704a. When the logic level is "L", it is determined to be NO and the flow proceeds to Step 3704b. Note that, when it is determined to be YES in Step 3703, the logic level of the repetitive command signal PLS is "H" and the charge/discharge switching element 31 becomes non-conductive, and hence the monitoring voltage Vx starts increasing rapidly, and the transition time Tx thereof is read out and stored in subsequent Step 3704a.

As described above, in Step 3701 and Step 3703, the start timing of the gradual decrease of the monitoring voltage Vx and the completion timing of the gradual decrease thereof are determined, respectively. Instead of using the first inverted logic signal HIG and the second inverted logic signal LOW, an inverted logic signal ANS serving as a band history logic signal may be used.

Note that, the calculation of the leakage resistance Rx in Step 3705 is performed in three manners. First, the calculation is performed based on the characteristics curve whose whole region is the negative-gradient curve region as represented by the curve 103 of FIG. 3. Second, the calculation is performed by using the negative-gradient curve region of a bell-shaped curve as represented by the curve 112 of FIG. 3. Third, the calculation is performed by using the positive-gradient curve region of a bell-shaped curve as represented by the curve 113 of FIG. 3. In any case, the value of the leakage resistance Rx is calculated from the measured value of the transition time Tx based on a function formula or a data table between the transition time coefficient and the leakage resistance coefficient β with the use of the threshold voltage coefficient γ=V0/Vcc as a parameter. However, in the third embodiment, the set threshold voltage V0 is a voltage value reduced from the control power supply voltage Vcc.

As an alternative abnormality determination method, instead of comparing the detected leakage resistance Rx with the preliminary leakage resistance Rxn or the limit leakage resistance Rx0, the preliminary transition time Txn or the limit transition time Tx0 corresponding to the preliminary leakage resistance Rxn or the limit leakage resistance Rx0 may be calculated in advance, and the actual transition time Tx may be compared with the preliminary transition time Txn or the limit transition time Tx0.

Further, in the case where the value of the reference time constant R0×C, which is the denominator of the transition time coefficient α, the value of the series resistance R0, which is the denominator of the leakage resistance coefficient β, or the value of the threshold voltage coefficient γ is treated as a fixed value, a formula or a data table between the transition time Tx and the leakage resistance Rx may be directly used as the function formula or the data table. In this case, the leakage resistance Rx can be calculated directly from the measured transition time Tx without performing complicated calculation processing during the operation.

However, in the case of varying the value of the threshold voltage coefficient γ, the denominator value of the transition time coefficient α, or the denominator value of the leakage resistance coefficient β in accordance with the applied types of vehicle or the operating state, it is advantageous to set the function formula or the data table using α, β, or γ, which are index values without unit. Alternatively, in the case where the arithmetic control circuit 20C has an analog input port, an operational amplifier may be provided instead of the first comparator 41a, the second comparator 41b, and the inversion memory circuit 52 of the monitoring signal processing circuit 400. In this case, the analog signal voltage ANL proportional to the monitoring voltage Vx can be input to the arithmetic control circuit 20C so that at least one of the inverted logic signals LOW, HIG, and ANS is generated by the microprocessor 21, and hence the repetitive command signal PLS can be generated.

In addition, in the third embodiment of FIG. 12, the connection point B is connected to the negative-side power supply line 67 of the on-board high voltage device 60X, but, even when the connection point B is connected to a positive-side power supply line, no change occurs in Expression I.

As is clear from the above description, according to the third embodiment of the present invention, there is provided the leakage resistance detection device 500 for an on-board high voltage device, which is connectable to the on-board high voltage device 60X including the on-board high voltage DC power source 61 and the high voltage electric load 64 to be fed and driven by the high voltage DC power source 61, the on-board high voltage device 60X having the leakage resistance Rx with respect to the vehicle body 11, as typified by the equivalent leakage resistance 65 on the positive potential side and the equivalent leakage resistance 66 on the negative potential side, the leakage resistance detection device 50C including the constant voltage control power source 25 which is fed and driven by the low voltage DC power source 10 having the negative terminal connected to the vehicle body 11 and which generates the control power supply voltage Vcc, the leakage resistance detection device 50C being configured to measure a value of the leakage resistance Rx via the coupling capacitor 51 having one terminal B connected to a predetermined position of the on-board high voltage device 60X, the leakage resistance detection device 50C further including the repetitive signal output circuit 30C, the monitoring signal processing circuit 40C, and the arithmetic control circuit 20C, the arithmetic control circuit 20C including the microprocessor 21 and the program memory 24C which cooperate with each other.

Further, the repetitive signal output circuit 30C alternately repeats, in response to the switching operation of the charge/discharge switching element 31 that operates in response to the repetitive command signal PLS, a charge period and a discharge period in which the measurement point A is intermittently connected to the control power supply voltage Vcc via the charge/discharge resistor 33 or 35, the measurement point A being another terminal of the coupling capacitor 51, to thereby gradually increase or gradually decrease the monitoring voltage Vx which is a potential between the measurement point A and the vehicle body 11. The monitoring signal processing circuit 40C is configured to: generate at least one of the inverted logic signals ANS, LOW, and HIG when a value of the monitoring voltage Vx, which gradually increases or gradually decreases at a gradient that becomes gentler as a charge/discharge time constant becomes larger, passes through a predetermined threshold voltage, and input the at least one of the inverted logic signals ANS, LOW, and HIG to the arithmetic control circuit 20C; or generate the analog signal voltage ANL proportional to the monitoring voltage Vx and input the analog signal voltage ANL to the arithmetic control circuit 20C. The arithmetic control circuit 20C is configured to: measure the transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance 65 on the positive potential side and the equivalent leakage resistance 66 on the negative potential side, based on a function formula or a data table relating to the transition time Tx and the leakage resistance Rx; and generate the resistance abnormality determination output ER1 when the leakage resistance Rx becomes equal to or smaller than the predetermined limit leakage resistance Rx0 or when the transition time Tx reaches the limit transition time Tx0 corresponding to the predetermined limit leakage resistance Rx0. The repetitive command signal PLS is a pulse signal with a variable cycle in which an output pulse is inverted when the transition time Tx is reached.

The repetitive signal output circuit 30C is configured to, in response to the switching operation of the charge/discharge switching element 31, connect the measurement point A being the another terminal of the coupling capacitor 51 to an output terminal of the constant voltage control power source 25 via the rapid charge/discharge resistor 35 having the reference value Rq, or connect the measurement point A to the negative terminal having a vehicle body potential via the reference resistor 33 having the resistance value Rs which is sufficiently larger than the resistance value Rq, to thereby rapidly increase or gradually decrease the monitoring voltage Vx which is the potential between the measurement point A and the vehicle body 11. The monitoring signal processing circuit 40C is configured to: generate the first inverted logic signal ANS or LOW when the value of the monitoring voltage Vx, which gradually decreases at a gradient that becomes gentler as the time constant (Rs+Rx)C being a product of a sum of the resistance value Rs (Rs>>Rq) and the leakage resistance Rx and the electrostatic capacitance C of the coupling capacitor 51 becomes larger, has decreased to pass through the first threshold V1, and input the first inverted logic signal ANS or LOW to the arithmetic control circuit 20C; or generate the analog signal voltage ANL proportional to the monitoring voltage Vx and input the analog signal voltage ANL to the arithmetic control circuit 20C. The monitoring signal processing circuit 40C is further configured to: generate the second inverted logic signal ANS or HIG when the value of the monitoring voltage Vx, which rapidly increases at a gradient that becomes steeper as the time constant (Rq+Rx) C becomes smaller, has increased to pass through the second threshold V2 which is close to the control power supply voltage Vcc, and input the second inverted logic signal ANS or HIG to the arithmetic control circuit 20C; or generate the analog signal voltage ANL proportional to the monitoring voltage Vx and input the analog signal voltage ANL to the arithmetic control circuit 20C.

The arithmetic control circuit 20C receives the second inverted logic signal ANS or HIG as an input or generates the second inverted logic signal ANS or HIG based on the input analog signal voltage ANL, and the arithmetic control circuit receives the first inverted logic signal ANS or LOW as an input or generates the first inverted logic signal ANS or LOW based on the input analog signal voltage ANL. The arithmetic control circuit 20C measures, as the transition time Tx, a time period from when the second inverted logic signal ANS or HIG is generated to when the first inverted logic signal ANS or LOW is obtained. The arithmetic control circuit 20C or the monitoring signal processing circuit 40C inverts the repetitive command signal PLS when the first inverted logic signal ANS or LOW and the second inverted logic signal ANS or HIG are input or generated. The first inverted logic signal and the second inverted logic signal are a pair of logic signals of the first logic signal LOW whose output logic changes before and after the first threshold V1 and the second logic signal HIG whose output logic changes before and after the second threshold V2, or the band history logic signal ANS which becomes a first logic state of "L" or "H" when the value of the monitoring voltage Vx has increased to the second threshold V2 or higher after decreasing to the first threshold V1 or lower and which becomes a second logic state of "H" or "L" when the value of the monitoring voltage Vx has decreased to the first threshold V1 or lower after increasing to the second threshold V2 or higher.

As described above, in connection with claim 5 of the present invention, the repetitive signal output circuit charges and discharges the coupling capacitor, and the arithmetic control circuit measures, as the transition time Tx, a time period during which the monitoring voltage Vx decreases to the first threshold V1 from the second threshold V2 which is set to a value close to the control power supply voltage Vcc. Further, the monitoring signal processing circuit or the arithmetic control circuit inverts the pulse output when the monitoring voltage Vx has decreased to pass through the first threshold V1 and when the monitoring voltage Vx has increased to pass through the second threshold V2.

Therefore, the output pulse is inverted along with the completion of the measurement of the transition time Tx, and the output pulse is inverted immediately after the confirmation of the completion of the charge/discharge, and hence the occurrence frequency of the repetitive command signal PLS becomes shortened as the leakage resistance becomes smaller. Thus, abnormality can be detected quickly.

As is clear from the above description, according to the third embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30C is represented by R0, and when a time period during which the monitoring voltage Vx decreases gradually from a state of the control power supply voltage Vcc to the predetermined threshold voltage (Vcc−V0) is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20C, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; selectively using a negative-gradient curve region following the positive-gradient curve region or a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region; determining, when the transition time Tx has become a value equal to or larger than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the short-circuit transition time Tx00 corresponding to a case where the leakage resistance Rx becomes 0.

As is clear from the above description, according to the third embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30C is represented by R0, and when a time period during which the monitoring voltage Vx decreases gradually from a state of the control power supply voltage Vcc to the predetermined threshold voltage (Vcc−V0) is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20C, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; excluding in advance, by the characteristics curve correction means, application of a negative-gradient curve region following the positive-gradient curve region; determining the threshold voltage coefficient γ so that a value of the transition time coefficient α when the value of the leakage resistance Rx has reached the limit leakage resistance Rx0 is included in the corrected positive-gradient curve region; determining, when the transition time Tx has become a value equal to or smaller than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the open-circuit transition time Txm corresponding to a case where the leakage resistance Rx is infinite.

Fourth Embodiment

Figure 16:
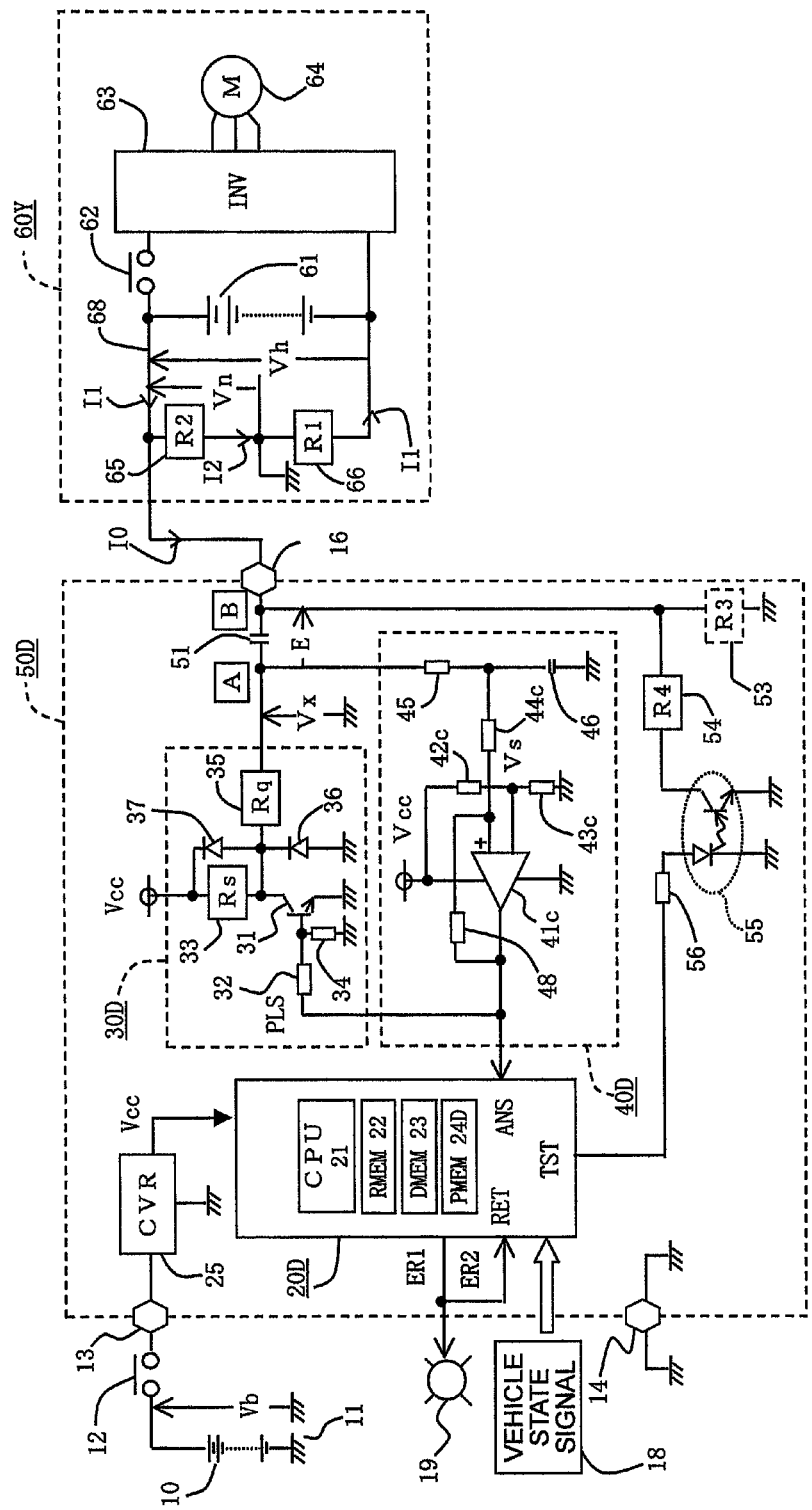
FIG. 16 is an overall configuration diagram of a device according to a fourth embodiment of the present invention.

Referring to FIG. 16 which is an overall configuration diagram of a device according to a fourth embodiment of the present invention, the differences from FIG. 1 are mainly described below. In the drawings, the same reference symbols denote the same or equivalent parts. In FIG. 16, a leakage resistance detection device 50D includes an arithmetic control circuit 20D, a repetitive signal output circuit 30D, and a monitoring signal processing circuit 40D, and detects a leakage resistance of an on-board high voltage device 60Y.

The first main difference is that, in the on-board high voltage device 60Y, a positive-side power supply line 68 is connected to one terminal B of the coupling capacitor 51 via the interconnection terminal 16, and the positive-side equivalent leakage resistor 65 has an equivalent leakage resistance R2 on the interconnection side while the negative-side equivalent leakage resistor 66 has an equivalent leakage resistance R1 on the non-interconnection side.

The second main difference is that the repetitive signal output circuit 30D is supplied with a repetitive command signal PLS having a variable cycle from the monitoring signal processing circuit 40D.

The third main difference is that, in the monitoring signal processing circuit 40D, a comparator 41c has an output terminal and a positive input terminal connected to each other via a positive feedback resistor 48, and the positive input terminal is connected to a measurement point A via an input resistor 44c and a noise filter formed of a smoothing resistor 45 and a smoothing capacitor 46. The comparator 41c has a negative input terminal applied with a comparison reference voltage Vs obtained by dividing the control power supply voltage Vcc by voltage dividing resistors 42c and 43c. An output of the comparator 41c configured as described above is input to the arithmetic control circuit 20D as an inverted logic signal ANS serving as a band history logic signal.

When the set threshold voltage V0 is set to V2, a series combined resistance value of the input resistor 44c and the smoothing resistor 45 is represented by R44, and a resistance value of the positive feedback resistor 48 is represented by R48, a value expressed by Expression (8) is applied to the value of the comparison reference voltage Vs.

$$Vs = V0 \times R48/(R44+R48) \quad (8)$$

The value of the monitoring voltage Vx at which the output logic of the comparator 41c forming a hysteresis circuit returns to "L" from "H" is set to V1≈0. In this case, it is only necessary to determine the resistance values R44 and R48 so as to have the relationship of Expression (9).

$$Vs = Vcc \times R44/(R44+R48) \quad (9)$$

According to Expressions (8) and (9), at the timing at which the value of the monitoring voltage Vx has increased to the determination threshold V0=V2, the logic level of the inverted logic signal ANS which is the output of the comparator 41c becomes "H". Once the logic level of the inverted logic signal ANS becomes "H", the comparator 41c performs a hysteresis operation so that the current output logic may be maintained until the value of the monitoring voltage Vx decreases to V1≈0.

The fourth main difference is that a series circuit of a test leakage resistor 54 and a test switching element 55 is connected between the interconnection terminal 16 and the vehicle body 11. The test switching element 55, such as an optical isolation transistor, receives a conduction command via a drive resistor 56 from a test operation command TST provided to the arithmetic control circuit 20D. A test resistance R4 which is a resistance value of the test leakage resistor 54 is equal to, for example, the limit leakage resistance Rx0 or the preliminary leakage resistance Rxn. The test switching element 55 becomes conductive temporarily at the start of operation immediately after the manual power supply switch (not shown) is closed and the low voltage power supply switch 12 is closed.

In this way, pre-operation inspection is performed to check whether detection control of the leakage resistance is performed correctly or not, and it is also possible to detect individual fluctuations in electrostatic capacitance C of the coupling capacitor 51 and the secular change thereof so that the calibrated value of the electrostatic capacitance C may be used.

A microprocessor 21 provided in the arithmetic control circuit 20D cooperates with a program memory 24D and measures the value of a leakage resistance Rx. The microprocessor 21 generates a pre-alarm output ER2 when the measured value of the leakage resistance Rx becomes equal to or smaller than a predetermined preliminary leakage resistance Rxn, and generates a resistance abnormality determination output ER1 when the measured value becomes equal to or smaller than a limit leakage resistance Rx0. The resistance abnormality determination output ER1 and the pre-alarm output ER2 are output to the abnormality alarm device 19, and fed back to be input to the arithmetic control circuit 20D as a report command acknowledge signal RET so as to check whether the output for abnormality alarming has been generated correctly.

Note that, similarly to FIG. 1, the low voltage DC power source 10, the low voltage power supply switch 12, the vehicle state signal 18, and the abnormality alarm device 19 are connected outside the leakage resistance detection device 50D, and the constant voltage control power source 25 that generates the control power supply voltage Vcc is provided in the leakage resistance detection device 50D.

Hereinafter, the action and operation of the device according to the fourth embodiment of the present invention configured as illustrated in FIG. 16 are briefly described with reference to a time chart of FIG. 17 as well as FIG. 16. First, in FIG. 16, when the manual power supply switch (not shown) is closed and the low voltage power supply switch 12 is closed, the constant voltage control power source 25 generates a predetermined control power supply voltage Vcc. The microprocessor 21 then starts its control operation.

Figure 17:
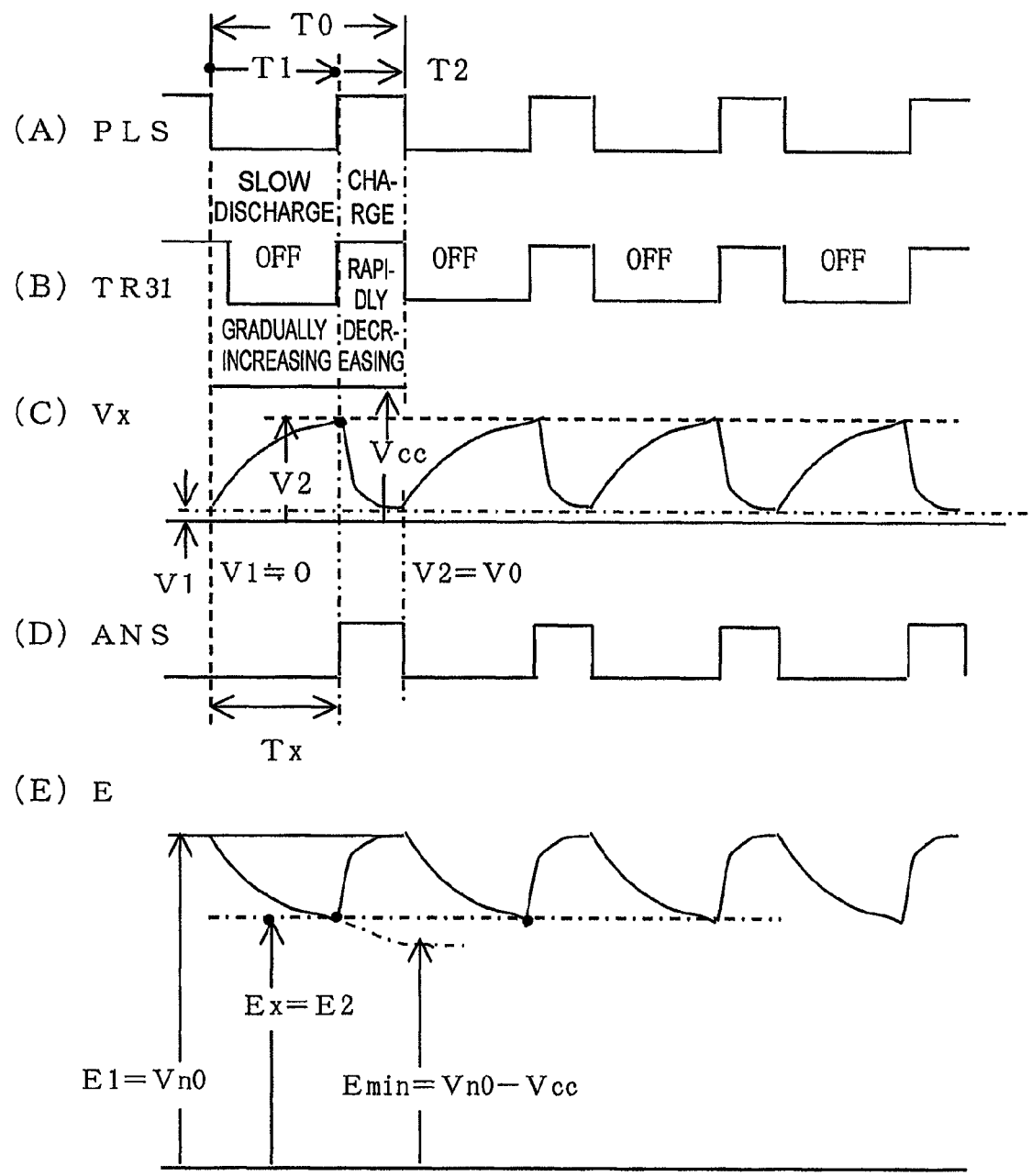
FIG. 17 is a time chart for describing the operation of the device of FIG. 16.

Part (A) of FIG. 17 shows the waveform of the repetitive command signal PLS generated by the monitoring signal processing circuit 40D. A first period (slow discharge period) T1 in which the repetitive command signal PLS has a logic level "L" and a second period (rapid charge period) T2 in which the repetitive command signal PLS has a logic level "H" have different values each occupying a part of the whole cycle T0=T1+T2.

In FIG. 16, when the logic level of the repetitive command signal PLS is "L" (or "H"), the charge/discharge switching element 31 is interrupted (or becomes conductive) as shown in part (B) of FIG. 17. Then, in FIG. 16, when the charge/discharge switching element 31 is interrupted, the coupling capacitor 51 is slowly discharged side via a series circuit of the leakage resistance Rx, the rapid charge/discharge resistor 35, and the charge/discharge resistor 33, with the result that the monitoring voltage Vx increases gradually along with the decrease in charge current. On the other hand, in FIG. 16, when the charge/discharge switching element 31 becomes conductive, the coupling capacitor 51 is rapidly charged via a series circuit of the rapid charge/discharge resistor 35 and the leakage resistance Rx, with the result that the monitoring voltage Vx decreases rapidly.

Part (C) of FIG. 17 shows how the monitoring voltage Vx increases gradually or decreases rapidly. The gradient of the charge/discharge characteristics becomes gentler as the charge/discharge time constants expressed in Expressions (8y) and (9y) above become larger. $\tau 1=(R0+Rx)C$ is a slow discharge time constant, and $\tau 2=(Rq+Rx)C$ is a rapid charge time constant.

In part (C) of FIG. 17, the value of the slowly-discharged monitoring voltage Vx increases gradually to the first end voltage V2 at the end of the first period T1. At this time, the logic level of the inverted logic signal ANS which is the output of the comparator 41*c* changes from "L" to "H". As a result, the charge/discharge switching element 31 becomes conductive to start the rapid charge of the coupling capacitor 51.

The value of the rapidly-charged monitoring voltage Vx decreases rapidly to the second end voltage V1≈0. At this time, the logic level of the inverted logic signal ANS which is the output of the comparator 41*c* changes from "H" to "L", and the logic level of the inversion memory circuit 52 becomes "L". As a result, the charge/discharge switching element 31 is interrupted to start the slow discharge of the coupling capacitor 51.

Note that, in order to prevent waiting for the monitoring voltage Vx to completely converge to 0 volts at the end of the second period T2, a residual error ΔV of about V1=0.03Vcc is added to the set threshold voltage V0.

Part (D) of FIG. 17 shows the generated waveform of the inverted logic signal ANS which is the output of the comparator 41*c*. The inverted logic signal ANS and the repetitive command signal PLS are the same signal. A measurement time Tx is a period in which the logic level of the inverted logic signal ANS is "L" and the monitoring voltage Vx increases gradually from the first initial voltage V10 to the first end voltage V2=V0.

Part (E) of FIG. 17 shows the waveform of the both-end voltage E of the coupling capacitor 51. A discharge initial voltage (=charge end voltage) E1 is equal to the stable divided voltage Vn0 expressed in Expression (4y). The value of a discharge end voltage (=charge initial voltage) E2 decreases to Vn0−Vcc in the case where the discharge period T1 is infinite.

The following demonstrates that the calculation can be performed using the threshold voltage coefficient γ of V0/Vcc similarly to the case of FIG. 1 so that the characteristics charts of FIGS. 3 to 5 can be applied as they are. Note that, the generation frequency of the repetitive command signal PLS is a fixed value in the first and second embodiments, but in the third and fourth embodiments, the first period T1 and the second period T2 are automatically changed in accordance with the value of the leakage resistance Rx so that the next repetitive command signal PLS may be generated quickly after the completion of the measurement of the transition time Tx. Further, the transition to the next first period T1 is performed after the confirmation that the monitoring voltage Vx has decreased to a value close to and hence it is unnecessary to provide a delay time to the second period T2 with respect to the second end voltage V1 unlike part (C) of FIG. 2.

The following demonstrates that Expression I shown at the top of FIG. 3 is applicable similarly in the fourth embodiment of FIG. 16.

Discharge Period

In the slow discharge period in which the logic level of the repetitive command signal PLS in FIG. 16 is "L" and the transistor serving as the charge/discharge switching element 31 is opened, Expression (30bb) is established.

$$C \times R0(dE/dt)=Vx-Vcc \tag{30bb}$$

where $R0=Rs+Rq \approx Rs >> Rq$

Vx in Expression (30bb) is substituted into Expression (7y) above to obtain Expression (31bb).

$$Vn0-Vcc=\tau 1(dE/dt)+E \tag{31bb}$$

where $\tau 1=(R0+Rx) \times C$

In the differential equation (31bb), the initial value of E at the time t=0 is represented by E1 and the value of E at the infinite time is represented by Vn0−Vcc. Then, a solution expressed by Expression (32bb) is obtained.

$$E=E1 \exp(-t/\tau 1)+(Vn0-Vcc)\{1-\exp(-t/\tau 1)\} \tag{32bb}$$

In addition, the value of (dE/dt) in Expression (30bb) is substituted into Expression (7y) above to obtain Expression (33bb).

$$Vx/(R0//Rx)=(Vn0-E)/Rx+Vcc/R0 \tag{33bb}$$

where R0//Rx represents the parallel combined resistance of R0 and Rx.

Charge Period

In the rapid charge period in which the logic level of the repetitive command signal PLS in FIG. 16 is "H" and the transistor serving as the charge/discharge switching element 31 is closed, Expression (30aa) is established.

$$Vx=Rq \times C(dE/dt)=0 \tag{30aa}$$

Vx in Expression (30aa) is substituted into Expression (7y) above to obtain Expression (31aa).

$$Vn0=E+\tau 2 \times (dE/dt) \tag{31aa}$$

where $\tau 2=(Rq+Rx)C$

In the differential equation (31aa), the initial value of E at the time t=0 is represented by E2 and the value of E at the infinite time is represented by Vnc−Vcc. Then, a solution expressed by Expression (32aa) is obtained.

$$E=E2 \exp(-t/\tau 2)+(Vn0-Vcc)\{1-\exp(-t/\tau 2)\} \tag{32aa}$$

In addition, the value of (dE/dt) in Expression (30aa) is substituted into Expression (7y) above to obtain Expression (33aa).

$$Vx/(Rq//Rx)=(Vn0-E)/Rx \tag{33aa}$$

where Rq//Rx represents the parallel combined resistance of Rq and Rx.

Stable State

In the stable state in which the logic level of the repetitive command signal PLS in FIG. 16 is inverted alternately in the discharge period T1 and the charge period T2 and there is no change in the value of the leakage resistance Rx and in the output voltage Vh of the high voltage DC power source 61, the initial values E1 and E2 in Expressions (32bb) and (32aa) are calculated as follows. First, in Expression (32bb), at the discharge end time t=T1, E=E2 is established, and hence Expression (34bb) is established.

$$E2=E1 \times K1+(Vn0-Vcc)(1-K1) \tag{34bb}$$

where $K1=\exp(-T1/\tau 1)$

In addition, in Expression (32aa), at the charge end time t=T2, E=E1 is established, and hence Expression (34aa) is established.

$$E1=E2 \times K2+Vn0(1-K2) \tag{34aa}$$

where $K2=\exp(-T2/\tau 2)$

From Expressions (34bb) and (34aa), Expressions (35bb) and (35aa) are obtained.

$$Vn0-E1=Vcc \times K0 \times K2 \tag{35bb}$$

$$Vn0-E2=Vcc \times K0 \tag{35aa}$$

where $K0=(1-K1)/(1-K1 \times K2)$

In the case of Fourth Embodiment In FIGS. 16 and 17, at the discharge start time t=0, Vx1=V1≈0 is established. At the time Tx=T1, if the value of Vx becomes equal to the set threshold voltage V2=V0, Expression (39bb) for the time t=Tx is calculated from Expression (32bb). Note that, the value of the discharge initial voltage E1 is Vn0−VccKoK2≈Vn0 by Expression (35b) and Kx=exp(−T1/τ1)=K1 is established.

$$Ex=Vn0\exp(-Tx/\tau1)+(Vn0-Vcc)\{1-\exp(-Tx/\tau1)\}=Vn0-Vcc(1-Kx) \quad (39bb)$$

Expression (40bb) is obtained from Expressions (33bb) and (39bb).

$$V0/(R0 \,//\, Rx) = (Vn0 - Ex)/Rx + Vcc/R0 \quad (40bb)$$
$$= Vcc/(R0 \,//\, Rx) - VccKx/Rx$$

Then, the threshold voltage coefficient γ of V0/Vcc, the leakage resistance coefficient β of Rx/R0, and the transition time coefficient α of Tx/(R0C) are substituted into Expression (40bb), and Expression (41) is obtained.

$$\gamma=(1+\beta-Kx)/(1+\beta)$$
$$\therefore Kx=(1+\beta)\times(1-\gamma) \quad (41)$$

Kx=exp[−Tx/{(R0+Rx)C}]=exp{−α/(1+β)} is established, and hence Expression (42) is obtained through natural logarithm conversion.

$$\alpha=(1+\beta)\mathrm{LOG}\,e(1/Kx) \quad (42)$$

Expressions (41) and (42) correspond to Expression I shown at the top of FIG. 3.

Figure 18:
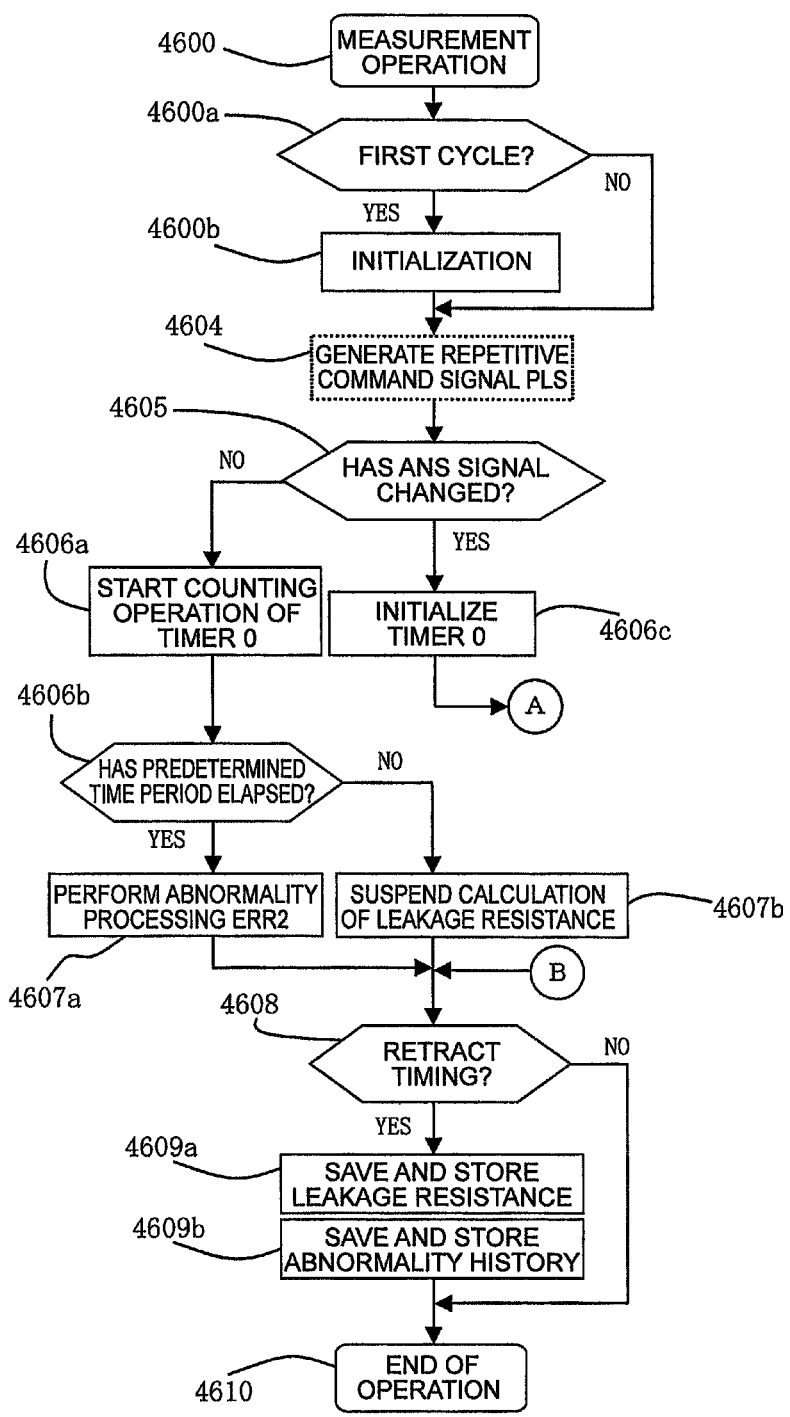
FIG. 18 is a first flowchart for describing the operation of the device of FIG. 16.
Figure 19:
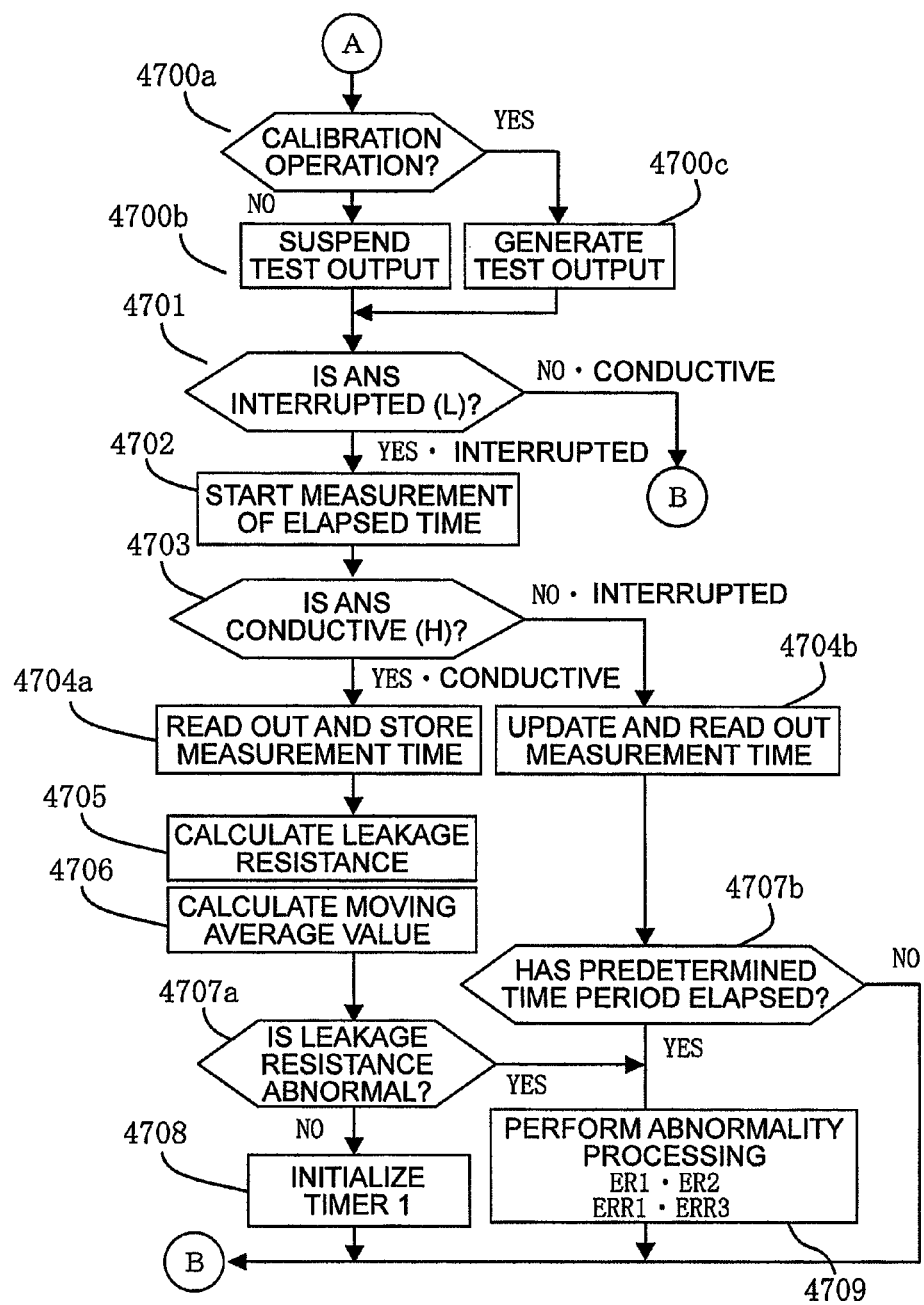
FIG. 19 is a second flowchart for describing the operation of the device of FIG. 16.

Next, the action and operation of the device of FIG. 16 are described in detail with reference to operation explanatory flowcharts illustrated in FIGS. 18 and 19, mainly focusing on the differences from FIGS. 6 and 7. Note that, the step numbers of FIGS. 6 and 7 are in the 1,000s while the step numbers of FIGS. 18 and 19 are in the 4,000s, and the same 3-digit or lower numbers represent the same or equivalent parts. Regarding the equivalent parts, however, the difference parts for which an additional description is necessary are described below.

Referring to the first flowchart of FIG. 18, Step 4604 indicated by a dotted line is a step necessary for generating the repetitive command signal PLS from the arithmetic control circuit 20D by causing the microprocessor 21 to execute logic processing equivalent to the hysteresis circuit formed of the comparator 41c illustrated in the monitoring signal processing circuit 40D in the state in which the analog signal voltage ANL proportional to the monitoring voltage Vx is input to the arithmetic control circuit 20D. In this case, the monitoring signal processing circuit 40D only needs to include the noise filter formed of the smoothing resistor 45 and the smoothing capacitor 46 and an operational amplifier.

Subsequent Step 4605 is a determination step of determining whether the logic of the inverted logic signal ANS input to the microprocessor 21 has changed or not. When the logic has changed in the period of one cycle of the repetitive command signal PLS, it is determined to be YES and the flow proceeds to Step 4606c. When the logic has not changed, it is determined to be NO and the flow proceeds to Step 4606a. The determination of YES in Step 4605 indicates that the value of the monitoring voltage Vx is in the proper range of 0 to Vcc and has increased or decreased to pass through the set threshold voltage V0.

Next referring to the second flowchart of FIG. 19, Step 4700a is a step of determining whether to perform calibration operation. In the case of measuring a calibrated value of the electrostatic capacitance C of the coupling capacitor 51 at the time of shipping inspection of the leakage resistance detection device 50D, or immediately after the low voltage power supply switch 12 is closed to feed the leakage resistance detection device 50D at the time of the actual operation of the leakage resistance detection device 50D, it is determined to be YES and the flow proceeds to Step 4700c. After the completion of the calibration operation, it is determined to be NO and the flow proceeds to Step 4700b.

Step 4700c is a step serving as operational calibration means, in which a test flag is set in the case of shipping adjustment operation while a test operation command TST is generated at the start of the actual operation, and the flow proceeds to Step 4701. Step 4700b is a step in which the test flag generated in Step 4700c is reset and the test operation command TST is suspended, and the flow proceeds to Step 4701.

In the case of the shipping adjustment operation, the arithmetic control circuit 20D measures the leakage resistance Rx in Step 4706 to be described below in the state in which the coupling capacitor 51 and the on-board high voltage device 60Y are not connected to each other. The arithmetic control circuit 20B calibrates and stores the value of the electrostatic capacitance C of the coupling capacitor 51 so that the obtained result may become the additional resistance R3 of the bypass leakage resistance 53.

At the start of the actual operation, the arithmetic control circuit 20D closes the test switching element 55 temporarily at the start of the operation, and determines whether the resistance abnormality determination output ER1 is activated for a moment or whether the pre-alarm output ER2 operates for a moment when the leakage resistance Rx becomes equal to or smaller than the preliminary leakage resistance Rxn, to thereby inspect whether the operation of detecting the leakage resistance Rx can be performed normally. When the inspection result shows that the detection operation is abnormal, the resistance abnormality determination output ER1 or the pre-alarm output ER2 is generated continuously or intermittently. When the inspection result shows that the detection operation is normal, the output generation is suspended for such a short period of time that the abnormality alarm device 19 to be driven by the resistance abnormality determination output ER1 or the pre-alarm output ER2 does not operate.

Further, the arithmetic control circuit 20D closes the test switching element 55 at the start of the operation to measure the value of a first combined leakage resistance in the state in which the test leakage resistor 54, the bypass leakage resistor 53, and the actual leakage resistance Rx are connected in parallel, and measures the value of a second combined leakage resistance in the state in which the test switching element 55 is opened and the bypass leakage resistor 53 and the actual leakage resistance Rx are connected in parallel. The arithmetic control circuit 20D back-calculates the electrostatic capacitance C of the coupling capacitor 51 based on the values of the first and second leakage resistances, and stores the calculated electrostatic capacitance C as a calibrated value. The calibrated value is calculated so that the actual leakage resistances Rx in the open-circuit and closed-circuit states of the test switching element 55 may have the same value owing to the calibrated and stored electrostatic capacitance C.

Subsequent Step 4701 is a determination step of monitoring the logic level of the inverted logic signal ANS. When the logic level is "L", it is determined to be YES and the flow proceeds to Step 4702. When the logic level is "H", it is determined to be NO and the flow proceeds to Step 4608 of FIG. 18 via a relay terminal B.

Note that, when it is determined to be YES in Step 4701, the logic level of the repetitive command signal PLS is "L" and the charge/discharge switching element 31 becomes non-conductive, and hence the monitoring voltage Vx starts decreasing gradually, and the transition time thereof is measured in subsequent Step 4702.

Subsequent Step 4703 is a determination step of monitoring the logic level of the inverted logic signal ANS. When the logic level is "H", it is determined to be YES and the flow proceeds to Step 4704a. When the logic level is "L", it is determined to be NO and the flow proceeds to Step 4704b of FIG. 14.

Note that, when it is determined to be YES in Step 4703, the logic level of the repetitive command signal PLS is "H" and the charge/discharge switching element 31 becomes conductive, and hence the monitoring voltage Vx starts increasing rapidly, and the transition time Tx thereof is read out and stored in subsequent Step 4704a. As described above, in Step 4701 and Step 4703, the start timing of the gradual increase of the monitoring voltage Vx and the completion timing of the gradual increase thereof are determined, respectively.

Note that, the calculation of the leakage resistance Rx in Step 4705 is performed in three manners. First, the calculation is performed based on the characteristics curve whose whole region is the negative-gradient curve region as represented by the curve 103 of FIG. 3. Second, the calculation is performed by using the negative-gradient curve region of a bell-shaped curve as represented by the curve 112 of FIG. 3. Third, the calculation is performed by using the positive-gradient curve region of a bell-shaped curve as represented by the curve 113 of FIG. 3. In any case, the value of the leakage resistance Rx is calculated from the measured value of the transition time Tx based on a function formula or a data table between the transition time coefficient $\alpha$ and the leakage resistance coefficient $\beta$ with the use of the threshold voltage coefficient $\gamma = V0/Vcc$ as a parameter.

As an alternative abnormality determination method, instead of comparing the detected leakage resistance Rx with the preliminary leakage resistance Rxn or the limit leakage resistance Rx0, the preliminary transition time Txn or the limit transition time Tx0 corresponding to the preliminary leakage resistance Rxn or the limit leakage resistance Rx0 may be calculated in advance, and the actual transition time Tx may be compared with the preliminary transition time Txn or the limit transition time Tx0.

Further, in the case where the value of the reference time constant R0×C, which is the denominator of the transition time coefficient $\alpha$, the value of the series resistance R0, which is the denominator of the leakage resistance coefficient $\beta$, or the value of the threshold voltage coefficient $\gamma$ is treated as a fixed value, a formula or a data table between the transition time Tx and the leakage resistance Rx may be directly used as the function formula or the data table. In this case, the leakage resistance Rx can be calculated directly from the measured transition time Tx without performing complicated calculation processing during the operation.

However, in the case of varying the value of the threshold voltage coefficient $\gamma$, the denominator value of the transition time coefficient $\alpha$, or the denominator value of the leakage resistance coefficient $\beta$ in accordance with the applied types of vehicle or the operating state, it is advantageous to set the function formula or the data table using $\alpha$, $\beta$, or $\gamma$, which are index values without unit. Alternatively, in the case where the arithmetic control circuit 20D has an analog input port, an operational amplifier may be provided instead of the hysteresis circuit formed of the comparator 41c of the monitoring signal processing circuit 40D. In this case, the analog signal voltage ANL proportional to the monitoring voltage Vx can be input to the arithmetic control circuit 20D so that at least one of the inverted logic signals LOW, HIG, and ANS is generated by the microprocessor 21, and hence the repetitive command signal PLS can be generated.

In addition, in the fourth embodiment of FIG. 16, the connection point B is connected to the positive-side power supply line 68 of the on-board high voltage device 60Y, but, even when the connection point B is connected to a negative-side power supply line, no change occurs in Expression I.

As is clear from the above description, according to the fourth embodiment of the present invention, there is provided the leakage resistance detection device 509 for an on-board high voltage device, which is connectable to the on-board high voltage device 60Y including the on-board high voltage DC power source 61 and the high voltage electric load 64 to be fed and driven by the high voltage DC power source 61, the on-board high voltage device 60Y having the leakage resistance Rx with respect to the vehicle body 11, as typified by the equivalent leakage resistance 65 on the positive potential side and the equivalent leakage resistance 66 on the negative potential side, the leakage resistance detection device 50D including the constant voltage control power source 25 which is fed and driven by the low voltage DC power source 10 having the negative terminal connected to the vehicle body 11 and which generates the control power supply voltage Vcc, the leakage resistance detection device 50D being configured to measure a value of the leakage resistance Rx via the coupling capacitor 51 having one terminal B connected to a predetermined position of the on-board high voltage device 60Y, the leakage resistance detection device 50D further including the repetitive signal output circuit 30D, the monitoring signal processing circuit 40D, and the arithmetic control circuit 20D, the arithmetic control circuit 20D including the microprocessor 21 and the program memory 24D which cooperate with each other.

Further, the repetitive signal output circuit 30D alternately repeats, in response to the switching operation of the charge/discharge switching element 31 that operates in response to the repetitive command signal PLS, a charge period and a discharge period in which the measurement point A is intermittently connected to the control power supply voltage Vcc via the charge/discharge resistor 33 or 35, the measurement point A being another terminal of the coupling capacitor 51, to thereby gradually increase or gradually decrease the monitoring voltage Vx which is a potential between the measurement point A and the vehicle body 11. The monitoring signal processing circuit 40D is configured to: generate the inverted logic signal ANS when a value of the monitoring voltage Vx, which gradually increases or gradually decreases at a gradient that becomes gentler as a charge/discharge time constant becomes larger, passes through a predetermined threshold voltage, and input the inverted logic signal ANS to the arithmetic control circuit 20D; or generate the analog signal voltage ANL proportional to the monitoring voltage Vx and input the analog signal voltage ANL to the arithmetic control circuit 20D. The arithmetic control circuit 20D is configured to: measure the transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance 65 on the positive potential side and the equivalent leakage resistance 66 on the negative potential side, based on a function formula or a data table relating to the transition time Tx and the leakage resistance Rx; and generate the resistance abnormality determination output ER1 when the leakage resistance Rx becomes equal to or smaller than the predetermined limit leakage resistance Rx0 or when the transition time Tx reaches the limit transition time Tx0 corresponding to the predetermined limit leakage resistance Rx0. The repetitive command signal PLS is a pulse signal with a variable cycle in which an output pulse is inverted when the transition time Tx is reached.

The repetitive signal output circuit 30D is configured to, in response to the switching operation of the charge/discharge switching element 31, connect the measurement point A being the another terminal of the coupling capacitor 51 to an output terminal of the constant voltage control power source 25 via the reference resistor 33 having the resistance value Rs, or connect the measurement point A to the negative terminal having a vehicle body potential via the rapid charge/discharge resistor 35 having the reference value Rq which is sufficiently smaller than the resistance value Rs, to thereby gradually increase or rapidly decrease the monitoring voltage Vx which is the potential between the measurement point A and the vehicle body 11. The monitoring signal processing circuit 40D is configured to: generate the second inverted logic signal ANS or HIG when the value of the monitoring voltage Vx, which gradually increases at a gradient that becomes gentler as the time constant (Rs+Rx)C being a product of a sum of the resistance value Rs (Rs>>Rq) and the leakage resistance Rx and the electrostatic capacitance C of the coupling capacitor 51 becomes larger, has increased to pass through the second threshold V2, and input the second inverted logic signal ANS or HIG to the arithmetic control circuit 20D; or generate the analog signal voltage ANL proportional to the monitoring voltage Vx and input the analog signal voltage ANL to the arithmetic control circuit 20D. The monitoring signal processing circuit 40D is further configured to: generate the first inverted logic signal ANS or LOW when the value of the monitoring voltage Vx, which rapidly decreases at a gradient that becomes steeper as the time constant (Rq+Rx) C becomes smaller, has decreased to pass through the first threshold V1 which is close to 0 volts, and input the first inverted logic signal ANS or LOW to the arithmetic control circuit 20D; or generate the analog signal voltage ANL proportional to the monitoring voltage Vx and input the analog signal voltage ANL to the arithmetic control circuit 20D.

The arithmetic control circuit 20D receives the second inverted logic signal ANS or HIG as an input or generates the second inverted logic signal ANS or HIG based on the input analog signal voltage ANL, and the arithmetic control circuit 20D receives the first inverted logic signal ANS or LOW as an input or generates the first inverted logic signal ANS or LOW based on the input analog signal voltage ANL. The arithmetic control circuit 20D measures, as the transition time Tx, a time period from when the first inverted logic signal ANS or LOW is generated to when the second inverted logic signal ANS or HIG is obtained. The arithmetic control circuit 20D or the monitoring signal processing circuit 40D inverts the repetitive command signal PLS when the first inverted logic signal ANS or LOW and the second inverted logic signal ANS or HIG are input or generated. The first inverted logic signal and the second inverted logic signal are a pair of logic signals of the first logic signal LOW whose output logic changes before and after the first threshold V1 and the second logic signal HIG whose output logic changes before and after the second threshold V2, or the band history logic signal ANS which becomes a first logic state of "L" or "H" when the value of the monitoring voltage Vx has increased to the second threshold V2 or higher after decreasing to the first threshold V1 or lower and which becomes a second logic state of "H" or "L" when the value of the monitoring voltage Vx has decreased to the first threshold V1 or lower after increasing to the second threshold V2 or higher.

As described above, in connection with claim 6 of the present invention, the repetitive signal output circuit charges and discharges the coupling capacitor, and the arithmetic control circuit measures, as the transition time Tx, a time period during which the monitoring voltage Vx increases to the second threshold V2 from the first threshold V1 which is set to a value close to 0 volts. Further, the monitoring signal processing circuit or the arithmetic control circuit inverts the pulse output when the monitoring voltage Vx has decreased to pass through the first threshold V1 and when the monitoring voltage Vx has increased to pass through the second threshold V2.

Therefore, the output pulse is inverted along with the completion of the measurement of the transition time Tx, and the output pulse is inverted immediately after the confirmation of the completion of the charge/discharge, and hence the occurrence frequency of the repetitive command signal PLS becomes shortened as the leakage resistance becomes smaller. Thus, abnormality can be detected quickly.

As is clear from the above description, according to the fourth embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30D is represented by R0, and when a time period during which the monitoring voltage Vx increases gradually from a state of 0 to the predetermined threshold voltage V0 is represented by the transition time Tx, the transition time coefficient α is set to Tx/(R0×C), the leakage resistance coefficient β is set to Rx/R0, and the threshold voltage coefficient γ is set to V0/Vcc: calculating, by the arithmetic control circuit 20D, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; selectively using a negative-gradient curve region following the positive-gradient curve region or a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region; determining, when the transition time Tx has become a value equal to or larger than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the short-circuit transition time Tx00 corresponding to a case where the leakage resistance Rx becomes 0.

As is clear from the above description, according to the fourth embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30D is represented by R0, and when a time period during which the monitoring voltage Vx increases gradually from a state of 0 to the predetermined threshold voltage V0 is represented by the transition time Tx, the transition time coefficient $\alpha$ is set to Tx/(R0×C), the leakage resistance coefficient $\beta$ is set to Rx/R0, and the threshold voltage coefficient $\gamma$ is set to V0/Vcc: calculating, by the arithmetic control circuit 20D, the value of the leakage resistance Rx corresponding to the measured transition time Tx by using the threshold voltage coefficient $\gamma$ as a parameter and based on a characteristics curve of the transition time coefficient $\alpha$ corresponding to a value of the leakage resistance coefficient $\beta$, the characteristics curve having a negative-gradient curve region or a positive-gradient curve region in which the transition time coefficient $\alpha$ gradually increases or gradually decreases along with an increase in the leakage resistance coefficient $\beta$; excluding in advance, by the characteristics curve correction means, application of a negative-gradient curve region following the positive-gradient curve region; determining the threshold voltage coefficient $\gamma$ so that a value of the transition time coefficient $\alpha$ when the value of the leakage resistance Rx has reached the limit leakage resistance Rx0 is included in the corrected positive-gradient curve region; determining, when the transition time Tx has become a value equal to or smaller than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the open-circuit transition time Txm corresponding to a case where the leakage resistance Rx is infinite.

Fifth Embodiment

Figure 20:
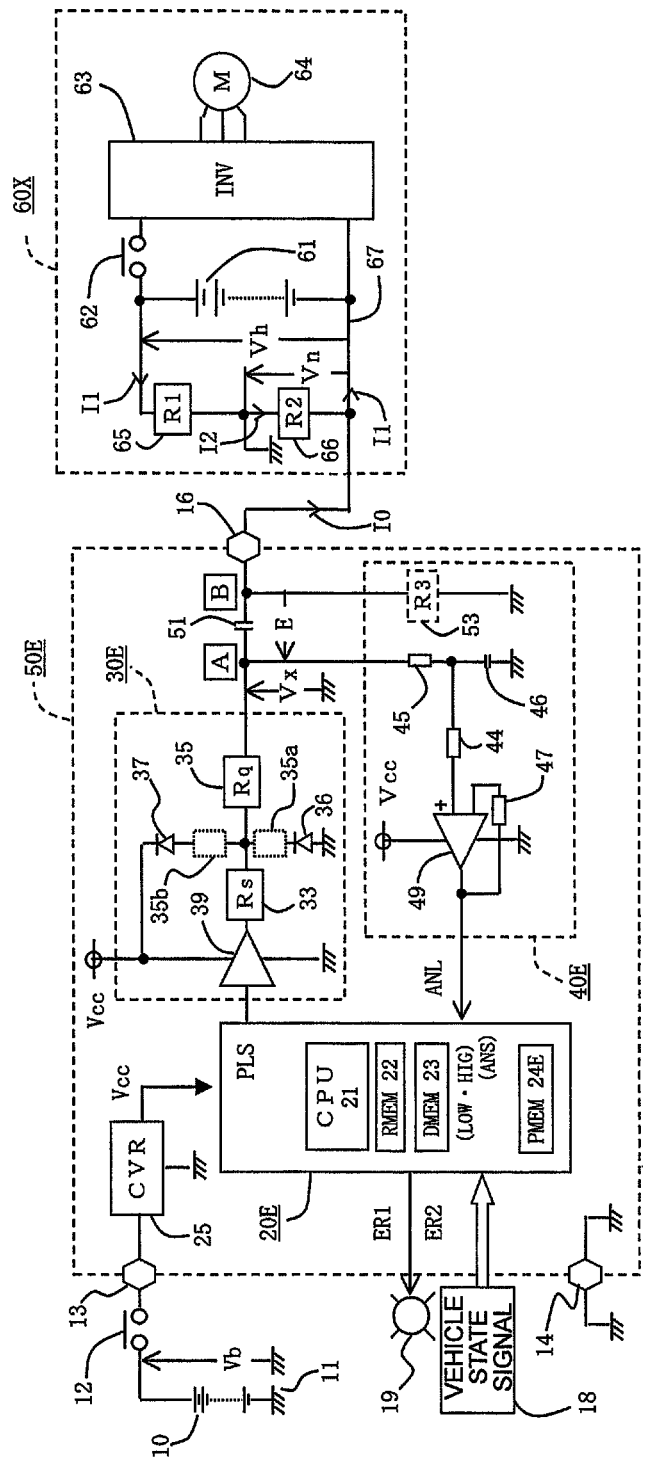
FIG. 20 is an overall configuration diagram of a device according to a fifth embodiment of the present invention.

Referring to FIG. 20 which is an overall configuration diagram of a device according to a fifth embodiment of the present invention, the differences from FIG. 1 are mainly described below. In the drawings, the same reference symbols denote the same or equivalent parts. In FIG. 20, a leakage resistance detection device 50E includes an arithmetic control circuit 20E, a repetitive signal output circuit 30E, and a monitoring signal processing circuit 40E, and detects a leakage resistance of an on-board high voltage device 60X.

The first main difference is that the repetitive signal output circuit 30E includes a charge/discharge switching element 39 having a pair of upper and lower transistors 31a and 31b (not shown). The upper transistor 31a becomes conductive when the output logic level of the repetitive command signal PLS becomes "H" while the lower transistor 31b becomes conductive when the output logic level of the repetitive command signal PLS becomes "L". Thus, the charge/discharge switching element 39 is controlled so that, when one of the upper and lower transistors is conductive, the other transistor is non-conductive.

When the upper transistor 31a becomes conductive, the coupling capacitor 51 is slowly charged via a charge/discharge resistor 33 and a rapid charge/discharge resistor 35. When the lower transistor 31b becomes conductive, the coupling capacitor 51 is slowly discharged via the charge/discharge resistor 33 and the rapid charge/discharge resistor 35.

The rapid charge/discharge resistor 35 is a current limiting resistor for causing positive and negative circuits of the constant voltage control power source 25 to charge and discharge the coupling capacitor 51 via bypass diodes 36 and 37 when the value of the monitoring voltage Vx deviates from the proper range of 0 to Vcc. The rapid charge/discharge resistor 35 illustrated in FIG. 20 may be short-circuited or eliminated, and instead, rapid charge/discharge resistors 35a and 35b illustrated by dotted lines may be connected in series to the bypass diodes 36 and 37.

The second main difference is that the repetitive command signal PLS generated by the arithmetic control circuit 20E is a pulse train signal having a variable cycle as described below with reference to part (A) of FIG. 21.

The third main difference is that the monitoring signal processing circuit 40E includes an operational amplifier 49 instead of the comparator 41, and inputs an analog signal voltage ANL proportional to the monitoring voltage Vx to the arithmetic control circuit 20E.

A microprocessor 21 provided in the arithmetic control circuit 20E cooperates with a program memory 24E and measures the value of a leakage resistance Rx. The microprocessor 21 generates a pre-alarm output ER2 when the measured value of the leakage resistance Rx becomes equal to or smaller than a predetermined preliminary leakage resistance Rxn, and generates a resistance abnormality determination output ER1 when the measured value becomes equal to or smaller than a limit leakage resistance Rx0, which are output to the abnormality alarm device 19.

Note that, similarly to FIG. 1, the low voltage DC power source 10, the low voltage power supply switch 12, the vehicle state signal 18, and the abnormality alarm 19 are connected outside the leakage resistance detection device 50E, and the constant voltage control power source 25 that generates the control power supply voltage Vcc is provided in the leakage resistance detection device 50E.

Hereinafter, the action and operation of the device according to the fifth embodiment of the present invention configured as illustrated in FIG. 20 are briefly described with reference to a time chart of FIG. 21 as well as FIG. 20. First, in FIG. 20, when the manual power supply switch (not shown) is closed and the low voltage power supply switch 12 is closed, the constant voltage control power source 25 generates a predetermined control power supply voltage Vcc. The microprocessor 21 then starts its control operation.

Part (A) of FIG. 21 shows the waveform of the repetitive command signal PLS generated by the arithmetic control circuit 20E. A first period (slow discharge period) T1 in which the repetitive command signal PLS has a logic level "L" and a second period (slow charge period) T2 in which the repetitive command signal PLS has a logic level "H" may have different values each occupying a part of the whole cycle T0=T1+T2, but it is preferred that the first period T1 and the second period T2 have the same value.

In FIG. 20, when the logic level of the repetitive command signal PLS is "L" (or "H"), the lower transistor 31b (or the upper transistor 31a) of the charge/discharge switching element 39 becomes conductive and the other transistor becomes non-conductive as shown in part (B) of FIG. 21.

Then, in FIG. 20, when the lower transistor 31b of the charge/discharge switching element 39 becomes conductive, the coupling capacitor 51 is slowly discharged by a series circuit of the leakage resistance Rx, the rapid charge/discharge resistor 35, and the charge/discharge resistor 33, with the result that the monitoring voltage Vx decreases gradually along with the decrease in discharge current. On the other hand, in FIG. 20, when the upper transistor 31a of the charge/discharge switching element 39 becomes conductive, the coupling capacitor 51 is slowly charged by the series circuit of the leakage resistance Rx, the rapid charge/discharge resistor 35, and the charge/discharge resistor 33, with the result that the monitoring voltage Vx increases gradually along with the decrease in charge current.

Part (C) of FIG. 21 shows how the monitoring voltage Vx decreases gradually or increases gradually. The gradient of the charge/discharge characteristics becomes gentler as the charge/discharge time constants expressed in Expressions (8x) and (9x) above become larger. $\tau 1=(R0+Rx)C$ is a slow discharge time constant, and $\tau 2=\tau 1=(R0+Rx)C$ is a slow charge time constant.

In part (C) of FIG. 21, the value of the slowly-discharged monitoring voltage Vx decreases gradually to the first end voltage V1 at the end of the first period T1. At this time, the output logic of the repetitive command signal PLS is inverted so that the upper transistor 31a of the charge/discharge switching element 39 becomes conductive to start the slow charge of the coupling capacitor 51.

The value of the slowly-charged monitoring voltage Vx increases gradually to the second end voltage V2 at the end of the second period T2. At this time, the output logic of the repetitive command signal PLS is inverted so that the lower transistor 31b of the charge/discharge switching element 39 becomes conductive to start the slow discharge of the coupling capacitor 51.

Note that, the values of the first threshold V1 and the second threshold V2 have the relationship of 0<V1<V2<Vcc, and the first period T1 and the second period T2 have the same time width as long as the relationship of V1+V2=Vcc is satisfied.

Part (D) of FIG. 21 shows the waveform of a switching preparation signal to be described below with reference to FIG. 25. The logic of the repetitive command signal PLS is inverted when a first transition time Tx1 or a second transition time Tx2 is calculated after the generation of the switching preparation signal. The first transition time Tx1 is a time period during which the value of the monitoring voltage Vx decreases gradually from the second threshold V2 to the first threshold V1. The second transition time Tx2 is a time period during which the value of the monitoring voltage Vx increases gradually from the first threshold V1 to the second threshold V2. When V1+V2=Vcc is established, Tx1=Tx2 is established.

Part (E) of FIG. 21 shows the waveform of a voltage across the coupling capacitor 51 (both-end voltage E). If the second period T2 has infinite time, a discharge initial voltage (=charge end voltage) E1 increases to a value obtained by adding the control power supply voltage Vcc to the stable divided voltage Vn0 expressed in Expression (4x). If the first period T1 is infinite, the value of a discharge end voltage (=charge initial voltage) E2 decreases to the stable divided voltage Vn0.

Figure 22:
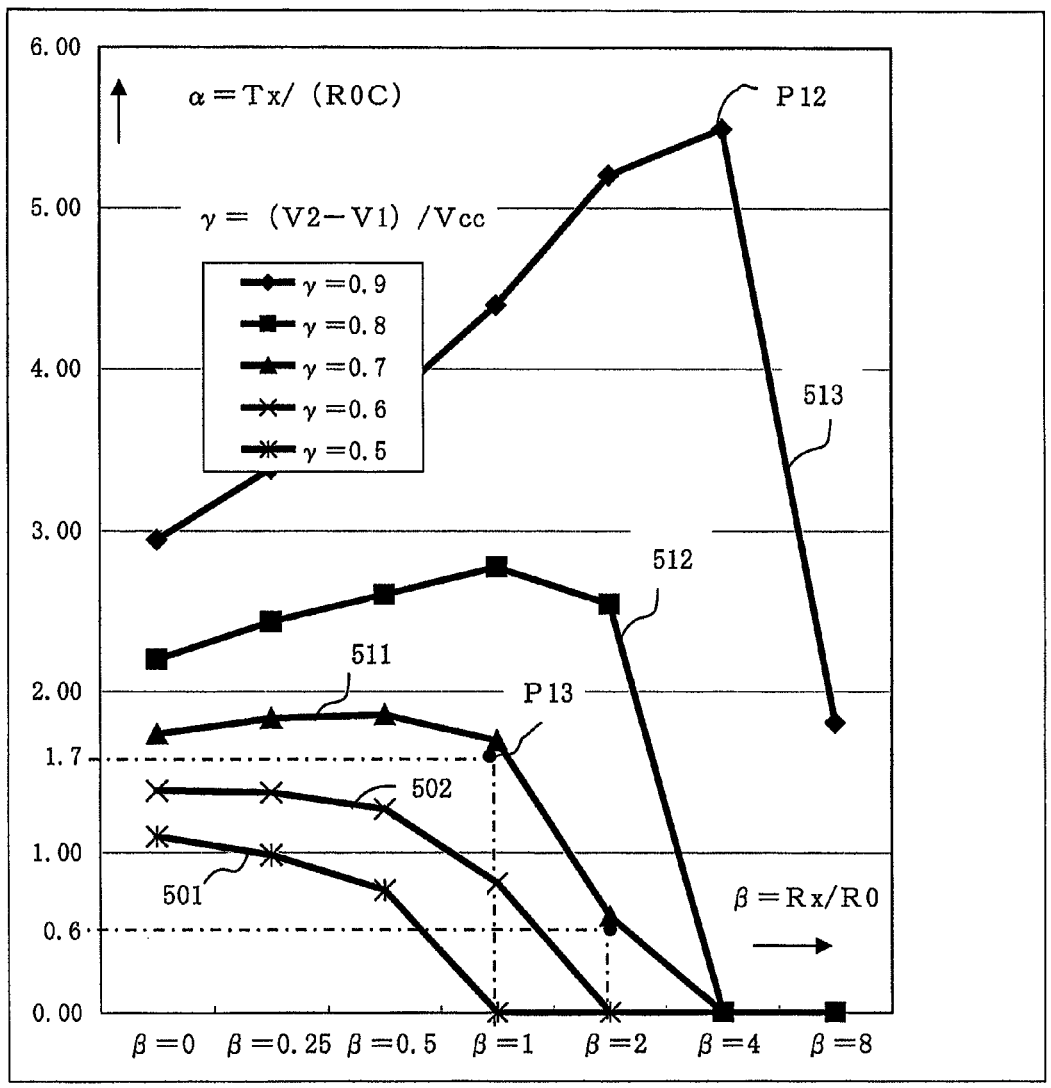
FIG. 22 is a full-range characteristics chart for describing the operation of the device of FIG. 20.

Hereinafter, based on the device according to the fifth embodiment of the present invention configured as illustrated in FIG. 20, a method of detecting the leakage resistance is described with reference to characteristics charts of FIGS. 22 to 24. In FIG. 22, a leakage resistance coefficient β on the horizontal axis is a ratio between the value of the parallel combined resistance of the equivalent leakage resistances R1 and R2, namely the value of the leakage resistance Rx=R1×R2/(R1+R2), and the series resistance R0=Rs+Rq. The series resistance R0 is a known constant, and hence the value of the leakage resistance coefficient β=Rx/R0 is proportional to the leakage resistance Rx.

A transition time coefficient α on the vertical axis is a ratio between a measured transition time Tx and a charge/discharge time constant $\tau=(R0+Rx)\times C=R0\times C$ with respect to the coupling capacitor 51 when the value of the leakage resistance Rx is zero. The charge/discharge time constant τ is a known constant, and hence the value of the transition time coefficient α=Tx/(R0×C) is proportional to the transition time Tx.

A plurality of characteristics curves of FIG. 22 use a threshold voltage coefficient γ as a parameter. In the case where the value of a transition time Tx is set to an average value between the second transition time Tx2 in which the value of the monitoring voltage Vx increases gradually and shifts from the first threshold V1 to the second threshold V2 and the first transition time Tx1 in which the value of the monitoring voltage Vx decreases gradually and shifts from the second threshold V2 to the first threshold V1, the threshold voltage coefficient γ is (V2−V1)/Vcc. The threshold voltage V2−V1 and the control power supply voltage Vcc are known values, and hence the value of the threshold voltage coefficient γ is a known value as a design constant.

The plurality of characteristics curves using the threshold voltage coefficient γ as a parameter are classified into a negative-gradient curve as represented by curves 501 and 502 in which the transition time coefficient α decreases along with the increase in leakage resistance coefficient β and a bell-shaped curve as represented by curves 511, 512, and 513 which is convex at the center and has a positive-gradient curve region and a negative-gradient curve region.

Figure 23:
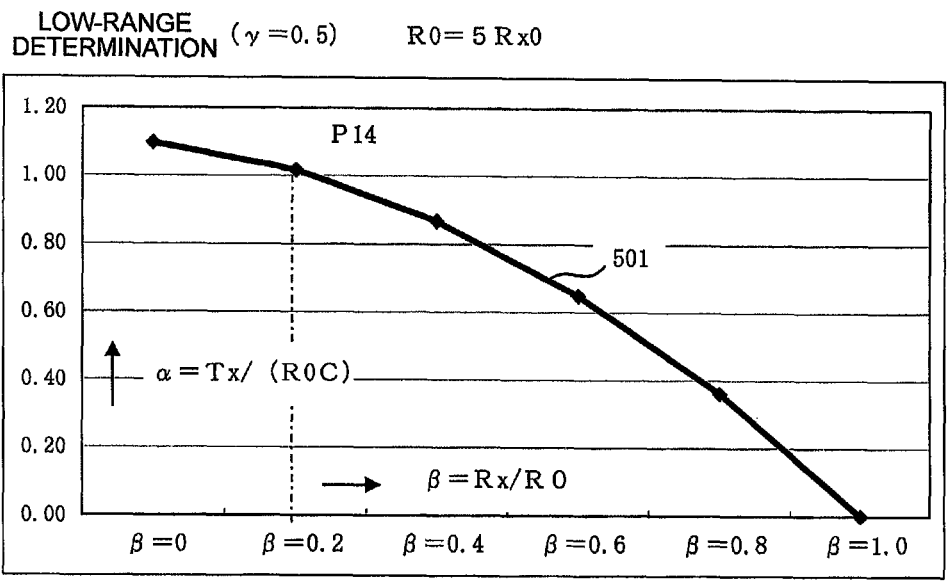
FIG. 23 is a low-range characteristics chart for describing the operation of the device of FIG. 20.

FIG. 23 is an enlarged graph of the curve 501 of FIG. 22 and shows a negative-gradient curve for the threshold voltage coefficient γ of 0.5. In the case where the value of the series resistance R0 is designed to be 5 times the limit leakage resistance Rx0, the value of the leakage resistance coefficient β when the actual value of the leakage resistance Rx has become equal to the limit leakage resistance Rx0 is Rx/R0=Rx0/(5Rx0)=0.2, and hence the transition time coefficient α of 1.0 corresponding to a point of interest P14 of FIG. 23 is the value corresponding to the measured transition time Tx.

Therefore, when the transition time coefficient α is 1.0 or more, the leakage resistance Rx is determined to be in the dangerous state of being equal to or smaller than the limit leakage resistance Rx0, and when the transition time coefficient α is less than 1.0, the leakage resistance Rx is determined to be in the safe state of exceeding the limit leakage resistance Rx0. For example, in the case where the limit leakage resistance Rx0 is set to 200 KΩ, the series resistance R0 is set to 200×5=1,000 KΩ, and the electrostatic capacitance C of the coupling capacitor 51 is set to 0.22 µF, the charge/discharge time constant τ is 1,000×0.22=220 msec, and hence the limit transition time Tx0 is α×(R0×C)=1.0× 220=220 msec.

Further, in FIG. 23, when the leakage resistance coefficient β is 0, the value of the transition time coefficient α is 1.1. Thus, the occurrence of complete ground abnormality can be detected as long as the charge/discharge period of the repetitive command signal PLS is a pulse width equal to or longer than 220×1.1=242 msec. In contrast, it is determined to be timeout abnormality when an inverted logic signal cannot be obtained even after 242 msec since the logic of the repetitive command signal PLS was inverted to the charge side.

In addition, in FIG. 23, when the leakage resistance coefficient β of 0.9 (α=0.2) is a measurement upper limit, a measurable value of the leakage resistance Rx is β×R0=0.9R0=4.5×Rx0. It is therefore difficult to accurately measure a leakage resistance exceeding 4.5 times the limit leakage resistance Rx0, but the normal state of the leakage resistance can be detected with reliability.

Returning to FIG. 22, the curve 511 can be used to measure the leakage resistance even by excluding the positive-gradient curve region and using only the negative-gradient curve region. The horizontal axis of FIG. 22 has a geometric scale, and hence the transition time coefficient α seems to attenuate rapidly. However, a gentle attenuation curve is obtained on an arithmetic scale.

In this case, attention is paid on the leakage resistance coefficient β of 1.0 corresponding to a point of interest P13 (α=1.7) at which the value of the transition time coefficient α for the leakage resistance coefficient β of 0 is 1.7 or less. When the series resistance R0 is set to Rx0, the leakage resistance coefficient β when the leakage resistance Rx has deceased to the limit leakage resistance Rx0 is Rx0/R0=1.0. Therefore, the value of the limit leakage resistance Rx0 can be detected based on the transition time coefficient α corresponding to the point of interest P13.

In this case, however, the leakage resistance equal to or smaller than the limit leakage resistance Rx0 cannot be measured, and when the transition time coefficient α exceeds 1.7, a binary problem occurs and a correct value of the leakage resistance cannot be specified. Further, in the curve 511 of FIG. 22, when the leakage resistance coefficient β of 2.0 (α=0.6) is a measurement upper limit, a measureable value of the leakage resistance Rx is β×R0=2Rx0. It is therefore difficult to accurately measure a leakage resistance exceeding twice the limit leakage resistance Rx0, but the normal state of the leakage resistance can be detected with reliability.

If the resistance equal to or smaller than the limit leakage resistance can be measured, the measured resistance can be utilized as information for pursuing the cause of the decrease in leakage resistance. In general, however, there is no problem even if the resistance equal to or smaller than the limit leakage resistance Rx0 cannot be measured. Further, in general, as long as a leakage resistance for pre-alarming which is about 1.3 times the limit leakage resistance Rx0 can be measured, it is unnecessary to accurately measure a larger leakage resistance. From this viewpoint, it is possible to use both the negative-gradient curve 501 and the curve 511 having the negative-gradient curve region following the positive-gradient curve region. However, there is no advantage in using the negative-gradient region of the bell-shaped curve, and it is more advantageous to use the curve 501 having only the negative-gradient curve.

Figure 24:
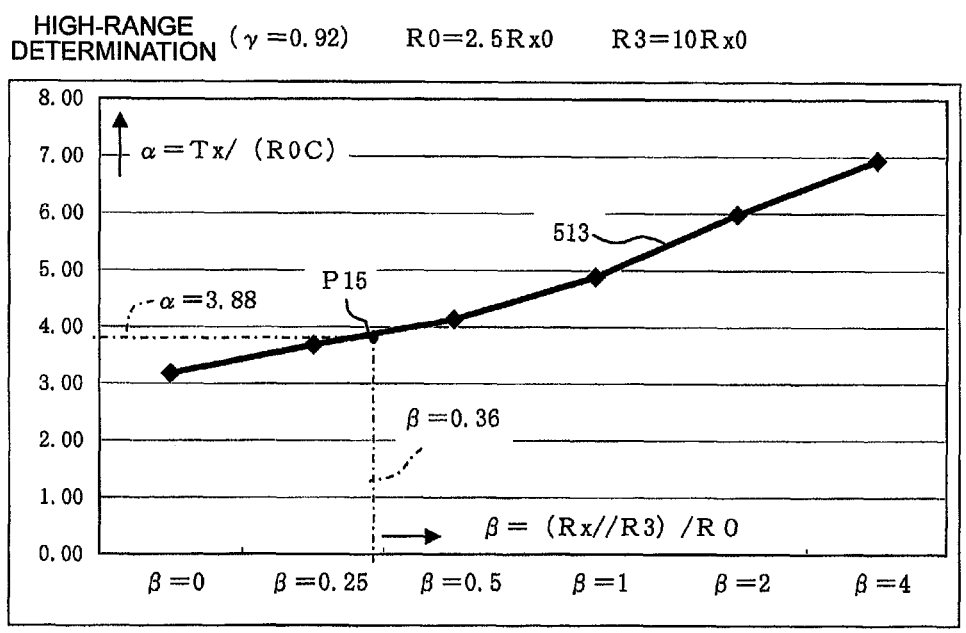
FIG. 24 is a high-range characteristics chart for describing the operation of the device of FIG. 20.

FIG. 24 is an enlarged graph of the curve 513 of FIG. 22 and shows a positive-gradient curve for the threshold voltage coefficient γ of 0.92. However, the value of the series resistance R0 is set to 2.5 times the value of the limit leakage resistance Rx0, and the additional resistance R3=10×Rx0 is connected in parallel by the bypass leakage resistance 53. Therefore, even if the actual leakage resistance Rx is infinite, the upper limit value of the leakage resistance coefficient β is R3/R0=10×Rx0/(2.5×Rx0)=4, which is within the positive-gradient curve region of the curve 513 of FIG. 22.

In the case of FIG. 24, the value of the leakage resistance coefficient β when the actual value of the leakage resistance Rx has become equal to the limit leakage resistance Rx0 is (Rx0//R3)/R0=(Rx0//10Rx0)/(2.5Rx0)=0.36, and hence the transition time coefficient α of 3.88 corresponding to a point of interest P15 of FIG. 24 is the value corresponding to the measured transition time Tx.

For example, in the case where the limit leakage resistance Rx0 is set to 200 KΩ, the additional resistance R3 is 2 MΩ and the series resistance R0 is 500 KΩ. Thus, the charge/discharge time constant as a reference when the electrostatic capacitance C of the coupling capacitor 51 is set to 0.15 µF is R0×C=500×0.15=75 msec. Therefore, the limit transition time Tx0 when the leakage resistance Rx has decreased to the limit leakage resistance Rx0 is α×(R0×C)=3.88×75=291 msec. Thus, the leakage resistance Rx can be determined to be in the dangerous state when the transition time Tx becomes 291 msec or less and in the safe state when the transition time Tx exceeds 291 msec.

Further, in FIG. 24, the value of the transition time coefficient α at an upper limit value of the leakage resistance coefficient β of 4.0 is 7.0. Thus, theoretically, the leakage resistance can be detected up to an infinite value as long as the charge period of the repetitive command signal PLS is a pulse width equal to or longer than 75×7.0=525 msec. In contrast, it is determined to be timeout abnormality when an inverted logic signal cannot be obtained even after 525 msec since the logic of the repetitive command signal PLS was inverted.

In the above description, the upper limit of the leakage resistance coefficient β is limited by the bypass leakage resistance 53 for the limited use of the positive-gradient curve region of the bell-shaped curve in FIG. 22. The bypass leakage resistance 53 has a known resistance value. Thus, at the time of product shipping inspection, by measuring the leakage resistance in the state in which the on-board high voltage device 60X is not connected, the individual fluctuations in electrostatic capacitance C of the coupling capacitor 51 can be measured so that a calibrated value of the electrostatic capacitance C can be calculated and stored.

The characteristics curves shown in FIG. 22 are based on Expression II shown at the top of FIG. 22, and Expression II is established when the monitoring voltage Vx falls within a proper range of 0 to Vcc. The establishment of Expression II is demonstrated as follows.

Discharge Period

In the slow discharge period in which the logic level of the repetitive command signal PLS in FIG. 20 is "L" and the lower transistor 31b of the charge/discharge switching element 39 is closed, Expression (50b) is established.

$$Vx + R0 \times C(dE/dt) = 0 \qquad (50b)$$

where $R0 = Rs + Rq \approx Rs \gg Rq$

Vx in Expression (50b) is substituted into Expression (7x) above to obtain Expression (51b).

$$Vn0 = E + \tau 1 \times (dE/dt) \qquad (51b)$$

where $\tau 1 = (R0 + Rx)C \approx (Rs + Rx)C$

In the differential equation (51b), the initial value of E at the time t=0 is represented by E1 and the value of E at the infinite time is represented by Vn0. Then, a solution expressed by Expression (52b) is obtained.

$$E = E1 \exp(-t/\tau 1) + Vn0\{1 - \exp(-t/\tau 1)\} \qquad (52b)$$

In addition, the value of (dE/dt) in Expression (50b) is substituted into Expression (7x) above to obtain Expression (53b).

$$Vx/(R0//Rx) = (E - Vn0)/Rx \qquad (53b)$$

where R0//Rx represents the parallel combined resistance of R0 and Rx.

Charge Period

In the slow charge period in which the logic level of the repetitive command signal PLS in FIG. 20 is "H" and the upper transistor 31*a* of the charge/discharge switching element 39 is closed, Expression (50a) is established.

$$C \times R0(dE/dt) = Vcc - Vx \qquad (50a)$$

Vx in Expression (50a) is substituted into Expression (7x) above to obtain Expression (51a).

$$Vn0 + Vcc = \tau 2(dE/dt) + E \qquad (51a)$$

where $\tau 2 = \tau 1 = (R0 + Rx) \times C$

In the differential equation (51a), the initial value of E at the time t=0 is represented by E2 and the value of E at the infinite time is represented by Vn0+Vcc. Then, a solution expressed by Expression (52a) is obtained.

$$E = E2 \exp(-t/\tau 2) + (Vn0 + Vcc)\{1 - \exp(-t/\tau 2)\} \qquad (52a)$$

In addition, the value of (dE/dt) in Expression (50a) is substituted into Expression (7x) above to obtain Expression (53a).

$$Vx/(R0//Rx) = (E - Vn0)/Rx + Vcc/R0 \qquad (53a)$$

where R0//Rx represents the parallel combined resistance of R0 and Rx.

Stable State

In the stable state in which the logic level of the repetitive command signal PLS in FIG. 20 is inverted alternately in the discharge period T1 and the charge period T2 and there is no change in the value of the leakage resistance Rx and in the output voltage Vh of the high voltage DC power source 61, the initial values E1 and E2 in Expressions (52b) and (52a) are calculated as follows. First, in Expression (52b), at the discharge end time t=T1, E=E2 is established, and hence Expression (54b) is established.

$$E2 = E1 \times K1 + Vn0(1 - K1) \qquad (54b)$$

where $K1 = \exp(-T1/\tau 1)$

In addition, in Expression (52a), at the charge end time t=T2, E=E1 is established, and hence Expression (54a) is established.

$$E1 = E2 \times K2 + (Vn0 + Vcc)(1 - K2) \qquad (54a)$$

where $K2 = \exp(-T2/\tau 2)$

From Expressions (54b) and (54a), Expressions (55b) and (55a) are obtained.

$$E1 \times Vn0 = Vcc \times K0 \qquad (55b)$$

$$E2 - Vn0 = Vcc \times K0 \times K1 \qquad (55a)$$

where $K0 = (1 - K2)/(1 - K1 \times K2)$

In the Case of Fifth Embodiment

In FIGS. 20 and 21, at the discharge start time t=0, Vx=V2 is established. At the time t=Tx1=T1, if the value of Vx becomes equal to the set threshold voltage V1, Expressions (59b) and (60b) are calculated from Expressions (53b) and (55a).

$$V1/(R0//Rx) = (E2 - Vn0)/Rx = Vcc K0 K1/Rx \qquad (59b)$$

$$\therefore V1/Vcc = (R0//Rx) K0 K1/Rx \qquad (60b)$$

At the charge start time t=0, Vx is V1. At the time t=Tx2=T2, if the value of Vx becomes V2, Expression (59a) is obtained from Expressions (53a) and (55b).

$$V2/(R0//Rx) = (E1 - Vn0)/Rx + Vcc/R0 \qquad (59a)$$
$$= Vcc K0/Rx + Vcc/R0$$

$$\therefore V2/Vcc = (R0//Rx)(K0/Rx + 1/R0) \qquad (60a)$$

Then, the threshold voltage coefficient γ1 of V1/Vcc, and a threshold voltage coefficient γ2 of V2/Vcc, the leakage resistance coefficient β of Rx/R0, and the transition time coefficient α of Tx/(R0C) are substituted into Expressions (60a) and (60b), and Expressions (61a) and (61b) are obtained.

$$\gamma 1 = K0 K1/(1+\beta) \qquad (61b)$$

$$\gamma 2 = (K0 + \beta)/(1+\beta) \qquad (61a)$$

When γ1+γ2=1 is established, K1=K2 is obtained from Expressions (61a) and (61b). When K1=K2=K is established, K0=1/(1+K) is established. Therefore, Expressions (61b) and (61a) are modified to Expressions (62b) and (62a).

$$\gamma 1 = K/\{(1+K)(1+\beta)\} \qquad (62b)$$

$$\gamma 2 = \{1 + \beta(1+K)\}/\{(1+K)(1+\beta)\} \qquad (62a)$$

Therefore, when γ=γ2−γ1 is established, Expression (63) is obtained from Expressions (62a) and (62b).

$$\gamma = \gamma 2 - \gamma 1 = 1 - 2\gamma 1 = 1 - 2K/\{(1+K)(1+\beta)\} \qquad (63)$$

1/K is back-calculated from Expression (63) to obtain Expression (64).

$$1/K = [2/\{(1-\gamma)(1+\beta)\}] - 1 \qquad (64)$$

On the other hand, when Tx1=T1=Tx2=T2=Tx is established and the transition time coefficient α is set to Tx/(R0C), Expression (65) is obtained.

$$K = \exp[-Tx/\{(R0 + Rx)C\}] = \exp\{-\alpha/(1+\beta)\} \qquad (65)$$

Expression (65) is converted into a natural logarithm LOG e to obtain Expression (66).

$$\alpha = (1+\beta) \text{LOG } e(1/Kx) \qquad (66)$$

Expressions (64) and (66) correspond to Expression II shown at the top of FIG. 22. Note that, Expression (64) is calculated by using γ=1−2γ1 in Expression (62b), but alternatively, γ=2γ2−1 may be used in Expression (62a) or γ=γ2−γ1 may be used in both Expression (62a) and Expression (62b) to obtain Expressions (64) and (65).

Figure 26:
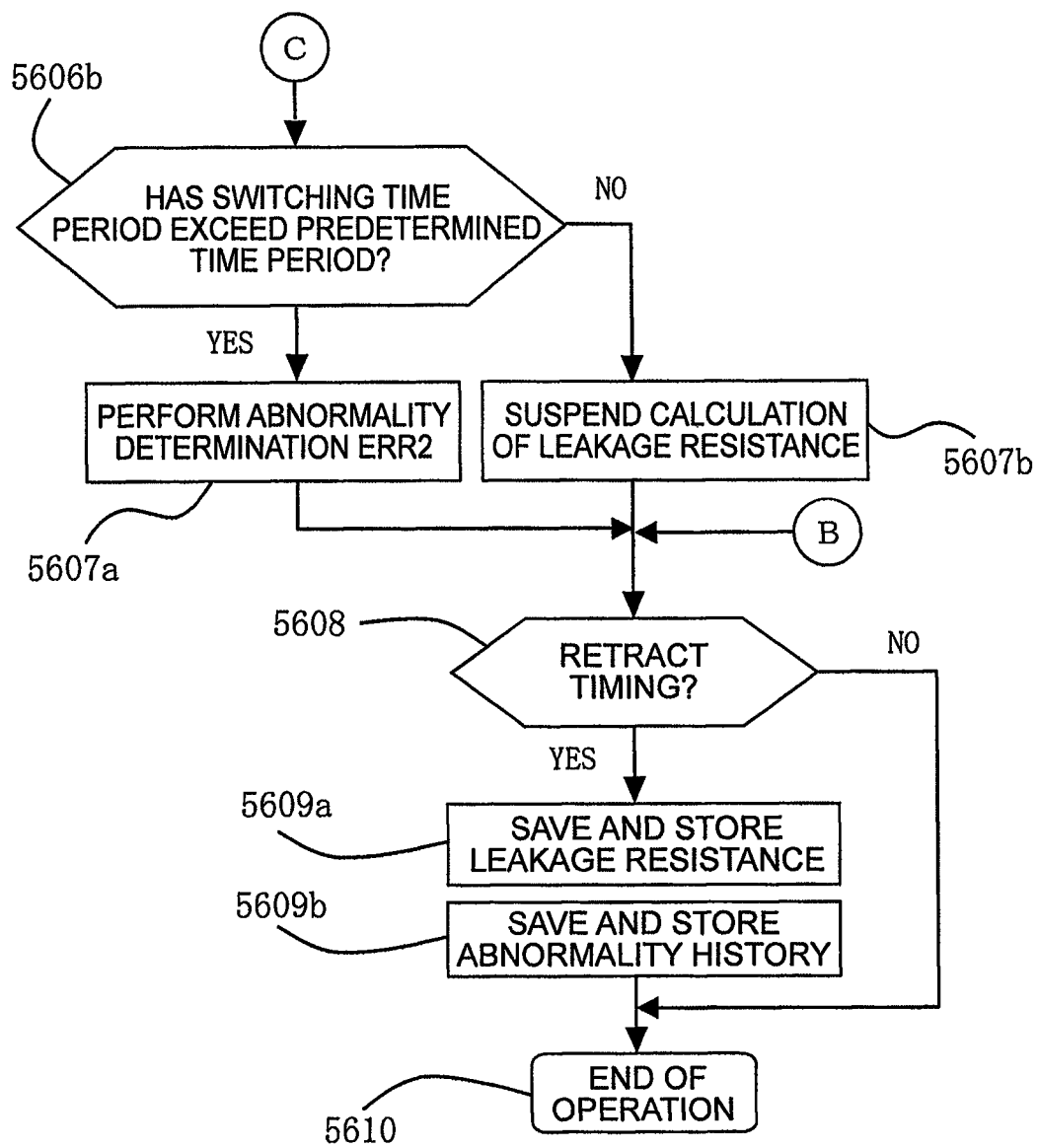
FIG. 26 is a second flowchart for describing the operation of the device of FIG. 20.
Figure 27:
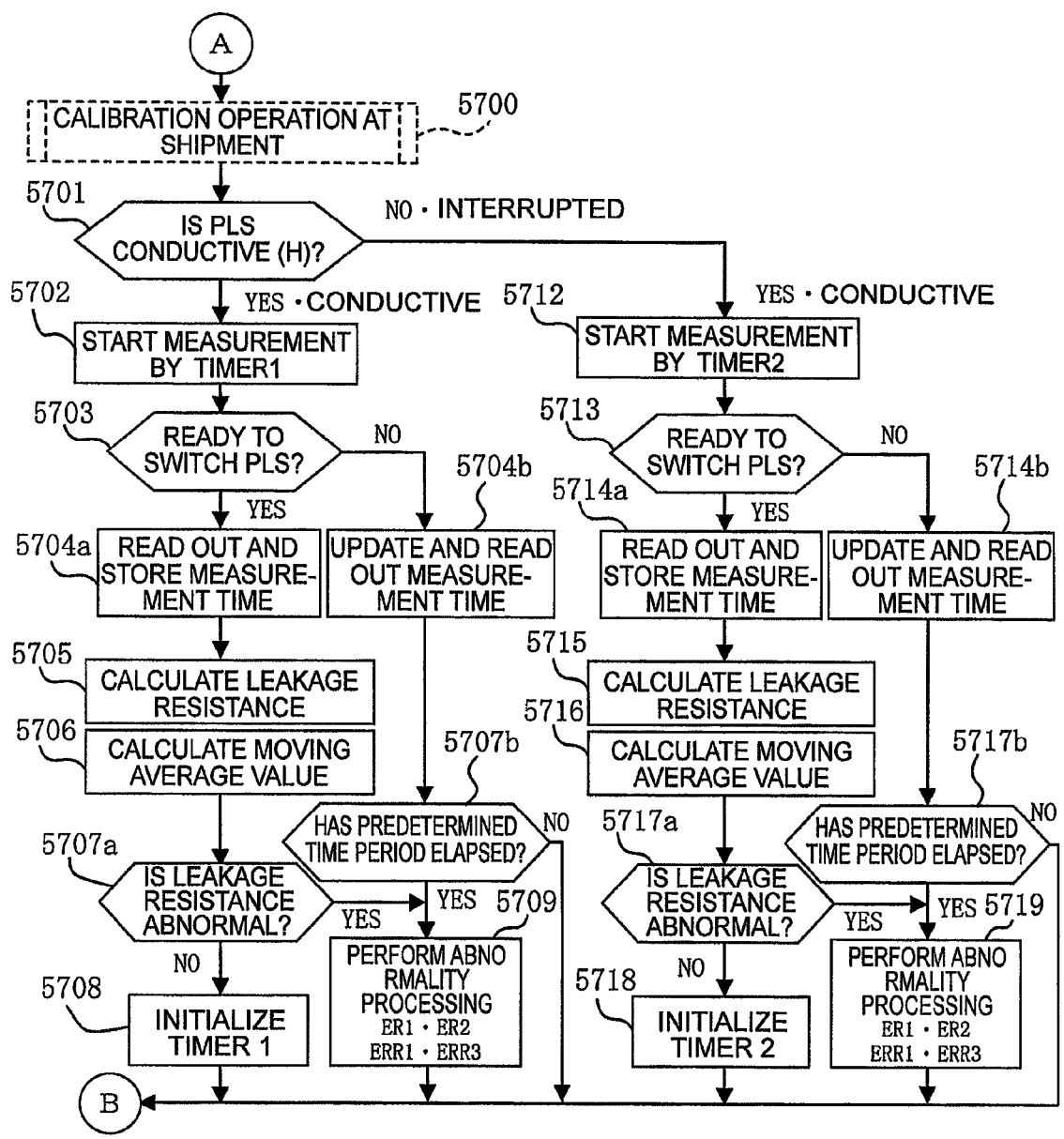
FIG. 27 is a third flowchart for describing the operation of the device of FIG. 20.

Next, the action and operation of the device of FIG. 20 are described in detail with reference to operation explanatory flowcharts illustrated in FIGS. 25 to 27. Note that, the step numbers of FIGS. 6 and 7 are in the 1,000s while the step numbers of FIGS. 25 to 27 are in the 5,000s, and the same 3-digit or lower numbers represent the same or equivalent parts. Thus, some description of the same parts is omitted.

Figure 25:
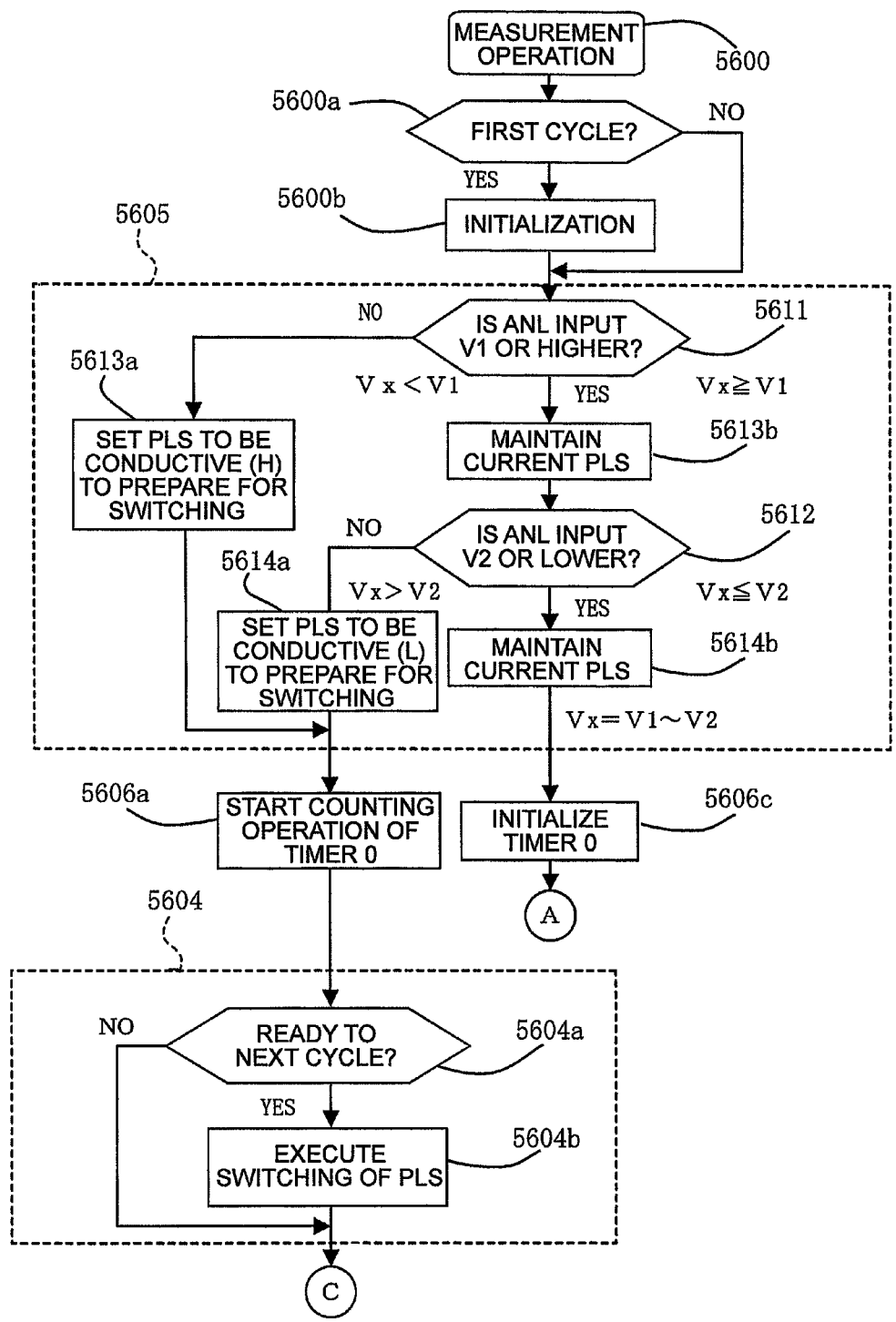
FIG. 25 is a first flowchart for describing the operation of the device of FIG. 20.

First referring to the first flowchart of FIG. 25, Step 5600 is a step in which the microprocessor 21 starts the operation of detecting the leakage resistance Rx. Subsequent Step 5600*a* is a determination step of determining whether the current operation is the first operation after the low voltage power supply switch 12 has been closed. In the case of the first cycle, it is determined to be YES and the flow proceeds to Step 5600*b*. In the case of a continuous cyclic cycle, it is determined to be NO and the flow proceeds to Step 5611. Step 5600*b* is an initialization step in which the current value of a timer to be described below is set to 0.

Subsequent Step 5611 is a determination step of monitoring the analog signal voltage ANL to determine whether the monitoring voltage Vx is equal to or higher than the first threshold V1. When the monitoring voltage Vx is equal to or higher than the first threshold V1, it is determined to be YES and the flow proceeds to Step 5613b. When the monitoring voltage Vx is lower than the first threshold V1, it is determined to be NO and the flow proceeds to Step 5613a. Step 5611 is equivalent to means for generating the first inverted logic signal LOW.

Step 5613a is a step of temporarily storing an inversion switching command for inverting the logic level of the repetitive command signal PLS to "H" so that the upper transistor 31a of the charge/discharge switching element 39 becomes conductive. Actually, the inversion switching is executed in the next calculation cycle in Step 5604b to be described below.

In Step 5613b, the current logic state of the repetitive command signal PLS is maintained, and the flow proceeds to Step 5612. Subsequent Step 5612 is a determination step of monitoring the analog signal voltage ANL to determine whether the monitoring voltage Vx is equal to or lower than the second threshold V2. When the monitoring voltage Vx is equal to or lower than the second threshold V2, it is determined to be YES and the flow proceeds to Step 5614b. When the monitoring voltage Vx exceeds the second threshold V2, it is determined to be NO and the flow proceeds to Step 5614a. Step 5612 is equivalent to means for generating the second inverted logic signal HIG.

Step 5614a is a step of temporarily storing an inversion switching command for inverting the logic level of the repetitive command signal PLS to "L" so that the lower transistor 31b of the charge/discharge switching element 39 becomes conductive. Actually, the inversion switching is executed in the next calculation cycle in Step 5604b to be described below. In Step 5614b, the current logic state of the repetitive command signal PLS is maintained, and the flow proceeds to Step 5606c.

Step 5606c is executed when it is determined in Step 5611 and Step 5612 that the value of the monitoring voltage Vx is in the proper range of the first threshold V1 or higher and the second threshold V2 or lower. In Step 5606c, a timer 0 that has been activated in Step 5606a to be described below is initialized, and the flow proceeds to Step 5700 of FIG. 27 via a relay terminal A. A series of steps from Step 5611 to Step 5614b constitutes a step block 5605.

Step 5606a is executed when it is determined in Step 5611 or Step 5612 that the value of the monitoring voltage Vx is in the deviated range of lower than the first threshold V1 or higher than the second threshold V2. In Step 5606a, the timer 0 for transient abnormality determination is activated to start the counting operation, and the flow proceeds to Step 5604a.

Step 5604a is a determination step. When the current calculation cycle is the same as that immediately after the execution of Step 5613a or Step 5614a described above, it is determined to be NO and the flow proceeds to Step 5606b of FIG. 26 via a relay terminal C. When the flow proceeds to Step 5604a after executing a series of control operation up to an operation finish step 5610 to be described below and after executing again the flow of the operation start step 5600 and subsequent steps, it is determined to be YES and the flow proceeds to Step 5604b.

In Step 5604b, the output logic of the repetitive command signal PLS is actually inverted in accordance with the memory state of the switching preparation flag temporarily stored in Step 5613a or Step 5614a described above, and the switching preparation flag is reset. The flow then proceeds to Step 5606b of FIG. 26 via the relay terminal C. A step block 5604 including Step 5604a and Step 5604b is repetitive command signal generation means.

Referring to the second flowchart of FIG. 26, Step 5606b is a step serving as transient abnormality determination means for reading out the current value of the timer 0 that has started the counting in Step 5606a to determine whether a predetermined time period has elapsed. When the monitoring voltage Vx has not yet returned to the proper range of V1 to V2 after the predetermined time period has elapsed, it is determined to be YES and the flow proceeds to Step 5607a. When the monitoring voltage Vx has returned to the proper range of V1 to V2 in the predetermined time period, it is determined to be NO and the flow proceeds to Step 5607b.

Step 5607a is transient characteristics abnormality processing means. For example, if the power supply voltage Vh of the high voltage DC power source 61 has abruptly changed or if the positive-side leakage resistance 65 or the negative-side leakage resistance 66 has changed to abruptly change the potential of the negative-side power supply line 67 of the on-board high voltage device 61 relative to the vehicle body at the connection point B of the coupling capacitor 51, then the potential of the measurement point A transiently becomes equal to or lower than the vehicle body potential (0 volts) or equal to or higher than the control power supply voltage Vcc, and the coupling capacitor 51 is charged or discharged by the bypass diode 36 or the bypass diode 37. In this case, when a transient charge/discharge time during which the monitoring voltage Vx corresponding to the voltage of the measurement point A returns to the proper range of V1 to V2 for measuring the leakage resistance Rx has elapsed, it is determined to be transient characteristics abnormality ERR2, and system abnormality alarming (not shown) is performed, followed by transition to a retract operation mode (limp home operation).

Note that, in the case where it is predicted that the vehicle state signal 18 changes and the monitoring voltage Vx deviates from the proper range temporarily, the determination of the transient characteristics abnormality ERR2 is avoided at least for a predetermined time period.

Note that, in the case where there occurs no system abnormality, such as the decrease in internal leakage resistance by degradation of the coupling capacitor 51, the disconnection of other wirings, and the short-circuit, the maximum value of the transient charge/discharge time is shorter than the predetermined determination time period in Step 5606b. In the normal case, it is determined to be NO in Step 5606b and the flow proceeds to Step 5607b.

Step 5607b is performed in the case where it is determined in Step 5606b that a time period that has elapsed since the timer 0 was activated in Step 5606a is within the predetermined time period. In Step 5607b, the calculation of the leakage resistance shown in FIG. 27 is suspended. The flow proceeds to Step 5608 via Step 5607a or Step 5607b, or via a relay terminal B shown in FIG. 27.

Step 5608 is a determination step of determining whether the current timing is in a period of retracting and saving the value of the leakage resistance Rx calculated in a step to be described below or abnormality occurrence information in the non-volatile data memory 23. For example, when the current timing is in the delayed feed period in which the manual power supply switch (not shown) is opened and then the low voltage power supply switch 12 is interrupted, it is determined to be YES and the flow proceeds to Step 5609a. When the current timing is not in the retracting period, it is determined to be NO and the flow proceeds to an operation finish step 5610. Note that, in Step 5608, the determination of YES may be performed periodically at a predetermined time interval.

In Step 5609a, moving average values of the leakage resistance Rx calculated in Steps 5706 and 5716 to be described below are sequentially written and saved while updating the address of the non-volatile data memory 23. In subsequent Step 5609b, based on determination information on the transient characteristics abnormality ERR2 written in the RAM memory 22 in Step 5607a or based on the abnormality occurrence information determined in Steps 5709 and 5719 to be described below, the accumulated number of abnormality occurrence in accordance with the type of the abnormality occurrence is updated and then written and saved in a predetermined address of the non-volatile data memory 23. After that, the flow proceeds to the operation finish step 5610.

In the operation finish step 5610, the microprocessor 21 executes another control program, and the flow proceeds to the operation start step 5600 again after a standby time of 10 msec, for example. Therefore, immediately after the start of the operation and in the state in which the initial charge of the coupling capacitor 51 has not been performed, the microprocessor 21 executes the steps in the first cycle in the order of Step 5600, Step 5600a (determination of YES), Step 5600b, the step block 5605, Step 5606a, the step block 5604, Step 5606b (determination of NO), Step 5607b, Step 5608 (determination of NO), Step 5610, and Step 5600 after a standby time of 10 msec. In the next and subsequent cycles, the microprocessor 21 executes a series of the flow in a cyclic manner in the state in which the determination of Step 5600a is NO and Step 5600b is not executed.

In the process, when it is determined in the step block 5605 that the monitoring voltage Vx falls within the proper range, the timer 0 is initialized in Step 5606c and then the flow proceeds to Step 5700 to be described below. On the other hand, in a period of time in which it is still determined in the step block 5605 that the monitoring voltage Vx falls out of the proper range and it is determined in Step 5606b that the predetermined time has not been reached, the steps are executed in the order of Step 5607b, Step 5608 (determination of NO), and Step 5610 and the cyclic operation is continued. Then, when it is determined to be YES in Step 5606b, Step 5607a is executed.

Referring to the third flowchart of FIG. 27, Step 5700 is a step block equivalent to Steps 2700a to 2700c to be described above with reference to FIG. 11. Step 5700 is calibration means at shipment, for measuring the value of the electrostatic capacitance C of the coupling capacitor 51 at the time of shipment adjustment and storing a calibrated value thereof.

Subsequent Step 5701 is a determination step of monitoring the logic level of the repetitive command signal PLS executed in Step 5604b of FIG. 25. In the period in which the logic level of the repetitive command signal PLS is "H" and the upper transistor 31a of the charge/discharge switching element 39 becomes conductive to slowly charge the coupling capacitor 51 via the charge/discharge resistors 33 and 35, it is determined to be YES and the flow proceeds to Step 5702. In the period in which the logic level of the repetitive command signal PLS is "L" and the lower transistor 31b of the charge/discharge switching element 39 becomes conductive to slowly discharge the coupling capacitor 51 via the charge/discharge resistors 33 and 35, it is determined to be NO and the flow proceeds to Step 5712.

In Step 5702, a timer 1 for measuring the transition time Tx is activated to start the counting operation, and the flow proceeds to Step 5703. Step 5703 is a determination step. When logic inversion preparation information of the repetitive command signal PLS has been temporarily stored in Step 5614a of FIG. 25, it is determined to be YES and the flow proceeds to Step 5704a. When the logic inversion preparation information has not been temporarily stored in Step 5614a, it is determined to be NO and the flow proceeds to Step 5704b.

In Step 5704a, the current value of the timer 1 that has been activated to start the counting in Step 5702 is read out and stored in the RAM memory 22. Subsequent Step 5705 is a step serving as leakage resistance calculation means for calculating the leakage resistance Rx based on the value of the transition time Tx read out and stored in Step 5704a.

In subsequent Step 5706, the current value of the leakage resistance Rx calculated in Step 5705 is input to the first stage of the shifter (shift register) formed by the RAM memory 22, and pieces of past data stored in the shift register are migrated sequentially to the subsequent stage. The past data of the leakage resistance Rx stored at the last stage is delivered and erased, and the sum of the values of the leakage resistance Rx left in the shift register is divided by the stored number of values in the shift register, to thereby calculate the moving average value. In this manner, the measurement can be prevented from being directly affected by a temporal measurement error of the leakage resistance Rx caused by the temporal fluctuations in power supply voltage Vh of the high voltage DC power source 61 or noise, for example.

Subsequent Step 5707a is a step serving as resistance abnormality determination means. When the moving average value of the leakage resistance Rx calculated in Step 5706 becomes equal to or smaller than the preliminary leakage resistance Rxn or the limit leakage resistance Rx0, it is determined to be YES and the flow proceeds to Step 5709. When there is no abnormality, it is determined to be NO and the flow proceeds to Step 5708.

Note that, in the case where there is a difference of a predetermined value or more between the moving average value of the leakage resistance Rx calculated in Step 5706 and the past moving average value stored in the non-volatile data memory 23 in Step 5609a of FIG. 26, and where it is recognized that the leakage resistance Rx has abruptly decreased, if not to the preliminary leakage resistance Rx0, it is determined to be YES in Step 5707a and the flow proceeds to Step 5709. Step 5708 is a step in which the timer 1 that has been activated in Step 5702 is initialized and suspended, and the flow proceeds to Step 5608 of FIG. 26 via the relay terminal B.

Step 5704b is performed in the case where it is determined to be NO in Step 5703. In Step 5704b, in order to measure the elapsed time from when the logic level of the repetitive command signal PLS has changed to "H" to when the switching command for inverting the logic is stored in Step 5614a, the current value of the timer 1 that has been activated in Step 5702 is updated and read out. Subsequent Step 5707b serves as timeout abnormality determination step. When the elapsed time that has been read out and stored in Step 5704b is excessive and exceeds a predetermined time period, it is determined to be YES and the flow proceeds to Step 5709. When the elapsed time is within the predetermined time period, it is determined to be NO and the flow proceeds to Step 5608 of FIG. 26 via the relay terminal B.

Step 5709 is a step serving as measurement abnormality processing means. When it is determined to be YES in Step 5707a, the measurement abnormality processing means generates the pre-alarm output ER2 or the resistance abnormality determination output ER1, and stores abnormality determination information on state change abnormality ERR3. When it is determined to be YES in Step 5707b, the measurement abnormality processing means stores abnormality determination information on timeout abnormality determination ERR1. After Step 5709, the flow proceeds to Step 5608 of FIG. 26 via the relay terminal B.

In Step 5709, when the pre-alarm output ER2 or the resistance abnormality determination output ER1 is generated, the abnormality alarm device 19 is activated. When the abnormality determination information on the timeout abnormality determination ERR1 or the state change abnormality ERR3 is stored, the stored abnormality determination information is separated from other abnormality information. In Step 5609*b* of FIG. 26, the accumulated number of the abnormality occurrence is written and saved in the non-volatile data memory 23, which is utilized for maintenance and inspection operation.

A series of flow from Step 5712 to Step 5719 has a one-to-one correspondence with the flow from Step 5702 to Step 5709, and the 2-digit numbers are changed from 0 to 1. Steps 5702 to 5709 described above are performed when the determination in Step 5701 is YES. In Steps 5702 to 5709, the value of the leakage resistance Rx is measured or the presence or absence of abnormality is monitored in the slow charge period in which the output logic of the repetitive command signal PLS is "H".

In contrast, Steps 5712 to 5719 are performed when the determination in Step 5701 is NO. In Steps 5712 to 5719, the value of the leakage resistance Rx is measured or the presence or absence of abnormality is monitored in the slow discharge period in which the output logic of the repetitive command signal PLS is "L". Note that, the measurement of the leakage resistance Rx may be performed in only one of the series of flow from Step 5712 to Step 5719 and the series of flow from Step 5702 to Step 5709.

Alternatively, the leakage resistance may be calculated as a moving average based on an average value between the transition time measured in Step 5704*a* and the transition time measured in Step 5714*a*. Regarding the shift register for calculating the moving average value, the same shift register may alternately and sequentially store the value of the leakage resistance measured in Step 5705 and the value of the leakage resistance measured in Step 5715, so as to calculate a single moving average value as a whole.

Note that, the calculation of the leakage resistance Rx in Steps 5705 and 5175 are performed in three manners. First, the calculation is performed based on the characteristics curve whose whole region is the negative-gradient curve region as represented by the curve 501 of FIG. 22. Second, the calculation is performed by using the negative-gradient curve region of a bell-shaped curve as represented by the curve 511 of FIG. 22. Third, the calculation is performed by using the positive-gradient curve region of a bell-shaped curve as represented by the curve 513 of FIG. 22. In any case, the value of the leakage resistance Rx is calculated from the measured value of the transition time Tx based on a function formula or a data table between the transition time coefficient α and the leakage resistance coefficient β with the use of the threshold voltage coefficient γ as a parameter.

As an alternative abnormality determination method, instead of comparing the detected leakage resistance Rx with the preliminary leakage resistance Rxn or the limit leakage resistance Rx0, the preliminary transition time Txn or the limit transition time Tx0 corresponding to the preliminary leakage resistance Rxn or the limit leakage resistance Rx0 may be calculated in advance, and the actual transition time Tx may be compared with the preliminary transition time Txn or the limit transition time Tx0.

Further, in the case where the value of the reference time constant R0×C, which is the denominator of the transition time coefficient α, the value of the series resistance R0, which is the denominator of the leakage resistance coefficient β, or the value of the threshold voltage coefficient γ is treated as a fixed value, a formula or a data table between the transition time Tx and the leakage resistance Rx may be directly used as the function formula or the data table. In this case, the leakage resistance Rx can be calculated directly from the measured transition time Tx without performing complicated calculation processing during the operation.

However, in the case of varying the value of the threshold voltage coefficient γ, the denominator value of the transition time coefficient α, or the denominator value of the leakage resistance coefficient β in accordance with the applied types of vehicle or the operating state, it is advantageous to set the function formula or the data table using α, β, or γ, which are index values without unit. Alternatively, in the case where the number of analog input ports of the arithmetic control circuit 20E is insufficient, the operational amplifier 49 of the monitoring signal processing circuit 40E may be replaced with a pair of comparators or an inversion memory circuit as illustrated in FIG. 12 or a comparator having a hysteresis operation function as illustrated in FIG. 16. In this case, the leakage resistance can be measured through slow charge and slow discharge with the use of the charge/discharge switching element 39. In addition, in the fifth embodiment of FIG. 20, the connection point B is connected to the negative-side power supply line 67 of the on-board high voltage device 60X, but, even when the connection point B is connected to a positive-side power supply line, no change occurs in Expression II.

As is clear from the above description, according to the fifth embodiment of the present invention, there is provided the leakage resistance detection device 50E for an on-board high voltage device, which is connectable to the on-board high voltage device 60X including the on-board high voltage DC power source 61 and the high voltage electric load 64 to be fed and driven by the on-board high voltage DC power source 61, the on-board high voltage device 60X having the leakage resistance Rx with respect to the vehicle body 11, as typified by the equivalent leakage resistance 65 on the positive potential side and the equivalent leakage resistance 66 on the negative potential side, the leakage resistance detection device 50E including the constant voltage control power source 25 which is fed and driven by the low voltage DC power source 10 having the negative terminal connected to the vehicle body 11 and which generates the control power supply voltage Vcc, the leakage resistance detection device 50E being configured to measure a value of the leakage resistance Rx via the coupling capacitor 51 having one terminal B connected to a predetermined position of the on-board high voltage device 60X, the leakage resistance detection device 50E further including the repetitive signal output circuit 30E, the monitoring signal processing circuit 40E, and the arithmetic control circuit 20E, the arithmetic control circuit 20E including the microprocessor 21 and the program memory 24E which cooperate with each other.

Further, the repetitive signal output circuit 30E alternately repeats, in response to the switching operation of the charge/discharge switching element 39 that operates in response to the repetitive command signal PLS, a charge period and a discharge period in which the measurement point A is intermittently connected to the control power supply voltage Vcc via the charge/discharge resistor 33 or 35, the measurement point A being another terminal of the coupling capacitor 51, to thereby gradually increase or gradually decrease the monitoring voltage Vx which is a potential between the measurement point A and the vehicle body 11. The monitoring signal processing circuit 40E is configured to: generate at least one of the inverted logic signals ANS, LOW, and HIG when a value of the monitoring voltage Vx, which gradually increases or gradually decreases at a gradient that becomes gentler as a charge/discharge time constant becomes larger, passes through a predetermined threshold voltage, and input the at least one of the inverted logic signals ANS, LOW, and HIG to the arithmetic control circuit 20E; or generate the analog signal voltage ANL proportional to the monitoring voltage Vx and input the analog signal voltage ANL to the arithmetic control circuit 20E. The arithmetic control circuit 20E is configured to: measure the transition time Tx during which the value of the monitoring voltage Vx changes from one of a threshold voltage equal to or higher than 0 volts and a threshold voltage equal to or lower than the control power supply voltage Vcc to another; calculate the leakage resistance Rx which is a parallel combined resistance of the equivalent leakage resistance 65 on the positive potential side and the equivalent leakage resistance 66 on the negative potential side, based on a function formula or a data table relating to the transition time Tx and the leakage resistance Rx; and generate the resistance abnormality determination output ER1 when the leakage resistance Rx becomes equal to or smaller than the predetermined limit leakage resistance Rx0 or when the transition time Tx reaches the limit transition time Tx0 corresponding to the predetermined limit leakage resistance Rx0. The repetitive command signal PLS is a pulse signal with a variable cycle in which an output pulse is inverted when the transition time Tx is reached.

The repetitive signal output circuit 30E is configured to, in response to the switching operation of the charge/discharge switching element 39, connect the measurement point A being the another terminal of the coupling capacitor 51 to an output terminal of the constant voltage control power source 25 via the reference resistor 33 having the resistance value Rs, or connect the measurement point A to the negative terminal having a vehicle body potential via the same reference resistor 33, to thereby gradually increase or gradually decrease the monitoring voltage Vx which is the potential between the measurement point A and the vehicle body 11. The monitoring signal processing circuit 40E is configured to: generate the second inverted logic signal ANS or HIG when the value of the monitoring voltage Vx, which gradually increases or gradually decreases at a gradient that becomes gentler as the time constant (Rs+Rx)C being a product of a sum of the resistance value Rs and the leakage resistance Rx and the electrostatic capacitance C of the coupling capacitor 51 becomes larger, has increased to pass through the second threshold V2 and generate the first inverted logic signal ANS or LOW when the value of the monitoring voltage Vx has decreased to pass through the first threshold V1, and input the second inverted logic signal ANS or HIG and the first inverted logic signal ANS or LOW to the arithmetic control circuit 20E; or generate the analog signal voltage ANL proportional to the monitoring voltage Vx and input the analog signal voltage ANL to the arithmetic control circuit 20E. The arithmetic control circuit 20E receives the second inverted logic signal ANS or HIG as an input or generates the second inverted logic signal ANS or HIG based on the input analog signal voltage ANL, and the arithmetic control circuit 20E receives the first inverted logic signal ANS or LOW as an input or generates the first inverted logic signal ANS or LOW based on the input analog signal voltage ANL.

The arithmetic control circuit 20E is configured to: measure, as the second transition time Tx2, a time period from when the first inverted logic signal ANS or LOW is generated to when the second inverted logic signal ANS or HIG is obtained; measure, as the first transition time Tx1, a time period from when the second inverted logic signal ANS or HIG is generated to when the first inverted logic signal ANS or LOW is obtained; and set one of the first transition time Tx1 and the second transition time Tx2 or an average value of both of the first transition time Tx1 and the second transition time Tx2 as the transition time Tx. The arithmetic control circuit 20E or the monitoring signal processing circuit 40E inverts the repetitive command signal PLS when the first inverted logic signal ANS or LOW and the second inverted logic signal ANS or HIG are input or generated. The first inverted logic signal and the second inverted logic signal are a pair of logic signals of the first logic signal LOW whose output logic changes before and after the first threshold V1 and the second logic signal HIG whose output logic changes before and after the second threshold V2, or the band history logic signal ANS which becomes a first logic state of "L" or "H" when the value of the monitoring voltage Vx has increased to the second threshold V2 or higher after decreasing to the first threshold V1 or lower and which becomes a second logic state of "H" or "L" when the value of the monitoring voltage Vx has decreased to the first threshold V1 or lower after increasing to the second threshold V2 or higher.

As described above, in connection with claim 7 of the present invention, the repetitive signal output circuit charges and discharges the coupling capacitor, and the arithmetic control circuit measures, as the transition time Tx, one of the second transition time Tx2 during which the monitoring voltage Vx increases from the first threshold V1 to the second threshold V2 and the first transition time Tx1 during which the monitoring voltage Vx decreases from the second threshold V2 to the first threshold V1, or the average value of both of the second transition time Tx2 and the first transition time Tx1. Further, the monitoring signal processing circuit or the arithmetic control circuit inverts the pulse output when the monitoring voltage Vx has decreased to pass through the first threshold V1 and when the monitoring voltage Vx has increased to pass through the second threshold V2.

Therefore, the output pulse is alternately inverted along with the completion of the measurement of the transition time Tx, and hence the occurrence frequency of the repetitive command signal PLS becomes shortened as the leakage resistance becomes smaller. Thus, abnormality can be detected quickly. Further, with the use of both the first pulse and the second pulse of the repetitive command signal PLS, the measurement of the leakage resistance can be repeated all the time.

As is clear from the above description, according to the fifth embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30E is represented by R0, and when a time period during which the monitoring voltage Vx alternately increases gradually and decreases gradually between the first threshold V1 and the second threshold V2 is represented by the transition time Tx, the transition time coefficient α is set to Tx/(R0×C), the leakage resistance coefficient β is set to Rx/R0, and the threshold voltage coefficient γ is set to (V2−V1)/Vcc: calculating, by the arithmetic control circuit 20E, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; selectively using a negative-gradient curve region following the positive-gradient curve region or a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region; determining, when the transition time Tx has become a value equal to or larger than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the short-circuit transition time Tx00 corresponding to a case where the leakage resistance Rx becomes 0.

As is clear from the above description, according to the fifth embodiment of the present invention, there is provided the leakage resistance detection method for an on-board high voltage device, which is used for the leakage resistance detection device for an on-board high voltage device, the leakage resistance detection method including, when the electrostatic capacitance of the coupling capacitor 51 is represented by C, a parallel combined leakage resistance value of the equivalent leakage resistance 65 on the positive potential side and the equivalent leakage resistance 66 on the negative potential side is represented by Rx, and a series resistance value which is a total value of the charge/discharge resistors 33 and 35 provided in the repetitive signal output circuit 30E is represented by R0, and when a time period during which the monitoring voltage Vx alternately increases gradually and decreases gradually between the first threshold V1 and the second threshold V2 is represented by the transition time Tx, the transition time coefficient α is set to Tx/(R0×C), the leakage resistance coefficient β is set to Rx/R0, and the threshold voltage coefficient γ is set to (V2−V1)/Vcc: calculating, by the arithmetic control circuit 20E, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having a negative-gradient curve region or a positive-gradient curve region in which the transition time coefficient α gradually increases or gradually decreases along with an increase in the leakage resistance coefficient β; excluding in advance, by the characteristics curve correction means, application of a negative-gradient curve region following the positive-gradient curve region; determining the threshold voltage coefficient γ so that a value of the transition time coefficient α when the value of the leakage resistance Rx has reached the limit leakage resistance Rx0 is included in the corrected positive-gradient curve region; determining, when the transition time Tx has become a value equal to or smaller than the limit transition time Tx0 corresponding to the limit leakage resistance Rx0, that the leakage resistance Rx is too small, and generating the resistance abnormality determination output ER1; and performing the timeout abnormality determination ERR1 when the transition time Tx exceeds the open-circuit transition time Txm corresponding to a case where the leakage resistance Rx is infinite.

What is claimed is:

1. A leakage resistance detection device for an on-board high voltage device, which is connectable to an on-board high voltage device including an on-board high voltage DC power source and a high voltage electric load to be fed and driven by the on-board high voltage DC power source, the on-board high voltage device having a leakage resistance Rx with respect to a vehicle body, as typified by an equivalent leakage resistance on a positive potential side and an equivalent leakage resistance on a negative potential side, the leakage resistance detection device comprising a constant voltage control power source which is fed and driven by a low voltage DC power source having a negative terminal connected to the vehicle body and which generates a control power supply voltage Vcc, the leakage resistance detection device being configured to measure a value of the leakage resistance Rx via a coupling capacitor having one terminal B connected to a predetermined position of the on-board high voltage device, the leakage resistance detection device further comprising a repetitive signal output circuit, a monitoring signal processing circuit, and an arithmetic control circuit, the arithmetic control circuit comprising a microprocessor and a program memory which cooperate with each other, wherein the repetitive signal output circuit alternately repeats, in response to a switching operation of a charge/discharge switching element that operates in response to a repetitive command signal PLS, a charge period and a discharge period in which a measurement point A is intermittently connected to the control power supply voltage Vcc via a charge/discharge resistor, the measurement point A being another terminal of the coupling capacitor, to thereby one of gradually increase and gradually decrease a monitoring voltage Vx which is a potential between the measurement point A and the vehicle body, wherein the monitoring signal processing circuit is configured to one of:
  generate at least one of inverted logic signals ANS, LOW, and HIG when a value of the monitoring voltage Vx, which one of gradually increases and gradually decreases at a gradient that becomes gentler as a charge/discharge time constant becomes larger, passes through a predetermined threshold voltage, and input the at least one of the inverted logic signals ANS, LOW, and HIG to the arithmetic control circuit; and
  generate an analog signal voltage ANL proportional to the monitoring voltage Vx and input the analog signal voltage ANL to the arithmetic control circuit, wherein the arithmetic control circuit is configured to:
  measure a transition time Tx during which the value of the monitoring voltage Vx changes from one of a threshold voltage equal to or higher than 0 volts and a threshold voltage equal to or lower than the control power supply voltage Vcc to another;
  calculate the leakage resistance Rx which is a parallel combined resistance of the equivalent leakage resistance on the positive potential side and the equivalent leakage resistance on the negative potential side, based on one of a function formula and a data table relating to the transition time Tx and the leakage resistance Rx; and
  generate a resistance abnormality determination output ER1 one of when the leakage resistance Rx becomes equal to or smaller than a predetermined limit leakage resistance Rx0 and when the transition time Tx reaches a limit transition time Tx0 corresponding to the predetermined limit leakage resistance Rx0, and wherein the repetitive command signal PLS comprises one of a pulse signal with a fixed cycle having one of the charge period and the discharge period longer than at least the limit transition time Tx0, and a pulse signal with a variable cycle in which an output pulse is inverted when the transition time Tx is reached.

2. A leakage resistance detection device for an on-board high voltage device according to claim 1, wherein the charge/discharge resistor comprises a reference resistor having a resistance value Rs and a rapid charge/discharge resistor having a resistance value Rq which is sufficiently smaller than the resistance value Rs, and the rapid charge/discharge resistor is connected to a negative terminal and a positive terminal of the constant voltage control power source via a pair of bypass diodes, and wherein the reference resistor is connected in series to the leakage resistance Rx as a charge/discharge resistor for the coupling capacitor when the arithmetic control circuit measures the transition time Tx of one of the gradually-increasing monitoring voltage Vx and the gradually-decreasing monitoring voltage Vx, and the reference resistor is removed when a potential of the monitoring voltage Vx relative to the vehicle body has changed to be one of 0 volts or lower and the control power supply voltage Vcc or higher due to one of an abrupt change of a power supply voltage of the on-board high voltage DC power source and an abrupt change of one of the equivalent leakage resistance on the positive potential side and the equivalent leakage resistance on the negative potential side one of because the a high voltage power supply switch for the high voltage electric load is one of closed and opened and because abnormality has occurred, so as to charge and discharge the coupling capacitor via the rapid charge/discharge resistor and the pair of bypass diodes irrespective of an operating state of the charge/discharge switching element.

3. A leakage resistance detection device for an on-board high voltage device according to claim 1, wherein the repetitive signal output circuit is configured to, in response to the switching operation of the charge/discharge switching element, one of connect the measurement point being the another terminal of the coupling capacitor to an output terminal of the constant voltage control power source via the reference resistor having the reference value Rs, and connect the measurement point to the negative terminal corresponding to a vehicle body potential via the rapid charge/discharge resistor having the resistance value Rq which is sufficiently smaller than the resistance value Rs, to thereby one of gradually increase and rapidly decrease the monitoring voltage Vx which is the potential between the measurement point and the vehicle body, wherein the monitoring signal processing circuit is configured to one of:

generate the inverted logic signal HIG when the value of the monitoring voltage Vx, which gradually increases at a gradient that becomes gentler as a time constant (Rs+Rx)C being a product of a sum of the resistance value Rs (Rs>>Rq) and the leakage resistance Rx and an electrostatic capacitance C of the coupling capacitor becomes larger, has increased to pass through predetermined threshold voltage V0, and input the inverted logic signal HIG to the arithmetic control circuit; and generate the analog signal voltage ANL proportional to the monitoring voltage Vx and input the analog signal voltage ANL to the arithmetic control circuit, and wherein the arithmetic control circuit inverts an output of the repetitive command signal PLS, which is a pulse train signal having a fixed cycle, in a state in which the value of the monitoring voltage Vx has abruptly decreased to approach 0 volts by the charge/discharge switching element, and inverts the output of the repetitive command signal PLS one of after receiving the inverted logic signal HIG as an input and after measuring, as the transition time Tx, a time period from when the inverted logic signal HIG is generated based on the input analog signal voltage ANL to when the inverted logic signal HIG is obtained.

4. A leakage resistance detection device for an on-board high voltage device according to claim 1, wherein the repetitive signal output circuit is configured to, in response to the switching operation of the charge/discharge switching element, one of connect the measurement point being the another terminal of the coupling capacitor to an output terminal of the constant voltage control power source via the rapid charge/discharge resistor having the resistance value Rq, and connect the measurement point to the negative terminal corresponding to a vehicle body potential via the reference resistor having the reference value Rs which is sufficiently larger than the resistance value Rq, to thereby one of rapidly increase and gradually decrease the monitoring voltage Vx which is the potential between the measurement point and the vehicle body, wherein the monitoring signal processing circuit is configured to one of:

generate the inverted logic signal LOW when the value of the monitoring voltage Vx, which gradually decreases at a gradient that becomes gentler as a time constant (Rs+Rx)C being a product of a sum of the resistance value Rs (Rs>>Rq) and the leakage resistance Rx and an electrostatic capacitance C of the coupling capacitor becomes larger, has decreased to pass through a value obtained by subtracting a predetermined threshold voltage V0 from the control power supply voltage Vcc, and input the inverted logic signal LOW to the arithmetic control circuit; and generate the analog signal voltage ANL proportional to the monitoring voltage Vx and input the analog signal voltage ANL to the arithmetic control circuit, and wherein the arithmetic control circuit inverts an output of the repetitive command signal PLS, which is a pulse train signal having a fixed cycle, in a state in which the value of the monitoring voltage Vx has abruptly increased to approach the control power supply voltage Vcc by the charge/discharge switching element, and inverts the output of the repetitive command signal PLS one of after receiving the inverted logic signal LOW as an input and after measuring, as the transition time Tx, a time period from when the inverted logic signal LOW is generated based on the input analog signal voltage ANL to when the inverted logic signal LOW is obtained.

5. A leakage resistance detection device for an on-board high voltage device according to claim 1, wherein the repetitive signal output circuit is configured to, in response to the switching operation of the charge/discharge switching element, one of connect the measurement point being the another terminal of the coupling capacitor to an output terminal of the constant voltage control power source via the rapid charge/discharge resistor having the reference value Rq, and connect the measurement point to the negative terminal having a vehicle body potential via the reference resistor having the resistance value Rs which is sufficiently larger than the resistance value Rq, to thereby one of rapidly increase and gradually decrease the monitoring voltage Vx which is the potential between the measurement point and the vehicle body, wherein the monitoring signal processing circuit is configured to one of:
 generate one of first inverted logic signals ANS and LOW when the value of the monitoring voltage Vx, which gradually decreases at a gradient that becomes gentler as a time constant (Rs+Rx) C being a product of a sum of the resistance value Rs (Rs>>Rq) and the leakage resistance Rx and an electrostatic capacitance C of the coupling capacitor becomes larger, has decreased to pass through a first threshold V1, and input the one of the first inverted logic signals ANS and LOW to the arithmetic control circuit; and
 generate the analog signal voltage ANL proportional to the monitoring voltage Vx and input the analog signal voltage ANL to the arithmetic control circuit, and wherein the monitoring signal processing circuit is further configured to one of:
 generate one of second inverted logic signals ANS and HIG when the value of the monitoring voltage Vx, which rapidly increases at a gradient that becomes steeper as a time constant (Rq+Rx)C becomes smaller, has increased to pass through a second threshold V2 which is close to the control power supply voltage Vcc, and input the one of the second inverted logic signals ANS and HIG to the arithmetic control circuit; and
 generate the analog signal voltage ANL proportional to the monitoring voltage Vx and input the analog signal voltage ANL to the arithmetic control circuit, wherein the arithmetic control circuit one of receives the one of the second inverted logic signals ANS and HIG as an input and generates the one of the second inverted logic signals ANS and HIG based on the input analog signal voltage ANL, and the arithmetic control circuit one of receives the one of the first inverted logic signals ANS and LOW as an input and generates the one of the first inverted logic signals ANS and LOW based on the input analog signal voltage ANL, wherein the arithmetic control circuit measures, as the transition time Tx, a time period from when the one of the second inverted logic signals ANS and HIG is generated to when the one of the first inverted logic signals ANS and LOW is obtained, wherein one of the arithmetic control circuit and the monitoring signal processing circuit inverts the repetitive command signal PLS when the one of the first inverted logic signals ANS and LOW and the one of the second inverted logic signals ANS and HIG are one of input and generated, and wherein the one of the first inverted logic signals and the one of the second inverted logic signals are one of a pair of logic signals of a first logic signal LOW whose output logic changes before and after the first threshold V1 and a second logic signal HIG whose output logic changes before and after the second threshold V2, and a band history logic signal ANS which becomes a first logic state of one of "L" and "H" when the value of the monitoring voltage Vx has increased to the second threshold V2 or higher after decreasing to the first threshold V1 or lower and which becomes a second logic state of one of "H" and "L" when the value of the monitoring voltage Vx has decreased to the first threshold V1 or lower after increasing to the second threshold V2 or higher.

6. A leakage resistance detection device for an on-board high voltage device according to claim 1, wherein the repetitive signal output circuit is configured to, in response to the switching operation of the charge/discharge switching element, one of connect the measurement point being the another terminal of the coupling capacitor to an output terminal of the constant voltage control power source via the reference resistor having the resistance value Rs, and connect the measurement point to the negative terminal having a vehicle body potential via the rapid charge/discharge resistor having the reference value Rq which is sufficiently smaller than the resistance value Rs, to thereby one of gradually increase and rapidly decrease the monitoring voltage Vx which is the potential between the measurement point and the vehicle body, wherein the monitoring signal processing circuit is configured to one of:
 generate one of second inverted logic signals ANS and HIG when the value of the monitoring voltage Vx, which gradually increases at a gradient that becomes gentler as a time constant (Rs+Rx)C being a product of a sum of the resistance value Rs (Rs>>Rq) and the leakage resistance Rx and an electrostatic capacitance C of the coupling capacitor becomes larger, has increased to pass through a second threshold V2, and input the one of the second inverted logic signals ANS and HIG to the arithmetic control circuit; and
 generate the analog signal voltage ANL proportional to the monitoring voltage Vx and input the analog signal voltage ANL to the arithmetic control circuit, and wherein the monitoring signal processing circuit is further configured to one of:
 generate one of first inverted logic signals ANS and LOW when the value of the monitoring voltage Vx, which rapidly decreases at a gradient that becomes steeper as a time constant (Rq+Rx)C becomes smaller, has decreased to pass through a first threshold V1 which is close to 0 volts, and input the one of the first inverted logic signals ANS and LOW to the arithmetic control circuit; and
 generate the analog signal voltage ANL proportional to the monitoring voltage Vx and input the analog signal voltage ANL to the arithmetic control circuit, wherein the arithmetic control circuit one of receives the one of the second inverted logic signals ANS and HIG as an input and generates the one of the second inverted logic signals ANS and HIG based on the input analog signal voltage ANL, and the arithmetic control circuit one of receives the one of the first inverted logic signals ANS and LOW as an input and generates the one of the first inverted logic signals ANS and LOW based on the input analog signal voltage ANL, wherein the arithmetic control circuit measures, as the transition time Tx, a time period from when the one of the first inverted logic signals ANS and LOW is generated to when the one of the second inverted logic signals ANS and HIG is obtained, wherein one of the arithmetic control circuit and the monitoring signal processing circuit inverts the repetitive command signal PLS when the one of the first inverted logic signals ANS and LOW and the one of the second inverted logic signals ANS and HIG are one of input and generated, and wherein the one of the first inverted logic signals and the one of the second inverted logic signals are one of a pair of logic signals of a first logic signal LOW whose output logic changes before and after the first threshold V1 and a second logic signal HIG whose output logic changes before and after the second threshold V2, and a band history logic signal ANS which becomes a first logic state of one of "L" and "H" when the value of the monitoring voltage Vx has increased to the second threshold V2 or higher after decreasing to the first threshold V1 or lower and which becomes a second logic state of one of "H" and "L" when the value of the monitoring voltage Vx has decreased to the first threshold V1 or lower after increasing to the second threshold V2 or higher.

7. A leakage resistance detection device for an on-board high voltage device according to claim 1, wherein the repetitive signal output circuit is configured to, in response to the switching operation of the charge/discharge switching element, one of connect the measurement point being the another terminal of the coupling capacitor to an output terminal of the constant voltage control power source via the reference resistor having the resistance value Rs, and connect the measurement point to the negative terminal having a vehicle body potential via the same reference resistor, to thereby one of gradually increase and gradually decrease the monitoring voltage Vx which is the potential between the measurement point and the vehicle body, wherein the monitoring signal processing circuit is configured to one of:

generate one of second inverted logic signals ANS and HIG when the value of the monitoring voltage Vx, which one of gradually increases and gradually decreases at a gradient that becomes gentler as a time constant (Rs+Rx)C being a product of a sum of the resistance value Rs and the leakage resistance Rx and an electrostatic capacitance C of the coupling capacitor becomes larger, has increased to pass through a second threshold V2 and generate one of first inverted logic signals ANS and LOW when the value of the monitoring voltage Vx has decreased to pass through a first threshold V1, and input the one of the second inverted logic signals ANS and HIG and the one of the first inverted logic signals ANS and LOW to the arithmetic control circuit; and generate the analog signal voltage ANL proportional to the monitoring voltage Vx and input the analog signal voltage ANL to the arithmetic control circuit, wherein the arithmetic control circuit one of receives the one of the second inverted logic signals ANS and HIG as an input and generates the one of the second inverted logic signals ANS and HIG based on the input analog signal voltage ANL, and the arithmetic control circuit one of receives the one of the first inverted logic signals ANS and LOW as an input and generates the one of the first inverted logic signals ANS and LOW based on the input analog signal voltage ANL, wherein the arithmetic control circuit is configured to:

measure, as a second transition time Tx2, a time period from when the one of the first inverted logic signals ANS and LOW is generated to when the one of the second inverted logic signals ANS and HIG is obtained;

measure, as a first transition time Tx1, a time period from when the one of the second inverted logic signals ANS and HIG is generated to when the one of the first inverted logic signals ANS and LOW is obtained; and one of set one of the first transition time Tx1 and the second transition time Tx2 and set an average value of both of the first transition time Tx1 and the second transition time Tx2 as the transition time Tx, wherein one of the arithmetic control circuit and the monitoring signal processing circuit inverts the repetitive command signal PLS when the one of the first inverted logic signals ANS and LOW and the one of the second inverted logic signals ANS and HIG are one of input and generated, and wherein the one of the first inverted logic signals and the one of the second inverted logic signals are one of a pair of logic signals of a first logic signal LOW whose output logic changes before and after the first threshold V1 and a second logic signal HIG whose output logic changes before and after the second threshold V2, and a band history logic signal ANS which becomes a first logic state of one of "L" and "H" when the value of the monitoring voltage Vx has increased to the second threshold V2 or higher after decreasing to the first threshold V1 or lower and which becomes a second logic state of one of "H" and "L" when the value of the monitoring voltage Vx has decreased to the first threshold V1 or lower after increasing to the second threshold V2 or higher.

8. A leakage resistance detection method for an on-board high voltage device, which is used for the leakage resistance detection device for an on-board high voltage device according to claim 1, the leakage resistance detection method comprising, when an electrostatic capacitance of the coupling capacitor is represented by C, a parallel combined leakage resistance value of the equivalent leakage resistance on the positive potential side and the equivalent leakage resistance on the negative potential side is represented by Rx, and a series resistance value which is a total value of charge/discharge resistors provided in the repetitive signal output circuit is represented by R0, and when one of a time period during which the monitoring voltage Vx increases gradually from a state of 0 to a predetermined threshold voltage V0, a time period during which the monitoring voltage Vx decreases gradually from a state of the control power supply voltage Vcc to a predetermined threshold voltage (Vcc−V0), and a time period during which the monitoring voltage Vx alternately increases gradually and decreases gradually between a first threshold V1 and a second threshold V2 is represented by a transition time Tx, a transition time coefficient $\alpha$ is set to Tx/(R0×C), a leakage resistance coefficient $\beta$ is set to Rx/R0, and a threshold voltage coefficient $\gamma$ is set to one of V0/Vcc and (V2−V1)/Vcc:

calculating, by the arithmetic control circuit, the value of the leakage resistance Rx corresponding to the measured transition time Tx by using the threshold voltage coefficient $\gamma$ as a parameter and based on a characteristics curve of the transition time coefficient $\alpha$ corresponding to a value of the leakage resistance coefficient $\beta$, the characteristics curve having one of a negative-gradient curve region and a positive-gradient curve region in which the transition time coefficient $\alpha$ one of gradually increases and gradually decreases along with an increase in the leakage resistance coefficient $\beta$;

selectively using one of a negative-gradient curve region following the positive-gradient curve region and a negative-gradient curve region occupying a whole region, and determining the threshold voltage coefficient γ so that a value of the transition time coefficient α when the value of the leakage resistance Rx has reached the limit leakage resistance Rx0 is included in the negative-gradient curve region;

determining, when the transition time Tx has become a value equal to or larger than the limit transition time Tx0 corresponding to the limit leakage resistance Rx0, that the leakage resistance Rx is too small, and generating the resistance abnormality determination output ER1; and performing timeout abnormality determination ERR1 when the transition time Tx exceeds a short-circuit transition time Tx00 corresponding to a case where the leakage resistance Rx becomes 0.

9. A leakage resistance detection method for an on-board high voltage device according to claim 8, wherein the characteristics curve has a negative-gradient curve region as a whole region, and a low threshold voltage coefficient γ is applied so that the characteristics curve contains no positive-gradient curve region.

10. A leakage resistance detection method for an on-board high voltage device, which is used for the leakage resistance detection device for an on-board high voltage device according to claim 1, the leakage resistance detection method comprising, when an electrostatic capacitance of the coupling capacitor is represented by C, a parallel combined leakage resistance value of the equivalent leakage resistance on the positive potential side and the equivalent leakage resistance on the negative potential side is represented by Rx, and a series resistance value which is a total value of charge/discharge resistors provided in the repetitive signal output circuit is represented by R0, and when one of a time period during which the monitoring voltage Vx increases gradually from a state of 0 to a predetermined threshold voltage V0, a time period during which the monitoring voltage Vx decreases gradually from a state of the control power supply voltage Vcc to a predetermined threshold voltage (Vcc−V0), and a time period during which the monitoring voltage Vx alternately increases gradually and decreases gradually between a first threshold V1 and a second threshold V2 is represented by a transition time Tx, a transition time coefficient α is set to Tx/(R0×C), a leakage resistance coefficient β is set to Rx/R0, and a threshold voltage coefficient γ is set to one of V0/Vcc and (V2−V1)/Vcc:

calculating, by the arithmetic control circuit, the value of the leakage resistance Rx corresponding to the measured transition time Tx by using the threshold voltage coefficient γ as a parameter and based on a characteristics curve of the transition time coefficient α corresponding to a value of the leakage resistance coefficient β, the characteristics curve having one of a negative-gradient curve region and a positive-gradient curve region in which the transition time coefficient α one of gradually increases and gradually decreases along with an increase in the leakage resistance coefficient β;

excluding in advance, by characteristics curve correction means, application of a negative-gradient curve region following the positive-gradient curve region;

determining the threshold voltage coefficient γ so that a value of the transition time coefficient α when the value of the leakage resistance Rx has reached the limit leakage resistance Rx0 is included in the corrected positive-gradient curve region;

determining, when the transition time Tx has become a value equal to or smaller than the limit transition time Tx0 corresponding to the limit leakage resistance Rx0, that the leakage resistance Rx is too small, and generating the resistance abnormality determination output ER1; and performing timeout abnormality determination ERR1 when the transition time Tx exceeds an open-circuit transition time Txm corresponding to a case where the leakage resistance Rx is infinite.

11. A leakage resistance detection method for an on-board high voltage device according to claim 10, further comprising:

connecting in advance, by the characteristics curve correction means, a bypass leakage resistor between a connection point between the coupling capacitor and the on-board high voltage device, and the vehicle body, the bypass leakage resistor having an additional resistance R3 which is sufficiently larger than the limit leakage resistance Rx0; and suppressing, by the bypass leakage resistor, the value of the leakage resistance coefficient β when the leakage resistance Rx is infinite to R3/R0, to thereby prevent the transition time coefficient α from being excessive.

12. A leakage resistance detection method for an on-board high voltage device according to claim 8, wherein the leakage resistance detection device further comprises a bypass leakage resistor, which is connected between a connection point between the coupling capacitor and the on-board high voltage device, and the vehicle body, and wherein the leakage resistance detection method further comprises measuring, by the arithmetic control circuit, the leakage resistance Rx in a state in which the coupling capacitor and the on-board high voltage device are not connected to each other, and calibrating and storing the value of the electrostatic capacitance C of the coupling capacitor so that an obtained result becomes an additional resistance R3 of the bypass leakage resistor.

13. A leakage resistance detection method for an on-board high voltage device according to claim 10, wherein the leakage resistance detection device further comprises a bypass leakage resistor, which is connected between a connection point between the coupling capacitor and the on-board high voltage device, and the vehicle body, and wherein the leakage resistance detection method further comprises measuring, by the arithmetic control circuit, the leakage resistance Rx in a state in which the coupling capacitor and the on-board high voltage device are not connected to each other, and calibrating and storing the value of the electrostatic capacitance C of the coupling capacitor so that an obtained result becomes an additional resistance R3 of the bypass leakage resistor.

14. A leakage resistance detection method for an on-board high voltage device according to claim 8, further comprising, by the arithmetic control circuit:

measuring, in response to one of at least one of inverted logic signals ANS, LOW, and HIG, and an analog signal voltage ANL that operates in response to the monitoring voltage Vx input from the monitoring signal processing circuit, a time period during which the monitoring voltage Vx deviates from a proper voltage range determined by one threshold voltage and another threshold voltage for measuring the transition time Tx; and interrupting the measurement of the leakage resistance Rx when the measured time period is within a predetermined permissible determination time period, and determining transient characteristics abnormality ERR2 when the measured time period exceeds a predetermined abnormality determination time period.

15. A leakage resistance detection method for an on-board high voltage device according to claim 10, further comprising, by the arithmetic control circuit:

measuring, in response to one of at least one of inverted logic signals ANS, LOW, and HIG, and an analog signal voltage ANL that operates in response to the monitoring voltage Vx input from the monitoring signal processing circuit, a time period during which the monitoring voltage Vx deviates from a proper voltage range determined by one threshold voltage and another threshold voltage for measuring the transition time Tx; and interrupting the measurement of the leakage resistance Rx when the measured time period is within a predetermined permissible determination time period, and determining transient characteristics abnormality ERR2 when the measured time period exceeds a predetermined abnormality determination time period.

16. A leakage resistance detection method for an on-board high voltage device according to claim 14, further comprising:

inputting a vehicle state signal to the arithmetic control circuit, the vehicle state signal being a signal for identifying occurrence of a state responsible for fluctuations in vehicle body potential at a connection point between the coupling capacitor and the on-board high voltage device; and detecting, by the arithmetic control circuit, a change in state of the vehicle state signal to predict an abrupt change in leakage resistance, and avoiding the determination of the transient characteristics abnormality immediately after the change in state of the vehicle state signal.

17. A leakage resistance detection method for an on-board high voltage device according to claim 8, further comprising:

causing a non-volatile data memory, which is one of a partial region of the program memory and a memory provided together with the program memory, to:

write and save in advance a data table relating to a characteristics curve of the transition time coefficient $\alpha$ of $Tx/(R0C)$ relative to the leakage resistance coefficient $\beta$ of $Rx/R0$ using the threshold voltage coefficient $\gamma$ of one of $V0/Vcc$ and $(V2-V1)/Vcc$ as a parameter, and a value of the threshold voltage coefficient $\gamma$, values of a reference resistance Rs and a rapid charge/discharge resistance Rq that determine the value of the series resistance R0, a value of the electrostatic capacitance C, a value of the limit leakage resistance Rx0, and a value of a preliminary leakage resistance Rxn to be preliminary informed; and write and save the value of the leakage resistance Rx which is measured during operation and abnormality occurrence history information one of periodically and immediately before stop of the operation; and reading out, by the arithmetic control circuit, the value of the leakage resistance coefficient $\beta$ from the data table in correspondence with the transition time coefficient $\alpha$ calculated from the actually measured transition time Tx, to thereby calculate a current leakage resistance Rx, and comparing the current leakage resistance Rx with one of the value of the limit leakage resistance Rx0 and the value of the preliminary leakage resistance Rxn, to thereby one of generate a pre-alarm output ER2 in addition to the resistance abnormality determination output ER1 and perform determination of state change abnormality ERR3 when the leakage resistance has abruptly decreased in a time series.

18. A leakage resistance detection method for an on-board high voltage device according to claim 10, further comprising:

causing a non-volatile data memory, which is one of a partial region of the program memory and a memory provided together with the program memory, to:

write and save in advance a data table relating to a characteristics curve of the transition time coefficient $\alpha$ of $Tx/(R0C)$ relative to the leakage resistance coefficient $\beta$ of $Rx/R0$ using the threshold voltage coefficient $\gamma$ of one of $V0/Vcc$ and $(V2-V1)/Vcc$ as a parameter, and a value of the threshold voltage coefficient $\gamma$, values of a reference resistance Rs and a rapid charge/discharge resistance Rq that determine the value of the series resistance R0, a value of the electrostatic capacitance C, a value of the limit leakage resistance Rx0, and a value of a preliminary leakage resistance Rxn to be preliminary informed; and write and save the value of the leakage resistance Rx which is measured during operation and abnormality occurrence history information one of periodically and immediately before stop of the operation; and reading out, by the arithmetic control circuit, the value of the leakage resistance coefficient $\beta$ from the data table in correspondence with the transition time coefficient $\alpha$ calculated from the actually measured transition time Tx, to thereby calculate a current leakage resistance Rx, and comparing the current leakage resistance Rx with one of the value of the limit leakage resistance Rx0 and the value of the preliminary leakage resistance Rxn, to thereby one of generate a pre-alarm output ER2 in addition to the resistance abnormality determination output ER1 and perform determination of state change abnormality ERR3 when the leakage resistance has abruptly decreased in a time series.

19. A leakage resistance detection method for an on-board high voltage device according to claim 8, wherein the leakage resistance detection device further comprises a test leakage resistor and a test switching element, which are connected between a connection point between the coupling capacitor and the on-board high voltage device, and the vehicle body, the test leakage resistor having one of a resistance value equal to or smaller than the limit leakage resistance Rx0 and a resistance value equal to or smaller than a preliminary leakage resistance Rxn which is close to the limit leakage resistance Rx0 and larger than the limit leakage resistance Rx0, the test switching element being connected in series to the test leakage resistor, wherein the leakage resistance detection method further comprises, by the arithmetic control circuit:

closing the test switching element temporarily at start of operation, and determining whether the resistance abnormality determination output ER1 operates for a moment or a pre-alarm output ER2 that is generated when the leakage resistance Rx has become equal to or smaller than the preliminary leakage resistance Rxn operates for a moment, to thereby inspect whether an operation of detecting the leakage resistance Rx is performed normally; and when a result of the inspection shows that the detection operation is abnormal, generating one of the resistance abnormality determination output ER1 and the pre-alarm output ER2 one of continuously and intermittently, and when the result of the inspection shows that the detection operation is normal, suspending output generation for such a short period of time that an abnormality alarm device to be driven by one of the resistance abnormality determination output ER1 and the pre-alarm output ER2 does not operate.

20. A leakage resistance detection method for an on-board high voltage device according to claim 10, wherein the leakage resistance detection device further comprises a test leakage resistor and a test switching element, which are connected between a connection point between the coupling capacitor and the on-board high voltage device, and the vehicle body, the test leakage resistor having one of a resistance value equal to or smaller than the limit leakage resistance Rx0 and a resistance value equal to or smaller than a preliminary leakage resistance Rxn which is close to the limit leakage resistance Rx0 and larger than the limit leakage resistance Rx0, the test switching element being connected in series to the test leakage resistor, wherein the leakage resistance detection method further comprises, by the arithmetic control circuit:

closing the test switching element temporarily at start of operation, and determining whether the resistance abnormality determination output ER1 operates for a moment or a pre-alarm output ER2 that is generated when the leakage resistance Rx has become equal to or smaller than the preliminary leakage resistance Rxn operates for a moment, to thereby inspect whether an operation of detecting the leakage resistance Rx is performed normally; and when a result of the inspection shows that the detection operation is abnormal, generating one of the resistance abnormality determination output ER1 and the pre-alarm output ER2 one of continuously and intermittently, and when the result of the inspection shows that the detection operation is normal, suspending output generation for such a short period of time that an abnormality alarm device to be driven by one of the resistance abnormality determination output ER1 and the pre-alarm output ER2 does not operate.

21. A leakage resistance detection method for an on-board high voltage device according to claim 19, wherein the leakage resistance detection device further comprises a bypass leakage resistor, which is connected between the connection point between the coupling capacitor and the on-board high voltage device, and the vehicle body, and wherein the leakage resistance detection method further comprises, by the arithmetic control circuit:

closing the test switching element at the start of the operation and measuring a first combined leakage resistance value in a state in which the test leakage resistor, the bypass leakage resistor, and an actual leakage resistance Rx are connected in parallel, and measuring a second combined leakage resistance value in a state in which the test switching element is opened and the bypass leakage resistor and the actual leakage resistance Rx are connected in parallel; and back-calculating the electrostatic capacitance C of the coupling capacitor from the first combined leakage resistance value and the second combined leakage resistance value and storing the back-calculated electrostatic capacitance C as a calibrated value, the calibrated value being calculated so that the actual leakage resistances Rx in open-circuit and closed-circuit states of the test switching element have the same value owing to the calibrated and stored electrostatic capacitance C.

* * * * *